United States Patent
Daimon et al.

(10) Patent No.: US 11,595,023 B2
(45) Date of Patent: Feb. 28, 2023

(54) ELASTIC WAVE DEVICE

(71) Applicant: Murata Manufacturing Co., Ltd., Nagaokakyo (JP)

(72) Inventors: Katsuya Daimon, Nagaokakyo (JP); Daisuke Tamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 973 days.

(21) Appl. No.: 16/400,051

(22) Filed: May 1, 2019

(65) Prior Publication Data
US 2019/0260353 A1    Aug. 22, 2019

Related U.S. Application Data

(63) Continuation of application No. PCT/JP2017/036681, filed on Oct. 10, 2017.

(30) Foreign Application Priority Data

Nov. 17, 2016   (JP) .............................. JP2016-223710

(51) Int. Cl.
*H03H 9/145* (2006.01)
*H03H 9/02* (2006.01)
*H03H 9/25* (2006.01)

(52) U.S. Cl.
CPC .... *H03H 9/14541* (2013.01); *H03H 9/02559* (2013.01); *H03H 9/02937* (2013.01); *H03H 9/145* (2013.01); *H03H 9/25* (2013.01)

(58) Field of Classification Search
CPC ........... H03H 9/14541; H03H 9/02559; H03H 9/02937; H03H 9/145; H03H 9/25
See application file for complete search history.

(56) References Cited

U.S. PATENT DOCUMENTS

2009/0115287 A1    5/2009 Kando
2010/0259128 A1    10/2010 Kadota et al.
(Continued)

FOREIGN PATENT DOCUMENTS

JP    2006-295976 A    10/2006
JP    2008-236588 A    10/2008
(Continued)

OTHER PUBLICATIONS

Official Communication issued in International Patent Application No. PCT/JP2017/036681 dated Dec. 12, 2017.

*Primary Examiner* — Samuel S Outten
(74) *Attorney, Agent, or Firm* — Keating & Bennett, LLP

(57) ABSTRACT

An elastic wave device includes a piezoelectric substrate made of $LiNbO_3$, interdigital transducer electrodes on the piezoelectric substrate, and a first dielectric film provided on the piezoelectric substrate and the first dielectric film to cover the IDT electrodes and made of a silicon oxide. The IDT electrodes include a first metal film made of one metal selected from Pt, Cu, Mo, Au, W, and Ta. The Euler angles $(\phi, \theta, \psi)$ of the piezoelectric substrate are $(0\pm5°, -90°\leq\theta\leq-70°, 0°\pm5°)$. The metal for the first metal film and the thickness $hm/\lambda$ (%) match any of the combinations as follows:

| Metal for the first metal film | Thickness $hm/\lambda$ (%) of the first metal film |
|---|---|
| Pt | $6.5 \leq hm/\lambda \leq 25$ |
| Cu | $13 \leq hm/\lambda \leq 25$ |
| Mo | $15.5 \leq hm/\lambda \leq 25$ |
| Au | $6.5 \leq hm/\lambda \leq 25$ |
| W | $7.5 \leq hm/\lambda \leq 25$ |
| Ta | $7 \leq hm/\lambda \leq 25$. |

10 Claims, 19 Drawing Sheets

(56) References Cited

U.S. PATENT DOCUMENTS

| | | | |
|---|---|---|---|
| 2011/0199168 A1 | 8/2011 | Kadota | |
| 2011/0204998 A1 | 8/2011 | Seo et al. | |
| 2016/0226464 A1 | 8/2016 | Fujiwara et al. | |
| 2016/0268997 A1* | 9/2016 | Komatsu | H03H 9/25 |

FOREIGN PATENT DOCUMENTS

| | | |
|---|---|---|
| JP | 4178328 B2 | 11/2008 |
| JP | 2010-109417 A | 5/2010 |
| JP | 2013-066250 A | 4/2013 |
| JP | 2014-192676 A | 10/2014 |
| KR | 10-2016-0065113 A | 6/2016 |
| WO | 2006/114930 A1 | 11/2006 |
| WO | 2009/090713 A1 | 7/2009 |
| WO | 2010/052914 A1 | 5/2010 |
| WO | 2015/052888 A1 | 4/2015 |

* cited by examiner

ELASTIC WAVE DEVICE

CROSS REFERENCE TO RELATED APPLICATIONS

This application claims the benefit of priority to Japanese Patent Application No. 2016-223710 filed on Nov. 17, 2016 and is a Continuation Application of PCT Application No. PCT/JP2017/036681 filed on Oct. 10, 2017. The entire contents of each of these applications are hereby incorporated herein by reference.

BACKGROUND OF THE INVENTION

1. Field of the Invention

The present invention relates to an elastic wave device.

2. Description of the Related Art

Elastic wave devices are in widespread use, for example in filters in cellular phones. Japanese Unexamined Patent Application Publication No. 2006-295976, below, discloses an example of an elastic wave device. This elastic wave device includes a piezoelectric substrate made of $LiNbO_3$. On the piezoelectric substrate, interdigital transducer (IDT) electrodes are provided that are primarily a metal whose density is higher than that of Al. On the piezoelectric substrate, a dielectric layer covers the IDT electrodes. In Japanese Unexamined Patent Application Publication No. 2006-295976, the thickness of the metal film forming the IDT electrodes and the Euler angles of the piezoelectric substrate are set within predetermined ranges so that the electromechanical coupling coefficient will be large for the elastic waves to be used and small for unwanted waves.

In recent years, there is a need for even smaller elastic wave devices. For the elastic wave device described in Japanese Unexamined Patent Application Publication No. 2006-295976, however, reducing its size requires increasing the electrode thickness, and the increased thickness leads to a larger fractional bandwidth of unwanted waves, which affects bandpass characteristics. As this shows, it is difficult to reduce the size of an elastic wave device while limiting unwanted waves and maintaining bandpass characteristics.

SUMMARY OF THE INVENTION

Preferred embodiments of the present invention provide elastic wave devices that are each able to be reduced in size while reducing unwanted waves.

An elastic wave device according to a preferred embodiment of the present invention includes a piezoelectric substrate made of $LiNbO_3$; interdigital transducer (IDT) electrodes on the piezoelectric substrate; and a first dielectric film on the piezoelectric substrate, the first dielectric film covering the IDT electrodes and made of a silicon oxide. The IDT electrodes include a first metal film made of one metal selected from Pt, Cu, Mo, Au, W, and Ta. The Euler angles ($\phi$, $\theta$, $\psi$) of the piezoelectric substrate are Euler angles (about 0°±5°, about −90°≤θ≤−70°, about) 0°±5°. When the wavelength, determined by the finger pitch of the IDT electrodes, is denoted by $\lambda$, and the thickness of the first metal film normalized by the wavelength $\lambda$ is denoted by hm/λ (%), the metal for the first metal film and the thickness hm/λ (%) match any of the combinations listed in Table 1 below:

TABLE 1

| Metal for the first metal film | Thickness hm/λ (%) of the first metal film |
|---|---|
| Pt | 6.5 ≤ hm/λ ≤ 25 |
| Cu | 13 ≤ hm/λ ≤ 25 |
| Mo | 15.5 ≤ hm/λ ≤ 25 |
| Au | 6.5 ≤ hm/λ ≤ 25 |
| W | 7.5 ≤ hm/λ ≤ 25 |
| Ta | 7 ≤ hm/λ ≤ 25 |

An elastic wave device according to a preferred embodiment of the present invention includes a piezoelectric substrate made of $LiNbO_3$; IDT electrodes on the piezoelectric substrate; and a first dielectric film on the piezoelectric substrate, the first dielectric film covering the IDT electrodes and made of a silicon oxide. The IDT electrodes include a first metal film made of one metal selected from Pt, Cu, and Mo. The Euler angles ($\phi$, $\theta$, $\psi$) of the piezoelectric substrate are Euler angles (about 0°±5°, about −90°≤θ≤−27.5°, about 0°±5°). When the wavelength, determined by the finger pitch of the IDT electrodes, is denoted by $\lambda$, the thickness of the first metal film normalized by the wavelength $\lambda$ is denoted by hm/λ (%), and the thickness of the first dielectric film normalized by the wavelength $\lambda$ is denoted by hs/λ (%), the metal for the first metal film, the thickness hm/λ (%), the thickness hs/λ (%), and θ of the Euler angles ($\phi$, $\theta$, $\psi$) of the piezoelectric substrate match any of the combinations listed in Tables 2 to 9 below:

TABLE 2

| Metal for the first metal film | Thickness hs/λ (%) of the dielectric film | θ (°) of the Euler angles | Thickness hm/λ (%) of the first metal film |
|---|---|---|---|
| Pt | 22.5 ≤ hs/λ < 27.5 | −85 ≤ θ ≤ −82.5 | 13 ≤ hm/λ ≤ 18 |
| | 22.5 ≤ hs/λ < 27.5 | −82.5 ≤ θ ≤ −77.5 | 8.8 ≤ hm/λ ≤ 15.7 |
| | 22.5 ≤ hs/λ < 27.5 | −77.5 ≤ θ ≤ −72.5 | 8 ≤ hm/λ ≤ 12 |
| | 22.5 ≤ hs/λ < 27.5 | −72.5 ≤ θ ≤ −67.5 | 7.8 ≤ hm/λ ≤ 11.5 |
| | 22.5 ≤ hs/λ < 27.5 | −67.5 ≤ θ ≤ −62.5 | 8 ≤ hm/λ ≤ 11.25 |
| | 22.5 ≤ hs/λ < 27.5 | −62.5 ≤ θ ≤ −57.5 | 8.2 ≤ hm/λ ≤ 11.4 |
| | 22.5 ≤ hs/λ < 27.5 | −57.5 ≤ θ ≤ −55 | 8.2 ≤ hm/λ ≤ 11.4 |
| | 27.5 ≤ hs/λ < 32.5 | −90 ≤ θ ≤ −87.5 | 16.8 ≤ hm/λ ≤ 17.6 |
| | 27.5 ≤ hs/λ < 32.5 | −87.5 ≤ θ ≤ −82.5 | 12.5 ≤ hm/λ ≤ 19 |
| | 27.5 ≤ hs/λ < 32.5 | −82.5 ≤ θ ≤ −77.5 | 8.8 ≤ hm/λ ≤ 17.2 |
| | 27.5 ≤ hs/λ < 32.5 | −77.5 ≤ θ ≤ −72.5 | 7.7 ≤ hm/λ ≤ 11.5 |
| | 27.5 ≤ hs/λ < 32.5 | −72.5 ≤ θ ≤ −67.5 | 7.4 ≤ hm/λ ≤ 10.8 |
| | 27.5 ≤ hs/λ < 32.5 | −67.5 ≤ θ ≤ −62.5 | 7.45 ≤ hm/λ ≤ 10.5 |
| | 27.5 ≤ hs/λ < 32.5 | −62.5 ≤ θ ≤ −57.5 | 7.7 ≤ hm/λ ≤ 10.5 |
| | 27.5 ≤ hs/λ < 32.5 | −57.5 ≤ θ ≤ −55 | 8.5 ≤ hm/λ ≤ 10.5 |
| | 32.5 ≤ hs/λ < 37.5 | −90 ≤ θ ≤ −87.5 | 15.8 ≤ hm/λ ≤ 20.4 |

TABLE 2-continued

| Metal for the first metal film | Thickness hs/λ (%) of the dielectric film | θ (°) of the Euler angles | Thickness hm/λ (%) of the first metal film |
|---|---|---|---|
| | 32.5 ≤ hs/λ < 37.5 | −87.5 ≤ θ ≤ −82.5 | 11.6 ≤ hm/λ ≤ 20.6 |
| | 32.5 ≤ hs/λ < 37.5 | −82.5 ≤ θ ≤ −77.5 | 8.8 ≤ hm/λ ≤ 18.25 |
| | 32.5 ≤ hs/λ < 37.5 | −77.5 ≤ θ ≤ −72.5 | 7.25 ≤ hm/λ ≤ 10.4 |
| | 32.5 ≤ hs/λ < 37.5 | −72.5 ≤ θ ≤ −67.5 | 6.9 ≤ hm/λ ≤ 10 |
| | 32.5 ≤ hs/λ < 37.5 | −67.5 ≤ θ ≤ −62.5 | 6.9 ≤ hm/λ ≤ 9.5 |
| | 32.5 ≤ hs/λ < 37.5 | −62.5 ≤ θ ≤ −57.5 | 7 ≤ hm/λ ≤ 9.4 |
| | 32.5 ≤ hs/λ < 37.5 | −57.5 ≤ θ ≤ −52.5 | 7.5 ≤ hm/λ ≤ 9.4 |
| | 32.5 ≤ hs/λ < 37.5 | −52.5 ≤ θ ≤ −50 | 8.5 ≤ hm/λ ≤ 9 |
| | 37.5 ≤ hs/λ < 42.5 | −90 ≤ θ ≤ −87.5 | 14.9 ≤ hm/λ ≤ 20.9 |
| | 37.5 ≤ hs/λ < 42.5 | −87.5 ≤ θ ≤ −82.5 | 10.8 ≤ hm/λ ≤ 20.5 |
| | 37.5 ≤ hs/λ < 42.5 | −82.5 ≤ θ ≤ −77.5 | 10 ≤ hm/λ ≤ 18.8 |
| | 37.5 ≤ hs/λ < 42.5 | −77.5 ≤ θ ≤ −72.5 | 6.9 ≤ hm/λ ≤ 9.6 |
| | 37.5 ≤ hs/λ < 42.5 | −72.5 ≤ θ ≤ −67.5 | 6.5 ≤ hm/λ ≤ 9.2 |
| | 37.5 ≤ hs/λ < 42.5 | −67.5 ≤ θ ≤ −62.5 | 6.4 ≤ hm/λ ≤ 8.75 |
| | 37.5 ≤ hs/λ < 42.5 | −62.5 ≤ θ ≤ −57.5 | 6.5 ≤ hm/λ ≤ 8.5 |
| | 37.5 ≤ hs/λ < 42.5 | −57.5 ≤ θ ≤ −52.5 | 7 ≤ hm/λ ≤ 8.4 |
| | 37.5 ≤ hs/λ < 42.5 | −52.5 ≤ θ ≤ −50 | 7.5 ≤ hm/λ ≤ 8 |
| | 42.5 ≤ hs/λ < 47.5 | −90 ≤ θ ≤ −87.5 | 14.25 ≤ hm/λ ≤ 21.1 |
| | 42.5 ≤ hs/λ < 47.5 | −87.5 ≤ θ ≤ −82.5 | 10.3 ≤ hm/λ ≤ 20.8 |
| | 42.5 ≤ hs/λ < 47.5 | −82.5 ≤ θ ≤ −77.5 | 9 ≤ hm/λ ≤ 19.5 |
| | 42.5 ≤ hs/λ < 47.5 | −77.5 ≤ θ ≤ −72.5 | 6.6 ≤ hm/λ ≤ 8.75 |
| | 42.5 ≤ hs/λ < 47.5 | −72.5 ≤ θ ≤ −67.5 | 6.1 ≤ hm/λ ≤ 8.5 |
| | 42.5 ≤ hs/λ < 47.5 | −67.5 ≤ θ ≤ −62.5 | 6 ≤ hm/λ ≤ 8.1 |
| | 42.5 ≤ hs/λ < 47.5 | −62.5 ≤ θ ≤ −57.5 | 6 ≤ hm/λ ≤ 7.9 |
| | 42.5 ≤ hs/λ < 47.5 | −57.5 ≤ θ ≤ −52.5 | 6.5 ≤ hm/λ ≤ 7.7 |
| | 42.5 ≤ hs/λ < 47.5 | −52.5 ≤ θ ≤ −47.5 | 7 ≤ hm/λ ≤ 7.5 |
| | 42.5 ≤ hs/λ < 47.5 | −47.5 ≤ θ ≤ −42.5 | 6.7 ≤ hm/λ ≤ 7 |
| | 42.5 ≤ hs/λ < 47.5 | −42.5 ≤ θ ≤ −40 | 6.2 ≤ hm/λ ≤ 7 |
| | 47.5 ≤ hs/λ < 52.5 | −90 ≤ θ ≤ −87.5 | 13.8 ≤ hm/λ ≤ 21.2 |
| | 47.5 ≤ hs/λ < 52.5 | −87.5 ≤ θ ≤ −82.5 | 9.9 ≤ hm/λ ≤ 22.1 |
| | 47.5 ≤ hs/λ < 52.5 | −82.5 ≤ θ ≤ −77.5 | 8.5 ≤ hm/λ ≤ 19.5 |
| | 47.5 ≤ hs/λ < 52.5 | −77.5 ≤ θ ≤ −72.5 | 6.35 ≤ hm/λ ≤ 9.6 |
| | 47.5 ≤ hs/λ < 52.5 | −72.5 ≤ θ ≤ −67.5 | 6 ≤ hm/λ ≤ 8 |
| | 47.5 ≤ hs/λ < 52.5 | −67.5 ≤ θ ≤ −62.5 | 6 ≤ hm/λ ≤ 7.7 |
| | 47.5 ≤ hs/λ < 52.5 | −62.5 ≤ θ ≤ −57.5 | 6 ≤ hm/λ ≤ 7.4 |
| | 47.5 ≤ hs/λ < 52.5 | −57.5 ≤ θ ≤ −52.5 | 6 ≤ hm/λ ≤ 7.2 |
| | 47.5 ≤ hs/λ < 52.5 | −52.5 ≤ θ ≤ −47.5 | 6.5 ≤ hm/λ ≤ 7 |
| | 47.5 ≤ hs/λ < 52.5 | −47.5 ≤ θ ≤ −42.5 | 6.2 ≤ hm/λ ≤ 6.5 |
| | 47.5 ≤ hs/λ < 52.5 | −42.5 ≤ θ ≤ −40 | 6 ≤ hm/λ ≤ 6.5 |

TABLE 3

| Metal for the first metal film | Thickness hs/λ (%) of the dielectric film | θ (°) of the Euler angles | Thickness hm/λ (%) of the first metal film |
|---|---|---|---|
| Pt | 52.5 ≤ hs/λ < 57.5 | −90 ≤ θ ≤ −87.5 | 13.6 ≤ hm/λ ≤ 20 |
| | 52.5 ≤ hs/λ < 57.5 | −87.5 ≤ θ ≤ −82.5 | 9.6 ≤ hm/λ ≤ 20.1 |
| | 52.5 ≤ hs/λ < 57.5 | −82.5 ≤ θ ≤ −77.5 | 8.25 ≤ hm/λ ≤ 20.5 |
| | 52.5 ≤ hs/λ < 57.5 | −77.5 ≤ θ ≤ −72.5 | 6.2 ≤ hm/λ ≤ 9.7 |
| | 52.5 ≤ hs/λ < 57.5 | −72.5 ≤ θ ≤ −67.5 | 6 ≤ hm/λ ≤ 7.5 |
| | 52.5 ≤ hs/λ < 57.5 | −67.5 ≤ θ ≤ −62.5 | 6 ≤ hm/λ ≤ 7.3 |
| | 52.5 ≤ hs/λ < 57.5 | −62.5 ≤ θ ≤ −57.5 | 6 ≤ hm/λ ≤ 7 |
| | 52.5 ≤ hs/λ < 57.5 | −57.5 ≤ θ ≤ −52.5 | 6 ≤ hm/λ ≤ 6.7 |
| | 52.5 ≤ hs/λ < 57.5 | −52.5 ≤ θ ≤ −50 | 6 ≤ hm/λ ≤ 6.5 |
| | 57.5 ≤ hs/λ < 62.5 | −90 ≤ θ ≤ −87.5 | 13.2 ≤ hm/λ ≤ 19.7 |
| | 57.5 ≤ hs/λ < 62.5 | −87.5 ≤ θ ≤ −82.5 | 9.4 ≤ hm/λ ≤ 20 |
| | 57.5 ≤ hs/λ < 62.5 | −82.5 ≤ θ ≤ −77.5 | 8 ≤ hm/λ ≤ 20.5 |
| | 57.5 ≤ hs/λ < 62.5 | −77.5 ≤ θ ≤ −72.5 | 6 ≤ hm/λ ≤ 9.7 |
| | 57.5 ≤ hs/λ < 62.5 | −72.5 ≤ θ ≤ −67.5 | 6 ≤ hm/λ ≤ 7 |
| | 57.5 ≤ hs/λ < 62.5 | −67.5 ≤ θ ≤ −62.5 | 6 ≤ hm/λ ≤ 7 |
| | 57.5 ≤ hs/λ < 62.5 | −62.5 ≤ θ ≤ −57.5 | 6 ≤ hm/λ ≤ 6.6 |
| | 57.5 ≤ hs/λ < 62.5 | −57.5 ≤ θ ≤ −52.5 | 6 ≤ hm/λ ≤ 6.5 |
| | 57.5 ≤ hs/λ < 62.5 | −52.5 ≤ θ ≤ −50 | 6 ≤ hm/λ ≤ 6.2 |
| | 62.5 ≤ hs/λ < 67.5 | −90 ≤ θ ≤ −87.5 | 13.3 ≤ hm/λ ≤ 19.9 |
| | 62.5 ≤ hs/λ < 67.5 | −87.5 ≤ θ ≤ −82.5 | 9.2 ≤ hm/λ ≤ 20 |
| | 62.5 ≤ hs/λ < 67.5 | −82.5 ≤ θ ≤ −77.5 | 7.7 ≤ hm/λ ≤ 20.6 |
| | 62.5 ≤ hs/λ < 67.5 | −77.5 ≤ θ ≤ −72.5 | 6 ≤ hm/λ ≤ 9.8 |
| | 62.5 ≤ hs/λ < 67.5 | −72.5 ≤ θ ≤ −67.5 | 6 ≤ hm/λ ≤ 7 |
| | 62.5 ≤ hs/λ < 67.5 | −67.5 ≤ θ ≤ −62.5 | 6 ≤ hm/λ ≤ 6.7 |
| | 62.5 ≤ hs/λ < 67.5 | −62.5 ≤ θ ≤ −57.5 | 6 ≤ hm/λ ≤ 6.4 |
| | 62.5 ≤ hs/λ < 67.5 | −57.5 ≤ θ ≤ −55 | 6 ≤ hm/λ ≤ 6.1 |

TABLE 4

| Metal for the first metal film | Thickness $h_s/\lambda$ (%) of the dielectric film | $\theta$ (°) of the Euler angles | Thickness $h_m/\lambda$ (%) of the first metal film |
|---|---|---|---|
| Cu | $32.5 \leq h_s/\lambda < 37.5$ | $-90 \leq \theta \leq -87.5$ | $30.7 \leq h_m/\lambda \leq 31.8$ |
| | $32.5 \leq h_s/\lambda < 37.5$ | $-87.5 \leq \theta \leq -82.5$ | $30.6 \leq h_m/\lambda \leq 32$ |
| | $32.5 \leq h_s/\lambda < 37.5$ | $-82.5 \leq \theta \leq -77.5$ | $26.8 \leq h_m/\lambda \leq 32$ |
| | $32.5 \leq h_s/\lambda < 37.5$ | $-77.5 \leq \theta \leq -72.5$ | $26.4 \leq h_m/\lambda \leq 32$ |
| | $32.5 \leq h_s/\lambda < 37.5$ | $-72.5 \leq \theta \leq -67.5$ | $27.4 \leq h_m/\lambda \leq 32$ |
| | $32.5 \leq h_s/\lambda < 37.5$ | $-67.5 \leq \theta \leq -62.5$ | $28.8 \leq h_m/\lambda \leq 32$ |
| | $37.5 \leq h_s/\lambda < 42.5$ | $-90 \leq \theta \leq -87.5$ | $33.3 \leq h_m/\lambda \leq 36.7$ |
| | $37.5 \leq h_s/\lambda < 42.5$ | $-87.5 \leq \theta \leq -82.5$ | $30.3 \leq h_m/\lambda \leq 37$ |
| | $37.5 \leq h_s/\lambda < 42.5$ | $-82.5 \leq \theta \leq -77.5$ | $29.2 \leq h_m/\lambda \leq 37$ |
| | $37.5 \leq h_s/\lambda < 42.5$ | $-77.5 \leq \theta \leq -72.5$ | $34.8 \leq h_m/\lambda \leq 37$ |
| | $37.5 \leq h_s/\lambda < 42.5$ | $-72.5 \leq \theta \leq -67.5$ | $36.4 \leq h_m/\lambda \leq 37$ |
| | $42.5 \leq h_s/\lambda < 47.5$ | $-90 \leq \theta \leq -87.5$ | $33.2 \leq h_m/\lambda \leq 42$ |
| | $42.5 \leq h_s/\lambda < 47.5$ | $-87.5 \leq \theta \leq -82.5$ | $31.5 \leq h_m/\lambda \leq 42$ |
| | $42.5 \leq h_s/\lambda < 47.5$ | $-82.5 \leq \theta \leq -77.5$ | $25.6 \leq h_m/\lambda \leq 33.9$ |
| | $42.5 \leq h_s/\lambda < 47.5$ | $-77.5 \leq \theta \leq -72.5$ | $21.9 \leq h_m/\lambda \leq 32.2$ |
| | $42.5 \leq h_s/\lambda < 47.5$ | $-72.5 \leq \theta \leq -67.5$ | $21.1 \leq h_m/\lambda \leq 30.4$ |
| | $42.5 \leq h_s/\lambda < 47.5$ | $-67.5 \leq \theta \leq -62.5$ | $21.5 \leq h_m/\lambda \leq 29.5$ |
| | $42.5 \leq h_s/\lambda < 47.5$ | $-62.5 \leq \theta \leq -60$ | $22.9 \leq h_m/\lambda \leq 27$ |
| | $47.5 \leq h_s/\lambda < 52.5$ | $-90 \leq \theta \leq -87.5$ | $35.7 \leq h_m/\lambda \leq 47$ |
| | $47.5 \leq h_s/\lambda < 52.5$ | $-87.5 \leq \theta \leq -82.5$ | $33.7 \leq h_m/\lambda \leq 40.3$ |
| | $47.5 \leq h_s/\lambda < 52.5$ | $-82.5 \leq \theta \leq -77.5$ | $27 \leq h_m/\lambda \leq 37.5$ |
| | $47.5 \leq h_s/\lambda < 52.5$ | $-77.5 \leq \theta \leq -72.5$ | $19.6 \leq h_m/\lambda \leq 36.3$ |
| | $47.5 \leq h_s/\lambda < 52.5$ | $-72.5 \leq \theta \leq -67.5$ | $18.6 \leq h_m/\lambda \leq 35.5$ |
| | $47.5 \leq h_s/\lambda < 52.5$ | $-67.5 \leq \theta \leq -62.5$ | $18.5 \leq h_m/\lambda \leq 34.6$ |
| | $47.5 \leq h_s/\lambda < 52.5$ | $-62.5 \leq \theta \leq -57.5$ | $18.8 \leq h_m/\lambda \leq 33$ |
| | $47.5 \leq h_s/\lambda < 52.5$ | $-57.5 \leq \theta \leq -52.5$ | $20.5 \leq h_m/\lambda \leq 29.5$ |
| | $52.5 \leq h_s/\lambda < 57.5$ | $-85 \leq \theta \leq -82.5$ | $48.95 \leq h_m/\lambda \leq 49.1$ |
| | $52.5 \leq h_s/\lambda < 57.5$ | $-85 \leq \theta \leq -82.5$ | $46.45 \leq h_m/\lambda \leq 46.6$ |
| | $52.5 \leq h_s/\lambda < 57.5$ | $-85 \leq \theta \leq -82.5$ | $43.92 \leq h_m/\lambda \leq 44.15$ |
| | $52.5 \leq h_s/\lambda < 57.5$ | $-85 \leq \theta \leq -82.5$ | $41.4 \leq h_m/\lambda \leq 41.65$ |
| | $52.5 \leq h_s/\lambda < 57.5$ | $-85 \leq \theta \leq -82.5$ | $26 \leq h_m/\lambda \leq 35.6$ |
| | $52.5 \leq h_s/\lambda < 57.5$ | $-82.5 \leq \theta \leq -77.5$ | $49.3 \leq h_m/\lambda \leq 49$ |
| | $52.5 \leq h_s/\lambda < 57.5$ | $-82.5 \leq \theta \leq -77.5$ | $46.45 \leq h_m/\lambda \leq 46.8$ |
| | $52.5 \leq h_s/\lambda < 57.5$ | $-82.5 \leq \theta \leq -77.5$ | $39.2 \leq h_m/\lambda \leq 44.15$ |
| | $52.5 \leq h_s/\lambda < 57.5$ | $-82.5 \leq \theta \leq -77.5$ | $41.4 \leq h_m/\lambda \leq 41.7$ |
| | $52.5 \leq h_s/\lambda < 57.5$ | $-82.5 \leq \theta \leq -77.5$ | $23.2 \leq h_m/\lambda \leq 40$ |
| | $52.5 \leq h_s/\lambda < 57.5$ | $-77.5 \leq \theta \leq -72.5$ | $44 \leq h_m/\lambda \leq 44.3$ |
| | $52.5 \leq h_s/\lambda < 57.5$ | $-77.5 \leq \theta \leq -72.5$ | $41.4 \leq h_m/\lambda \leq 41.8$ |
| | $52.5 \leq h_s/\lambda < 57.5$ | $-77.5 \leq \theta \leq -72.5$ | $35 \leq h_m/\lambda \leq 40$ |
| | $52.5 \leq h_s/\lambda < 57.5$ | $-77.5 \leq \theta \leq -72.5$ | $18.3 \leq h_m/\lambda \leq 34$ |
| | $52.5 \leq h_s/\lambda < 57.5$ | $-72.5 \leq \theta \leq -67.5$ | $44 \leq h_m/\lambda \leq 44.5$ |
| | $52.5 \leq h_s/\lambda < 57.5$ | $-72.5 \leq \theta \leq -67.5$ | $41.4 \leq h_m/\lambda \leq 41.9$ |
| | $52.5 \leq h_s/\lambda < 57.5$ | $-72.5 \leq \theta \leq -67.5$ | $34.5 \leq h_m/\lambda \leq 39.9$ |
| | $52.5 \leq h_s/\lambda < 57.5$ | $-72.5 \leq \theta \leq -67.5$ | $17.1 \leq h_m/\lambda \leq 23.5$ |
| | $52.5 \leq h_s/\lambda < 57.5$ | $-67.5 \leq \theta \leq -62.5$ | $44.5 \leq h_m/\lambda \leq 44.6$ |
| | $52.5 \leq h_s/\lambda < 57.5$ | $-67.5 \leq \theta \leq -62.5$ | $42 \leq h_m/\lambda \leq 42.1$ |
| | $52.5 \leq h_s/\lambda < 57.5$ | $-67.5 \leq \theta \leq -62.5$ | $34.5 \leq h_m/\lambda \leq 39.2$ |
| | $52.5 \leq h_s/\lambda < 57.5$ | $-67.5 \leq \theta \leq -62.5$ | $16.9 \leq h_m/\lambda \leq 23$ |
| | $52.5 \leq h_s/\lambda < 57.5$ | $-62.5 \leq \theta \leq -57.5$ | $34.5 \leq h_m/\lambda \leq 38$ |
| | $52.5 \leq h_s/\lambda < 57.5$ | $-62.5 \leq \theta \leq -57.5$ | $17 \leq h_m/\lambda \leq 22.5$ |
| | $52.5 \leq h_s/\lambda < 57.5$ | $-57.5 \leq \theta \leq -52.5$ | $35 \leq h_m/\lambda \leq 36$ |
| | $52.5 \leq h_s/\lambda < 57.5$ | $-57.5 \leq \theta \leq -52.5$ | $17.5 \leq h_m/\lambda \leq 22$ |
| | $52.5 \leq h_s/\lambda < 57.5$ | $-52.5 \leq \theta \leq -47.5$ | $19.5 \leq h_m/\lambda \leq 21$ |
| | $57.5 \leq h_s/\lambda < 62.5$ | $-90 \leq \theta \leq -87.5$ | $43.1 \leq h_m/\lambda \leq 57$ |
| | $57.5 \leq h_s/\lambda < 62.5$ | $-90 \leq \theta \leq -87.5$ | $29.6 \leq h_m/\lambda \leq 40.4$ |
| | $57.5 \leq h_s/\lambda < 62.5$ | $-87.5 \leq \theta \leq -82.5$ | $50.2 \leq h_m/\lambda \leq 57$ |
| | $57.5 \leq h_s/\lambda < 62.5$ | $-87.5 \leq \theta \leq -82.5$ | $42 \leq h_m/\lambda \leq 47.4$ |
| | $57.5 \leq h_s/\lambda < 62.5$ | $-87.5 \leq \theta \leq -82.5$ | $23.5 \leq h_m/\lambda \leq 41$ |
| | $57.5 \leq h_s/\lambda < 62.5$ | $-82.5 \leq \theta \leq -77.5$ | $41.5 \leq h_m/\lambda \leq 45.6$ |
| | $57.5 \leq h_s/\lambda < 62.5$ | $-82.5 \leq \theta \leq -77.5$ | $21.1 \leq h_m/\lambda \leq 40.5$ |
| | $57.5 \leq h_s/\lambda < 62.5$ | $-77.5 \leq \theta \leq -72.5$ | $17.3 \leq h_m/\lambda \leq 44.7$ |
| | $57.5 \leq h_s/\lambda < 62.5$ | $-72.5 \leq \theta \leq -67.5$ | $40.4 \leq h_m/\lambda \leq 44.2$ |
| | $57.5 \leq h_s/\lambda < 62.5$ | $-72.5 \leq \theta \leq -67.5$ | $16 \leq h_m/\lambda \leq 20.5$ |
| | $57.5 \leq h_s/\lambda < 62.5$ | $-67.5 \leq \theta \leq -62.5$ | $15.7 \leq h_m/\lambda \leq 20.5$ |
| | $57.5 \leq h_s/\lambda < 62.5$ | $-62.5 \leq \theta \leq -57.5$ | $15.7 \leq h_m/\lambda \leq 20$ |
| | $57.5 \leq h_s/\lambda < 62.5$ | $-57.5 \leq \theta \leq -52.5$ | $16 \leq h_m/\lambda \leq 19.5$ |
| | $57.5 \leq h_s/\lambda < 62.5$ | $-52.5 \leq \theta \leq -47.5$ | $17.5 \leq h_m/\lambda \leq 19$ |
| | $57.5 \leq h_s/\lambda < 62.5$ | $-47.5 \leq \theta \leq -42.5$ | $17.7 \leq h_m/\lambda \leq 18$ |
| | $57.5 \leq h_s/\lambda < 62.5$ | $-42.5 \leq \theta \leq -37.5$ | $16.1 \leq h_m/\lambda \leq 17$ |
| | $57.5 \leq h_s/\lambda < 62.5$ | $-37.5 \leq \theta \leq -32.5$ | $15.2 \leq h_m/\lambda \leq 16$ |
| | $57.5 \leq h_s/\lambda < 62.5$ | $-32.5 \leq \theta \leq -27.5$ | $14.2 \leq h_m/\lambda \leq 15$ |

TABLE 5

| Metal for the first metal film | Thickness hs/λ (%) of the dielectric film | θ (°) of the Euler angles | Thickness hm/λ (%) of the first metal film |
|---|---|---|---|
| Cu | 62.5 ≤ hs/λ < 67.5 | −90 ≤ θ ≤ −87.5 | 47.4 ≤ hm/λ ≤ 62 |
| | 62.5 ≤ hs/λ < 67.5 | −90 ≤ θ ≤ −87.5 | 27.7 ≤ hm/λ ≤ 46.2 |
| | 62.5 ≤ hs/λ < 67.5 | −87.5 ≤ θ ≤ −82.5 | 53.3 ≤ hm/λ ≤ 62 |
| | 62.5 ≤ hs/λ < 67.5 | −87.5 ≤ θ ≤ −82.5 | 46.7 ≤ hm/λ ≤ 51.4 |
| | 62.5 ≤ hs/λ < 67.5 | −87.5 ≤ θ ≤ −82.5 | 22.2 ≤ hm/λ ≤ 46.4 |
| | 62.5 ≤ hs/λ < 67.5 | −82.5 ≤ θ ≤ −77.5 | 57.7 ≤ hm/λ ≤ 62 |
| | 62.5 ≤ hs/λ < 67.5 | −82.5 ≤ θ ≤ −77.5 | 20 ≤ hm/λ ≤ 50 |
| | 62.5 ≤ hs/λ < 67.5 | −77.5 ≤ θ ≤ −72.5 | 36.5 ≤ hm/λ ≤ 49.15 |
| | 62.5 ≤ hs/λ < 67.5 | −77.5 ≤ θ ≤ −72.5 | 16.7 ≤ hm/λ ≤ 34 |
| | 62.5 ≤ hs/λ < 67.5 | −72.5 ≤ θ ≤ −67.5 | 45.75 ≤ hm/λ ≤ 48.6 |
| | 62.5 ≤ hs/λ < 67.5 | −72.5 ≤ θ ≤ −67.5 | 15.25 ≤ hm/λ ≤ 19.6 |
| | 62.5 ≤ hs/λ < 67.5 | −67.5 ≤ θ ≤ −62.5 | 14.9 ≤ hm/λ ≤ 19 |
| | 62.5 ≤ hs/λ < 67.5 | −62.5 ≤ θ ≤ −57.5 | 14.9 ≤ hm/λ ≤ 18.5 |
| | 62.5 ≤ hs/λ < 67.5 | −57.5 ≤ θ ≤ −52.5 | 15 ≤ hm/λ ≤ 18 |
| | 62.5 ≤ hs/λ < 67.5 | −52.5 ≤ θ ≤ −47.5 | 16 ≤ hm/λ ≤ 17.5 |
| | 62.5 ≤ hs/λ < 67.5 | −47.5 ≤ θ ≤ −42.5 | 16.15 ≤ hm/λ ≤ 17 |
| | 62.5 ≤ hs/λ < 67.5 | −42.5 ≤ θ ≤ −37.5 | 14.8 ≤ hm/λ ≤ 16.05 |
| | 62.5 ≤ hs/λ < 67.5 | −37.5 ≤ θ ≤ −32.5 | 14 ≤ hm/λ ≤ 15 |
| | 62.5 ≤ hs/λ < 67.5 | −32.5 ≤ θ ≤ −27.5 | 13.7 ≤ hm/λ ≤ 14.5 |
| | 67.5 ≤ hs/λ < 72.5 | −90 ≤ θ ≤ −87.5 | 51.8 ≤ hm/λ ≤ 67 |
| | 67.5 ≤ hs/λ < 72.5 | −90 ≤ θ ≤ −87.5 | 26.7 ≤ hm/λ ≤ 51.4 |
| | 67.5 ≤ hs/λ < 72.5 | −87.5 ≤ θ ≤ −82.5 | 56.9 ≤ hm/λ ≤ 87 |
| | 67.5 ≤ hs/λ < 72.5 | −87.5 ≤ θ ≤ −82.5 | 21.3 ≤ hm/λ ≤ 55.5 |
| | 67.5 ≤ hs/λ < 72.5 | −82.5 ≤ θ ≤ −77.5 | 59.8 ≤ hm/λ ≤ 67 |
| | 67.5 ≤ hs/λ < 72.5 | −82.5 ≤ θ ≤ −77.5 | 19.15 ≤ hm/λ ≤ 54.4 |
| | 67.5 ≤ hs/λ < 72.5 | −77.5 ≤ θ ≤ −72.5 | 43 ≤ hm/λ ≤ 53.6 |
| | 67.5 ≤ hs/λ < 72.5 | −77.5 ≤ θ ≤ −72.5 | 16.2 ≤ hm/λ ≤ 30.9 |
| | 67.5 ≤ hs/λ < 72.5 | −72.5 ≤ θ ≤ −67.5 | 50.7 ≤ hm/λ ≤ 53.2 |
| | 67.5 ≤ hs/λ < 72.5 | −72.5 ≤ θ ≤ −67.5 | 14.6 ≤ hm/λ ≤ 18.7 |
| | 67.5 ≤ hs/λ < 72.5 | −67.5 ≤ θ ≤ −62.5 | 14.3 ≤ hm/λ ≤ 18 |
| | 67.5 ≤ hs/λ < 72.5 | −62.5 ≤ θ ≤ −57.5 | 14.2 ≤ hm/λ ≤ 17.5 |
| | 67.5 ≤ hs/λ < 72.5 | −57.5 ≤ θ ≤ −52.5 | 14.5 ≤ hm/λ ≤ 17.4 |
| | 67.5 ≤ hs/λ < 72.5 | −52.5 ≤ θ ≤ −47.5 | 14.9 ≤ hm/λ ≤ 16.5 |
| | 67.5 ≤ hs/λ < 72.5 | −47.5 ≤ θ ≤ −42.5 | 15.1 ≤ hm/λ ≤ 16 |
| | 67.5 ≤ hs/λ < 72.5 | −42.5 ≤ θ ≤ −37.5 | 13.9 ≤ hm/λ ≤ 15 |
| | 67.5 ≤ hs/λ < 72.5 | −37.5 ≤ θ ≤ −32.5 | 13.2 ≤ hm/λ ≤ 14.5 |
| | 67.5 ≤ hs/λ < 72.5 | −32.5 ≤ θ ≤ −30 | 13 ≤ hm/λ ≤ 14.5 |
| | 72.5 ≤ hs/λ < 77.5 | −90 ≤ θ ≤ −87.5 | 26.1 ≤ hm/λ ≤ 72 |
| | 72.5 ≤ hs/λ < 77.5 | −87.5 ≤ θ ≤ −82.5 | 60.8 ≤ hm/λ ≤ 72 |
| | 72.5 ≤ hs/λ < 77.5 | −87.5 ≤ θ ≤ −82.5 | 20.7 ≤ hm/λ ≤ 59.8 |
| | 72.5 ≤ hs/λ < 77.5 | −82.5 ≤ θ ≤ −77.5 | 62.8 ≤ hm/λ ≤ 72 |
| | 72.5 ≤ hs/λ < 77.5 | −82.5 ≤ θ ≤ −77.5 | 18.5 ≤ hm/λ ≤ 58.9 |
| | 72.5 ≤ hs/λ < 77.5 | −77.5 ≤ θ ≤ −72.5 | 47.5 ≤ hm/λ ≤ 58.2 |
| | 72.5 ≤ hs/λ < 77.5 | −77.5 ≤ θ ≤ −72.5 | 15.8 ≤ hm/λ ≤ 29.8 |
| | 72.5 ≤ hs/λ < 77.5 | −72.5 ≤ θ ≤ −67.5 | 55.7 ≤ hm/λ ≤ 57.8 |
| | 72.5 ≤ hs/λ < 77.5 | −72.5 ≤ θ ≤ −67.5 | 14.1 ≤ hm/λ ≤ 17.5 |
| | 72.5 ≤ hs/λ < 77.5 | −67.5 ≤ θ ≤ −62.5 | 13.7 ≤ hm/λ ≤ 17.5 |
| | 72.5 ≤ hs/λ < 77.5 | −62.5 ≤ θ ≤ −57.5 | 13.7 ≤ hm/λ ≤ 17 |
| | 72.5 ≤ hs/λ < 77.5 | −57.5 ≤ θ ≤ −52.5 | 13.7 ≤ hm/λ ≤ 16.5 |
| | 72.5 ≤ hs/λ < 77.5 | −52.5 ≤ θ ≤ −47.5 | 14.5 ≤ hm/λ ≤ 16 |
| | 72.5 ≤ hs/λ < 77.5 | −47.5 ≤ θ ≤ −42.5 | 14.15 ≤ hm/λ ≤ 15.5 |
| | 72.5 ≤ hs/λ < 77.5 | −42.5 ≤ θ ≤ −37.5 | 13.2 ≤ hm/λ ≤ 14.5 |
| | 72.5 ≤ hs/λ < 77.5 | −37.5 ≤ θ ≤ −32.5 | 12.6 ≤ hm/λ ≤ 14 |
| | 72.5 ≤ hs/λ < 77.5 | −32.5 ≤ θ ≤ −27.5 | 12.4 ≤ hm/λ ≤ 14 |
| | 77.5 ≤ hs/λ < 82.5 | −90 ≤ θ ≤ −87.5 | 25.75 ≤ hm/λ ≤ 77 |
| | 77.5 ≤ hs/λ < 82.5 | −87.5 ≤ θ ≤ −82.5 | 64.9 ≤ hm/λ ≤ 77 |
| | 77.5 ≤ hs/λ < 82.5 | −87.5 ≤ θ ≤ −82.5 | 20.2 ≤ hm/λ ≤ 64.2 |
| | 77.5 ≤ hs/λ < 82.5 | −82.5 ≤ θ ≤ −77.5 | 66.3 ≤ hm/λ ≤ 77 |
| | 77.5 ≤ hs/λ < 82.5 | −82.5 ≤ θ ≤ −77.5 | 18 ≤ hm/λ ≤ 63.5 |
| | 77.5 ≤ hs/λ < 82.5 | −77.5 ≤ θ ≤ −72.5 | 72.6 ≤ hm/λ ≤ 77 |
| | 77.5 ≤ hs/λ < 82.5 | −77.5 ≤ θ ≤ −72.5 | 51.2 ≤ hm/λ ≤ 63.9 |
| | 77.5 ≤ hs/λ < 82.5 | −77.5 ≤ θ ≤ −72.5 | 17.5 ≤ hm/λ ≤ 29.3 |
| | 77.5 ≤ hs/λ < 82.5 | −72.5 ≤ θ ≤ −67.5 | 60.4 ≤ hm/λ ≤ 62.5 |
| | 77.5 ≤ hs/λ < 82.5 | −72.5 ≤ θ ≤ −67.5 | 13.7 ≤ hm/λ ≤ 17.3 |
| | 77.5 ≤ hs/λ < 82.5 | −67.5 ≤ θ ≤ −62.5 | 13.4 ≤ hm/λ ≤ 16.5 |
| | 77.5 ≤ hs/λ < 82.5 | −62.5 ≤ θ ≤ −57.5 | 13.3 ≤ hm/λ ≤ 16.4 |
| | 77.5 ≤ hs/λ < 82.5 | −57.5 ≤ θ ≤ −52.5 | 13.3 ≤ hm/λ ≤ 16.4 |

TABLE 6

| Metal for the first metal film | Thickness hs/λ (%) of the dielectric film | θ (°) of the Euler angles | Thickness hm/λ (%) of the first metal film |
|---|---|---|---|
| Cu | 82.5 ≤ hs/λ < 87.5 | −90 ≤ θ ≤ −87.5 | 25.6 ≤ hm/λ ≤ 82 |
| | 82.5 ≤ hs/λ < 87.5 | −87.5 ≤ θ ≤ −82.5 | 69.3 ≤ hm/λ ≤ 82 |
| | 82.5 ≤ hs/λ < 87.5 | −87.5 ≤ θ ≤ −82.5 | 19.9 ≤ hm/λ ≤ 68.8 |
| | 82.5 ≤ hs/λ < 87.5 | −82.5 ≤ θ ≤ −77.5 | 70.2 ≤ hm/λ ≤ 82 |
| | 82.5 ≤ hs/λ < 87.5 | −82.5 ≤ θ ≤ −77.5 | 17.6 ≤ hm/λ ≤ 68.1 |
| | 82.5 ≤ hs/λ < 87.5 | −77.5 ≤ θ ≤ −72.5 | 74.3 ≤ hm/λ ≤ 82 |
| | 82.5 ≤ hs/λ < 87.5 | −77.5 ≤ θ ≤ −72.5 | 54.2 ≤ hm/λ ≤ 67.6 |
| | 82.5 ≤ hs/λ < 87.5 | −77.5 ≤ θ ≤ −72.5 | 17 ≤ hm/λ ≤ 29 |
| | 82.5 ≤ hs/λ < 87.5 | −72.5 ≤ θ ≤ −67.5 | 63.3 ≤ hm/λ ≤ 67 |
| | 82.5 ≤ hs/λ < 87.5 | −72.5 ≤ θ ≤ −67.5 | 13.2 ≤ hm/λ ≤ 18.3 |
| | 82.5 ≤ hs/λ < 87.5 | −67.5 ≤ θ ≤ −62.5 | 13 ≤ hm/λ ≤ 16.5 |
| | 82.5 ≤ hs/λ < 87.5 | −62.5 ≤ θ ≤ −57.5 | 12.9 ≤ hm/λ ≤ 15.9 |
| | 82.5 ≤ hs/λ < 87.5 | −57.5 ≤ θ ≤ −52.5 | 13 ≤ hm/λ ≤ 15.5 |
| | 82.5 ≤ hs/λ < 87.5 | −52.5 ≤ θ ≤ −47.5 | 13.4 ≤ hm/λ ≤ 15 |
| | 82.5 ≤ hs/λ < 87.5 | −47.5 ≤ θ ≤ −42.5 | 13 ≤ hm/λ ≤ 14.3 |
| | 82.5 ≤ hs/λ < 87.5 | −42.5 ≤ θ ≤ −37.5 | 12.2 ≤ hm/λ ≤ 13.6 |
| | 82.5 ≤ hs/λ < 87.5 | −37.5 ≤ θ ≤ −32.5 | 11.6 ≤ hm/λ ≤ 13 |
| | 82.5 ≤ hs/λ < 87.5 | −32.5 ≤ θ ≤ −30 | 11.6 ≤ hm/λ ≤ 13 |
| | 87.5 ≤ hs/λ < 92.5 | −90 ≤ θ ≤ −87.5 | 25.5 ≤ hm/λ ≤ 87 |
| | 87.5 ≤ hs/λ < 92.5 | −87.5 ≤ θ ≤ −82.5 | 73.6 ≤ hm/λ ≤ 87 |
| | 87.5 ≤ hs/λ < 92.5 | −87.5 ≤ θ ≤ −82.5 | 19.6 ≤ hm/λ ≤ 73.3 |
| | 87.5 ≤ hs/λ < 92.5 | −82.5 ≤ θ ≤ −77.5 | 74.3 ≤ hm/λ ≤ 87 |
| | 87.5 ≤ hs/λ < 92.5 | −82.5 ≤ θ ≤ −77.5 | 17.2 ≤ hm/λ ≤ 72.8 |
| | 87.5 ≤ hs/λ < 92.5 | −77.5 ≤ θ ≤ −72.5 | 77.2 ≤ hm/λ ≤ 87 |
| | 87.5 ≤ hs/λ < 92.5 | −77.5 ≤ θ ≤ −72.5 | 56.8 ≤ hm/λ ≤ 72.3 |
| | 87.5 ≤ hs/λ < 92.5 | −77.5 ≤ θ ≤ −72.5 | 16.4 ≤ hm/λ ≤ 28.7 |
| | 87.5 ≤ hs/λ < 92.5 | −72.5 ≤ θ ≤ −67.5 | 82.2 ≤ hm/λ ≤ 87 |
| | 87.5 ≤ hs/λ < 92.5 | −72.5 ≤ θ ≤ −67.5 | 68 ≤ hm/λ ≤ 72 |
| | 87.5 ≤ hs/λ < 92.5 | −72.5 ≤ θ ≤ −67.5 | 12.9 ≤ hm/λ ≤ 18.4 |
| | 87.5 ≤ hs/λ < 92.5 | −67.5 ≤ θ ≤ −62.5 | 12.65 ≤ hm/λ ≤ 16 |
| | 87.5 ≤ hs/λ < 92.5 | −62.5 ≤ θ ≤ −57.5 | 12.6 ≤ hm/λ ≤ 15.5 |
| | 87.5 ≤ hs/λ < 92.5 | −57.5 ≤ θ ≤ −52.5 | 12.7 ≤ hm/λ ≤ 15 |
| | 87.5 ≤ hs/λ < 92.5 | −52.5 ≤ θ ≤ −47.5 | 12.9 ≤ hm/λ ≤ 14.5 |
| | 87.5 ≤ hs/λ < 92.5 | −47.5 ≤ θ ≤ −42.5 | 12.5 ≤ hm/λ ≤ 13.8 |
| | 87.5 ≤ hs/λ < 92.5 | −42.5 ≤ θ ≤ −37.5 | 11.8 ≤ hm/λ ≤ 13 |
| | 87.5 ≤ hs/λ < 92.5 | −37.5 ≤ θ ≤ −32.5 | 11.2 ≤ hm/λ ≤ 13 |
| | 87.5 ≤ hs/λ < 92.5 | −32.5 ≤ θ ≤ −27.5 | 11.3 ≤ hm/λ ≤ 13 |
| | 92.5 ≤ hs/λ ≤ 97.5 | −90 ≤ θ ≤ −87.5 | 25.5 ≤ hm/λ ≤ 92 |
| | 92.5 ≤ hs/λ ≤ 97.5 | −87.5 ≤ θ ≤ −82.5 | 19.3 ≤ hm/λ ≤ 92 |
| | 92.5 ≤ hs/λ ≤ 97.5 | −82.5 ≤ θ ≤ −77.5 | 78.8 ≤ hm/λ ≤ 92 |
| | 92.5 ≤ hs/λ ≤ 97.5 | −82.5 ≤ θ ≤ −77.5 | 17 ≤ hm/λ ≤ 77.6 |
| | 92.5 ≤ hs/λ ≤ 97.5 | −77.5 ≤ θ ≤ −72.5 | 80.6 ≤ hm/λ ≤ 92 |
| | 92.5 ≤ hs/λ ≤ 97.5 | −77.5 ≤ θ ≤ −72.5 | 59 ≤ hm/λ ≤ 77 |
| | 92.5 ≤ hs/λ ≤ 97.5 | −77.5 ≤ θ ≤ −72.5 | 16 ≤ hm/λ ≤ 28.5 |
| | 92.5 ≤ hs/λ ≤ 97.5 | −72.5 ≤ θ ≤ −67.5 | 86.5 ≤ hm/λ ≤ 92 |
| | 92.5 ≤ hs/λ ≤ 97.5 | −72.5 ≤ θ ≤ −67.5 | 72 ≤ hm/λ ≤ 76.5 |
| | 92.5 ≤ hs/λ ≤ 97.5 | −72.5 ≤ θ ≤ −67.5 | 12.6 ≤ hm/λ ≤ 18.4 |
| | 92.5 ≤ hs/λ ≤ 97.5 | −67.5 ≤ θ ≤ −62.5 | 12.4 ≤ hm/λ ≤ 15.5 |
| | 92.5 ≤ hs/λ ≤ 97.5 | −62.5 ≤ θ ≤ −57.5 | 12.4 ≤ hm/λ ≤ 15.2 |
| | 92.5 ≤ hs/λ ≤ 97.5 | −57.5 ≤ θ ≤ −52.5 | 12.5 ≤ hm/λ ≤ 14.7 |
| | 92.5 ≤ hs/λ ≤ 97.5 | −52.5 ≤ θ ≤ −47.5 | 12.9 ≤ hm/λ ≤ 14.2 |
| | 92.5 ≤ hs/λ ≤ 97.5 | −47.5 ≤ θ ≤ −42.5 | 12.2 ≤ hm/λ ≤ 13.5 |
| | 92.5 ≤ hs/λ ≤ 97.5 | −42.5 ≤ θ ≤ −37.5 | 11.5 ≤ hm/λ ≤ 13.1 |
| | 92.5 ≤ hs/λ ≤ 97.5 | −37.5 ≤ θ ≤ −32.5 | 11.5 ≤ hm/λ ≤ 12.5 |
| | 92.5 ≤ hs/λ ≤ 97.5 | −32.5 ≤ θ ≤ −27.5 | 11.5 ≤ hm/λ ≤ 13 |

TABLE 7

| Metal for the first metal film | Thickness hs/λ (%) of the dielectric film | θ (°) of the Euler angles | Thickness hm/λ (%) of the first metal film |
|---|---|---|---|
| Mo | 32.5 ≤ hs/λ < 37.5 | −85 ≤ θ ≤ −82.5 | 31.4 ≤ Tm ≤ 32 |
| | 32.5 ≤ hs/λ < 37.5 | −82.5 ≤ θ ≤ −77.5 | 24.75 ≤ Tm ≤ 32 |
| | 32.5 ≤ hs/λ < 37.5 | −77.5 ≤ θ ≤ −72.5 | 23.6 ≤ Tm ≤ 30.5 |
| | 32.5 ≤ hs/λ < 37.5 | −72.5 ≤ θ ≤ −67.5 | 23.6 ≤ Tm ≤ 30.6 |
| | 32.5 ≤ hs/λ < 37.5 | −67.5 ≤ θ ≤ −62.5 | 24.5 ≤ Tm ≤ 30.5 |
| | 32.5 ≤ hs/λ < 37.5 | −62.5 ≤ θ ≤ −57.5 | 25.5 ≤ Tm ≤ 30.5 |
| | 32.5 ≤ hs/λ < 37.5 | −57.5 ≤ θ ≤ −52.5 | 28.75 ≤ Tm ≤ 29.75 |
| | 32.5 ≤ hs/λ < 37.5 | −52.5 ≤ θ ≤ −50 | 29.7 ≤ Tm ≤ 29.75 |
| | 37.5 ≤ hs/λ < 42.5 | −85 ≤ θ ≤ −82.5 | 34.25 ≤ Tm ≤ 37 |
| | 37.5 ≤ hs/λ < 42.5 | −82.5 ≤ θ ≤ −77.5 | 25.4 ≤ Tm ≤ 37 |
| | 37.5 ≤ hs/λ < 42.5 | −77.5 ≤ θ ≤ −72.5 | 23.1 ≤ Tm ≤ 34 |
| | 37.5 ≤ hs/λ < 42.5 | −72.5 ≤ θ ≤ −67.5 | 22.9 ≤ Tm ≤ 34 |
| | 37.5 ≤ hs/λ < 42.5 | −67.5 ≤ θ ≤ −62.5 | 23.7 ≤ Tm ≤ 34 |
| | 37.5 ≤ hs/λ < 42.5 | −62.5 ≤ θ ≤ −57.5 | 25.4 ≤ Tm ≤ 34 |
| | 37.5 ≤ hs/λ < 42.5 | −57.5 ≤ θ ≤ −52.5 | 31.5 ≤ Tm ≤ 33.5 |
| | 37.5 ≤ hs/λ < 42.5 | −52.5 ≤ θ ≤ −50 | 33.5 ≤ Tm ≤ 34 |
| | 42.5 ≤ hs/λ < 47.5 | −90 ≤ θ ≤ −87.5 | 40.5 ≤ Tm ≤ 42 |
| | 42.5 ≤ hs/λ < 47.5 | −87.5 ≤ θ ≤ −82.5 | 36.7 ≤ Tm ≤ 42 |

TABLE 7-continued

| Metal for the first metal film | Thickness hs/λ (%) of the dielectric film | θ (°) of the Euler angles | Thickness hm/λ (%) of the first metal film |
|---|---|---|---|
| | 42.5 ≤ hs/λ < 47.5 | −82.5 ≤ θ ≤ −77.5 | 25.4 ≤ Tm ≤ 42 |
| | 42.5 ≤ hs/λ < 47.5 | −77.5 ≤ θ ≤ −72.5 | 21.1 ≤ Tm ≤ 37 |
| | 42.5 ≤ hs/λ < 47.5 | −72.5 ≤ θ ≤ −67.5 | 20.4 ≤ Tm ≤ 37.5 |
| | 42.5 ≤ hs/λ < 47.5 | −67.5 ≤ θ ≤ −62.5 | 20.6 ≤ Tm ≤ 37.5 |
| | 42.5 ≤ hs/λ < 47.5 | −62.5 ≤ θ ≤ −57.5 | 21.5 ≤ Tm ≤ 37 |
| | 42.5 ≤ hs/λ < 47.5 | −57.5 ≤ θ ≤ −52.5 | 27 ≤ Tm ≤ 36.5 |
| | 42.5 ≤ hs/λ < 47.5 | −52.5 ≤ θ ≤ −50 | 37 ≤ Tm ≤ 37.5 |
| | 47.5 ≤ hs/λ < 52.5 | −90 ≤ θ ≤ −87.5 | 43.2 ≤ Tm ≤ 47 |
| | 47.5 ≤ hs/λ < 52.5 | −87.5 ≤ θ ≤ −82.5 | 36.5 ≤ Tm ≤ 47 |
| | 47.5 ≤ hs/λ < 52.5 | −82.5 ≤ θ ≤ −77.5 | 35 ≤ Tm ≤ 47 |
| | 47.5 ≤ hs/λ < 52.5 | −82.5 ≤ θ ≤ −77.5 | 25.8 ≤ Tm ≤ 34 |
| | 47.5 ≤ hs/λ < 52.5 | −77.5 ≤ θ ≤ −72.5 | 19.4 ≤ Tm ≤ 38 |
| | 47.5 ≤ hs/λ < 52.5 | −72.5 ≤ θ ≤ −67.5 | 18.3 ≤ Tm ≤ 39 |
| | 47.5 ≤ hs/λ < 52.5 | −67.5 ≤ θ ≤ −62.5 | 18.3 ≤ Tm ≤ 39.5 |
| | 47.5 ≤ hs/λ < 52.5 | −62.5 ≤ θ ≤ −57.5 | 18.6 ≤ Tm ≤ 39 |
| | 47.5 ≤ hs/λ < 52.5 | −57.5 ≤ θ ≤ −52.5 | 20 ≤ Tm ≤ 37 |
| | 47.5 ≤ hs/λ < 52.5 | −52.5 ≤ θ ≤ −50 | 35.5 ≤ Tm ≤ 40.5 |
| | 47.5 ≤ hs/λ < 52.5 | −52.5 ≤ θ ≤ −50 | 24.5 ≤ Tm ≤ 29 |
| | 52.5 ≤ hs/λ < 57.5 | −90 ≤ θ ≤ −87.5 | 44.3 ≤ Tm ≤ 52 |
| | 52.5 ≤ hs/λ < 57.5 | −87.5 ≤ θ ≤ −82.5 | 29.8 ≤ Tm ≤ 52 |
| | 52.5 ≤ hs/λ < 57.5 | −82.5 ≤ θ ≤ −77.5 | 26 ≤ Tm ≤ 52 |
| | 52.5 ≤ hs/λ < 57.5 | −77.5 ≤ θ ≤ −72.5 | 27.2 ≤ Tm ≤ 31.2 |
| | 52.5 ≤ hs/λ < 57.5 | −77.5 ≤ θ ≤ −72.5 | 18.1 ≤ Tm ≤ 26 |
| | 52.5 ≤ hs/λ < 57.5 | −72.5 ≤ θ ≤ −67.5 | 16.9 ≤ Tm ≤ 26.3 |
| | 52.5 ≤ hs/λ < 57.5 | −67.5 ≤ θ ≤ −62.5 | 16.7 ≤ Tm ≤ 25.2 |
| | 52.5 ≤ hs/λ < 57.5 | −62.5 ≤ θ ≤ −57.5 | 16.8 ≤ Tm ≤ 24.7 |
| | 52.5 ≤ hs/λ < 57.5 | −57.5 ≤ θ ≤ −52.5 | 17.5 ≤ Tm ≤ 24 |
| | 52.5 ≤ hs/λ < 57.5 | −52.5 ≤ θ ≤ −47.5 | 19.5 ≤ Tm ≤ 22.5 |
| | 52.5 ≤ hs/λ < 57.5 | −42.5 ≤ θ ≤ −37.5 | 21 ≤ Tm ≤ 21.5 |
| | 52.5 ≤ hs/λ < 57.5 | −42.5 ≤ θ ≤ −37.5 | 18 ≤ Tm ≤ 19 |
| | 52.5 ≤ hs/λ < 57.5 | −37.5 ≤ θ ≤ −32.5 | 19.5 ≤ Tm ≤ 21 |
| | 52.5 ≤ hs/λ < 57.5 | −37.5 ≤ θ ≤ −32.5 | 16.6 ≤ Tm ≤ 17 |
| | 52.5 ≤ hs/λ < 57.5 | −32.5 ≤ θ ≤ −30 | 18 ≤ Tm ≤ 19 |
| | 52.5 ≤ hs/λ < 57.5 | −32.5 ≤ θ ≤ −30 | 15.2 ≤ Tm ≤ 15.5 |
| | 57.5 ≤ hs/λ < 62.5 | −90 ≤ θ ≤ −87.5 | 37.8 ≤ Tm ≤ 57 |
| | 57.5 ≤ hs/λ < 62.5 | −87.5 ≤ θ ≤ −82.5 | 26.7 ≤ Tm ≤ 57 |
| | 57.5 ≤ hs/λ < 62.5 | −82.5 ≤ θ ≤ −77.5 | 23.1 ≤ Tm ≤ 57 |
| | 57.5 ≤ hs/λ < 62.5 | −77.5 ≤ θ ≤ −72.5 | 17.2 ≤ Tm ≤ 33.2 |
| | 57.5 ≤ hs/λ < 62.5 | −72.5 ≤ θ ≤ −67.5 | 15.9 ≤ Tm ≤ 23 |
| | 57.5 ≤ hs/λ < 62.5 | −67.5 ≤ θ ≤ −62.5 | 15.5 ≤ Tm ≤ 22 |
| | 57.5 ≤ hs/λ < 62.5 | −62.5 ≤ θ ≤ −57.5 | 15.5 ≤ Tm ≤ 21.3 |
| | 57.5 ≤ hs/λ < 62.5 | −57.5 ≤ θ ≤ −52.5 | 16 ≤ Tm ≤ 21 |
| | 57.5 ≤ hs/λ < 62.5 | −52.5 ≤ θ ≤ −47.5 | 17.5 ≤ Tm ≤ 20 |
| | 57.5 ≤ hs/λ < 62.5 | −47.5 ≤ θ ≤ −42.5 | 18.5 ≤ Tm ≤ 18.5 |
| | 57.5 ≤ hs/λ < 62.5 | −42.5 ≤ θ ≤ −37.5 | 18.5 ≤ Tm ≤ 18.5 |
| | 57.5 ≤ hs/λ < 62.5 | −42.5 ≤ θ ≤ −37.5 | 16 ≤ Tm ≤ 17.5 |
| | 57.5 ≤ hs/λ < 62.5 | −37.5 ≤ θ ≤ −32.5 | 17.5 ≤ Tm ≤ 18.5 |
| | 57.5 ≤ hs/λ < 62.5 | −37.5 ≤ θ ≤ −32.5 | 14.9 ≤ Tm ≤ 16 |
| | 57.5 ≤ hs/λ < 62.5 | −32.5 ≤ θ ≤ −30 | 16.5 ≤ Tm ≤ 17.5 |
| | 57.5 ≤ hs/λ < 62.5 | −32.5 ≤ θ ≤ −30 | 14 ≤ Tm ≤ 14.5 |

TABLE 8

| Metal for the first metal film | Thickness hs/λ (%) of the dielectric film | θ (°) of the Euler angles | Thickness hm/λ (%) of the first metal film |
|---|---|---|---|
| Mo | 62.5 ≤ hs/λ < 67.5 | −90 ≤ θ ≤ −87.5 | 34.2 ≤ hm/λ ≤ 62 |
| | 62.5 ≤ hs/λ < 67.5 | −87.5 ≤ θ ≤ −82.5 | 25 ≤ hm/λ ≤ 62 |
| | 62.5 ≤ hs/λ < 67.5 | −82.5 ≤ θ ≤ −77.5 | 21.7 ≤ hm/λ ≤ 62 |
| | 62.5 ≤ hs/λ < 67.5 | −77.5 ≤ θ ≤ −72.5 | 16.5 ≤ hm/λ ≤ 32.1 |
| | 62.5 ≤ hs/λ < 67.5 | −72.5 ≤ θ ≤ −67.5 | 15 ≤ hm/λ ≤ 21 |
| | 62.5 ≤ hs/λ < 67.5 | −67.5 ≤ θ ≤ −62.5 | 14.7 ≤ hm/λ ≤ 20.3 |
| | 62.5 ≤ hs/λ < 67.5 | −62.5 ≤ θ ≤ −57.5 | 14.6 ≤ hm/λ ≤ 19.5 |
| | 62.5 ≤ hs/λ < 67.5 | −57.5 ≤ θ ≤ −52.5 | 14.7 ≤ hm/λ ≤ 19 |
| | 62.5 ≤ hs/λ < 67.5 | −52.5 ≤ θ ≤ −47.5 | 16 ≤ hm/λ ≤ 18.5 |
| | 62.5 ≤ hs/λ < 67.5 | −47.5 ≤ θ ≤ −42.5 | 16.2 ≤ hm/λ ≤ 17.5 |
| | 62.5 ≤ hs/λ < 67.5 | −42.5 ≤ θ ≤ −37.5 | 14.6 ≤ hm/λ ≤ 17 |
| | 62.5 ≤ hs/λ < 67.5 | −37.5 ≤ θ ≤ −32.5 | 16 ≤ hm/λ ≤ 17 |
| | 62.5 ≤ hs/λ < 67.5 | −37.5 ≤ θ ≤ −32.5 | 14 ≤ hm/λ ≤ 15 |
| | 62.5 ≤ hs/λ < 67.5 | −32.5 ≤ θ ≤ −30 | 15 ≤ hm/λ ≤ 16 |
| | 67.5 ≤ hs/λ < 72.5 | −90 ≤ θ ≤ −87.5 | 32.4 ≤ hm/λ ≤ 67 |
| | 67.5 ≤ hs/λ < 72.5 | −87.5 ≤ θ ≤ −82.5 | 23.8 ≤ hm/λ ≤ 6 7 |
| | 67.5 ≤ hs/λ < 72.5 | −82.5 ≤ θ ≤ −77.5 | 20.6 ≤ hm/λ ≤ 67 |
| | 67.5 ≤ hs/λ < 72.5 | −77.5 ≤ θ ≤ −72.5 | 15.9 ≤ hm/λ ≤ 31.3 |
| | 67.5 ≤ hs/λ < 72.5 | −72.5 ≤ θ ≤ −67.5 | 14.4 ≤ hm/λ ≤ 19.5 |
| | 67.5 ≤ hs/λ < 72.5 | −67.5 ≤ θ ≤ −62.5 | 14 ≤ hm/λ ≤ 19 |
| | 67.5 ≤ hs/λ < 72.5 | −62.5 ≤ θ ≤ −57.5 | 14 ≤ hm/λ ≤ 18.3 |
| | 67.5 ≤ hs/λ < 72.5 | −57.5 ≤ θ ≤ −52.5 | 14 ≤ hm/λ ≤ 17.8 |
| | 67.5 ≤ hs/λ < 72.5 | −52.5 ≤ θ ≤ −47.5 | 15 ≤ hm/λ ≤ 17.3 |
| | 67.5 ≤ hs/λ < 72.5 | −47.5 ≤ θ ≤ −42.5 | 15 ≤ hm/λ ≤ 16.4 |
| | 67.5 ≤ hs/λ < 72.5 | −42.5 ≤ θ ≤ −37.5 | 14 ≤ hm/λ ≤ 15 |
| | 67.5 ≤ hs/λ < 72.5 | −37.5 ≤ θ ≤ −32.5 | 14 ≤ hm/λ ≤ 15.5 |
| | 67.5 ≤ hs/λ < 72.5 | −32.5 ≤ θ ≤ −30 | 14.5 ≤ hm/λ ≤ 14.6 |
| | 72.5 ≤ hs/λ < 77.5 | −90 ≤ θ ≤ −87.5 | 32.4 ≤ hm/λ ≤ 72 |
| | 72.5 ≤ hs/λ < 77.5 | −87.5 ≤ θ ≤ −82.5 | 21.6 ≤ hm/λ ≤ 72 |
| | 72.5 ≤ hs/λ < 77.5 | −82.5 ≤ θ ≤ −77.5 | 18.25 ≤ hm/λ ≤ 72 |
| | 72.5 ≤ hs/λ < 77.5 | −77.5 ≤ θ ≤ −72.5 | 63.8 ≤ hm/λ ≤ 71 |
| | 72.5 ≤ hs/λ < 77.5 | −77.5 ≤ θ ≤ −72.5 | 17.5 ≤ hm/λ ≤ 31.7 |
| | 72.5 ≤ hs/λ < 77.5 | −77.5 ≤ θ ≤ −72.5 | 14.8 ≤ hm/λ ≤ 16.2 |
| | 72.5 ≤ hs/λ < 77.5 | −72.5 ≤ θ ≤ −67.5 | 14 ≤ hm/λ ≤ 16.5 |
| | 72.5 ≤ hs/λ < 77.5 | −67.5 ≤ θ ≤ −62.5 | 14 ≤ hm/λ ≤ 16.5 |
| | 72.5 ≤ hs/λ < 77.5 | −62.5 ≤ θ ≤ −57.5 | 14 ≤ hm/λ ≤ 15.7 |
| | 72.5 ≤ hs/λ < 77.5 | −57.5 ≤ θ ≤ −52.5 | 14 ≤ hm/λ ≤ 15.1 |
| | 72.5 ≤ hs/λ < 77.5 | −52.5 ≤ θ ≤ −50 | 14 ≤ hm/λ ≤ 14.4 |
| | 77.5 ≤ hs/λ < 82.5 | −90 ≤ θ ≤ −87.5 | 30.2 ≤ hm/λ ≤ 77 |

TABLE 8-continued

| Metal for the first metal film | Thickness hs/λ (%) of the dielectric film | θ (°) of the Euler angles | Thickness hm/λ (%) of the first metal film |
|---|---|---|---|
| | 77.5 ≤ hs/λ < 82.5 | −87.5 ≤ θ ≤ −82.5 | 22.4 ≤ hm/λ ≤ 77 |
| | 77.5 ≤ hs/λ < 82.5 | −82.5 ≤ θ ≤ −77.5 | 19.7 ≤ hm/λ ≤ 77 |
| | 77.5 ≤ hs/λ < 82.5 | −77.5 ≤ θ ≤ −72.5 | 65.7 ≤ hm/λ ≤ 77 |
| | 77.5 ≤ hs/λ < 82.5 | −77.5 ≤ θ ≤ −72.5 | 18.5 ≤ hm/λ ≤ 30.3 |
| | 77.5 ≤ hs/λ < 82.5 | −77.5 ≤ θ ≤ −72.5 | 15.2 ≤ hm/λ ≤ 17.5 |
| | 77.5 ≤ hs/λ < 82.5 | −72.5 ≤ θ ≤ −67.5 | 14 ≤ hm/λ ≤ 17.9 |
| | 77.5 ≤ hs/λ < 82.5 | −67.5 ≤ θ ≤ −62.5 | 14 ≤ hm/λ ≤ 17.5 |
| | 77.5 ≤ hs/λ < 82.5 | −62.5 ≤ θ ≤ −57.5 | 14 ≤ hm/λ ≤ 16.7 |
| | 77.5 ≤ hs/λ < 82.5 | −57.5 ≤ θ ≤ −52.5 | 14 ≤ hm/λ ≤ 16.1 |
| | 77.5 ≤ hs/λ < 82.5 | −52.5 ≤ θ ≤ −47.5 | 14 ≤ hm/λ ≤ 15.5 |
| | 77.5 ≤ hs/λ < 82.5 | −47.5 ≤ θ ≤ −45 | 14 ≤ hm/λ ≤ 14.7 |

TABLE 9

| Metal for the first metal film | Thickness hs/λ (%) of the dielectric film | θ (°) of the Euler angles | Thickness hm/λ (%) of the first metal film |
|---|---|---|---|
| Mo | 82.5 ≤ hs/λ < 87.5 | −90 ≤ θ ≤ −87.5 | 30.3 ≤ hm/λ ≤ 82 |
| | 82.5 ≤ hs/λ < 87.5 | −87.5 ≤ θ ≤ −82.5 | 22 ≤ hm/λ ≤ 82 |
| | 82.5 ≤ hs/λ < 87.5 | −82.5 ≤ θ ≤ −77.5 | 18.7 ≤ hm/λ ≤ 82 |
| | 82.5 ≤ hs/λ < 87.5 | −77.5 ≤ θ ≤ −72.5 | 69 ≤ hm/λ ≤ 82 |
| | 82.5 ≤ hs/λ < 87.5 | −77.5 ≤ θ ≤ −72.5 | 18 ≤ hm/λ ≤ 30.1 |
| | 82.5 ≤ hs/λ < 87.5 | −77.5 ≤ θ ≤ −72.5 | 15 ≤ hm/λ ≤ 17 |
| | 82.5 ≤ hs/λ < 87.5 | −72.5 ≤ θ ≤ −67.5 | 14 ≤ hm/λ ≤ 16.9 |
| | 82.5 ≤ hs/λ < 87.5 | −67.5 ≤ θ ≤ −62.5 | 14 ≤ hm/λ ≤ 16.9 |
| | 82.5 ≤ hs/λ < 87.5 | −62.5 ≤ θ ≤ −57.5 | 14 ≤ hm/λ ≤ 16.2 |
| | 82.5 ≤ hs/λ < 87.5 | −57.5 ≤ θ ≤ −52.5 | 14 ≤ hm/λ ≤ 15.5 |
| | 82.5 ≤ hs/λ < 87.5 | −52.5 ≤ θ ≤ −47.5 | 14 ≤ hm/λ ≤ 14.9 |
| | 82.5 ≤ hs/λ < 87.5 | −47.5 ≤ θ ≤ −45 | 14 ≤ hm/λ ≤ 14.1 |
| | 87.5 ≤ hs/λ < 92.5 | −90 ≤ θ ≤ −87.5 | 30.2 ≤ hm/λ ≤ 87 |
| | 87.5 ≤ hs/λ < 92.5 | −87.5 ≤ θ ≤ −82.5 | 21.7 ≤ hm/λ ≤ 87 |
| | 87.5 ≤ hs/λ < 92.5 | −82.5 ≤ θ ≤ −77.5 | 18.3 ≤ hm/λ ≤ 87 |
| | 87.5 ≤ hs/λ < 92.5 | −77.5 ≤ θ ≤ −72.5 | 72.2 ≤ hm/λ ≤ 87 |
| | 87.5 ≤ hs/λ < 92.5 | −77.5 ≤ θ ≤ −72.5 | 17.5 ≤ hm/λ ≤ 29.8 |
| | 87.5 ≤ hs/λ < 92.5 | −77.5 ≤ θ ≤ −72.5 | 15.8 ≤ hm/λ ≤ 16.2 |
| | 87.5 ≤ hs/λ < 92.5 | −72.5 ≤ θ ≤ −67.5 | 14 ≤ hm/λ ≤ 16.5 |
| | 87.5 ≤ hs/λ < 92.5 | −67.5 ≤ θ ≤ −62.5 | 14 ≤ hm/λ ≤ 16.4 |
| | 87.5 ≤ hs/λ < 92.5 | −62.5 ≤ θ ≤ −57.5 | 14 ≤ hm/λ ≤ 15.7 |
| | 87.5 ≤ hs/λ < 92.5 | −57.5 ≤ θ ≤ −52.5 | 14 ≤ hm/λ ≤ 15 |
| | 87.5 ≤ hs/λ < 92.5 | −52.5 ≤ θ ≤ −50 | 14 ≤ hm/λ ≤ 14.4 |
| | 92.5 ≤ hs/λ ≤ 97.5 | −90 ≤ θ ≤ −87.5 | 30 ≤ hm/λ ≤ 92 |
| | 92.5 ≤ hs/λ ≤ 97.5 | −87.5 ≤ θ ≤ −82.5 | 21.4 ≤ hm/λ ≤ 92 |
| | 92.5 ≤ hs/λ ≤ 97.5 | −82.5 ≤ θ ≤ −77.5 | 18 ≤ hm/λ ≤ 92 |
| | 92.5 ≤ hs/λ ≤ 97.5 | −77.5 ≤ θ ≤ −72.5 | 75.4 ≤ hm/λ ≤ 92 |
| | 92.5 ≤ hs/λ ≤ 97.5 | −77.5 ≤ θ ≤ −72.5 | 17 ≤ hm/λ ≤ 29.5 |
| | 92.5 ≤ hs/λ ≤ 97.5 | −77.5 ≤ θ ≤ −72.5 | 14 ≤ hm/λ ≤ 16.7 |
| | 92.5 ≤ hs/λ ≤ 97.5 | −72.5 ≤ θ ≤ −67.5 | 14 ≤ hm/λ ≤ 16 |
| | 92.5 ≤ hs/λ ≤ 97.5 | −67.5 ≤ θ ≤ −62.5 | 14 ≤ hm/λ ≤ 15.4 |
| | 92.5 ≤ hs/λ ≤ 97.5 | −62.5 ≤ θ ≤ −57.5 | 14 ≤ hm/λ ≤ 14.6 |
| | 92.5 ≤ hs/λ ≤ 97.5 | −57.5 ≤ θ ≤ −55 | 14 ≤ hm/λ ≤ 14.1 |

An elastic wave device according to a preferred embodiment of the present invention includes an intermediate film made of a dielectric material between the piezoelectric substrate and the IDT electrodes. This enables the elastic wave device to be customized in terms of electromechanical coupling coefficient, and therefore, in terms of fractional bandwidth, with reduced unwanted waves.

In an elastic wave device according to a preferred embodiment of the present invention, the IDT electrodes include a second metal film having higher electrical conductivity than the first metal film. When the piezoelectric substrate side of the IDT electrodes is defined as the lower side and an opposite side is defined as the higher side, the first metal film is higher than the second metal film. This further reduces the impact of the thickness of the first dielectric film on the fractional bandwidth of unwanted waves.

In an elastic wave device according to a preferred embodiment of the f the present invention, a second dielectric film is provided on the first dielectric film. This makes the device easy to customize in terms of frequency.

In an elastic wave device according to a preferred embodiment of the present invention, the device uses shear horizontal (SH) waves. This makes a preferred embodiment of the present invention particularly advantageous.

The preferred embodiments of present invention each provide an elastic wave device that is able to be reduced in size while reducing unwanted waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings to make the present invention clearly understood.

It is to be noted that the preferred embodiments set forth herein are illustrative and partial replacement or combination of the configurations between different preferred embodiments is possible.

Figure 1:
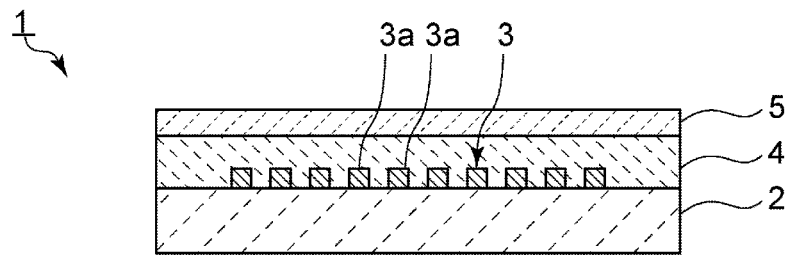
FIG. 1 is a front cross-sectional view of an elastic wave device according to a Preferred Embodiment 1 of the present invention.
Figure 2:
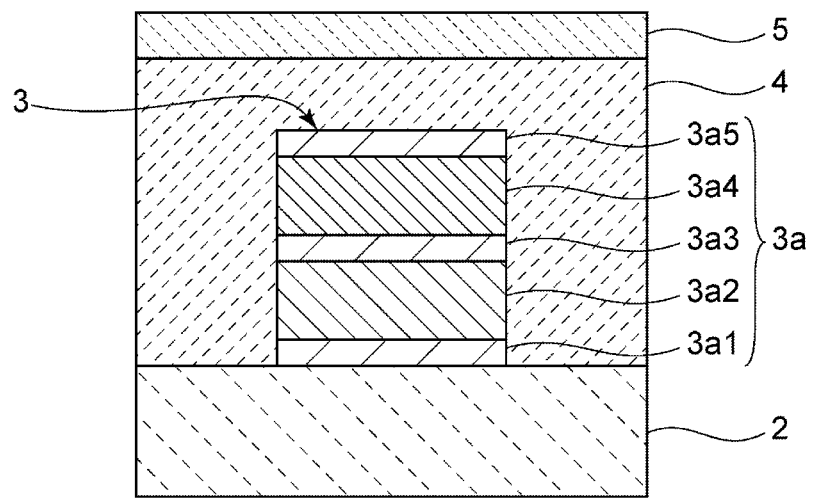
FIG. 2 is an enlarged front cross-sectional view of a finger of an IDT electrode in the Preferred Embodiment 1 of the present invention.

FIG. 1 is a front cross-sectional view of an elastic wave device according to a Preferred Embodiment 1 of the present invention. FIG. 2 is an enlarged front cross-sectional view of a finger of an IDT electrode in the Preferred Embodiment 1.

The elastic wave device 1 illustrated in FIG. 1 preferably uses shear horizontal (SH) waves, and Rayleigh waves are unwanted waves. The elastic wave device 1 includes a piezoelectric substrate 2 preferably made of $LiNbO_3$, for example. The Euler angles ($\phi$, $\theta$, $\psi$) of the piezoelectric substrate 2 are preferably Euler angles (0°, $-90° \leq \theta \leq -70°$, 0°), for example.

Interdigital transducer (IDT) electrodes 3 are provided on the piezoelectric substrate 2. The IDT electrodes 3 include multiple fingers 3a. On the piezoelectric substrate 2, a first dielectric film 4 covers the IDT electrodes 3. In the present preferred embodiment, the first dielectric film 4 is made of $SiO_2$.

The material for the first dielectric film 4 may alternatively be a silicon oxide other than $SiO_2$. The silicon oxide does not need to be $SiO_2$ and is expressed as $SiO_x$ (x is an integer).

On the first dielectric film 4 is a second dielectric film 5. In the present preferred embodiment, the second dielectric film 5 is preferably made of SiN, for example. By including the second dielectric film 5, the device is easy to customize in terms of frequency. The material for the second dielectric film 5 does not need to be the one named above. Even if made of a material other than SiN, the second dielectric film 5 is advantageous because it improves, for example, the moisture resistance of the elastic wave device 1. The second dielectric film 5, however, is optional.

As illustrated in FIG. 2, the IDT electrodes 3 in the present preferred embodiment are preferably made from a multilayer metal film including a stack of first to fifth electrode layers 3a1 to 3a5. From the piezoelectric substrate 2 side, first to fifth electrode layers 3a1 to 3a5 are stacked in this order.

The fourth electrode layer 3a4 is the first metal film. The IDT electrodes 3 only need to include at least the fourth electrode layer 3a4 as the first metal film. The first metal film is the primary electrode in the IDT electrodes 3. The primary electrode herein is the electrode layer that is predominant in the excitation of elastic waves.

The first electrode layer 3a1 illustrated in FIG. 2 is preferably made of NiCr, for example. The first electrode layer 3a1 is an adhesive layer in the IDT electrodes 3. By including the first electrode layer 3a1, the IDT electrodes 3 firmly adhere to the piezoelectric substrate 2. The second electrode layer 3a2 is preferably made of Al, for example. The second electrode layer 3a2 is the second metal film, which has a higher electrical conductivity than the first metal film. By including the second electrode layer 3a2, the IDT electrodes 3 are highly electrically conductive. The third electrode layer 3a3 is preferably made of Ti, for example. The third electrode layer 3a3 is a diffusion barrier layer in the IDT electrodes 3. By including the third electrode layer 3a3, the IDT electrodes 3 are unlikely to be degraded in electrical characteristics because the electrode layer reduces interdiffusion between the second and fourth electrode layers 3a2 and 3a4.

The fourth electrode layer 3a4 is preferably made of one metal selected from Pt, Cu, Mo, Au, W, and Ta, for example. Here, when the wavelength, determined by the finger pitch of the IDT electrodes 3, is denoted by $\lambda$, and the thickness of the fourth electrode layer 3a4 normalized by the wavelength $\lambda$ is denoted by hm/$\lambda$ (%), the metal for and the thickness hm/$\lambda$ (%) of the fourth electrode layer 3a4 match any of the combinations listed in Table 10 below. That is, if the fourth electrode layer 3a4 is made of Pt, the thickness hm/$\lambda$ (%) is about 6.5% or more and about 25% or less. If the fourth electrode layer 3a4 is made of Cu, the thickness hm/$\lambda$ (%) is about 13% or more and about 25% or less. If the fourth electrode layer 3a4 is made of Mo, the thickness hm/$\lambda$ (%) is about 15.5% or more and about 25% or less. If the fourth electrode layer 3a4 is made of Au, the thickness hm/$\lambda$ (%) is about 6.5% or more and about 25% or less. If the fourth electrode layer 3a4 is made of W, the thickness hm/$\lambda$ (%) is about 7.5% or more and about 25% or less. If the fourth electrode layer 3a4 is made of Ta, the thickness hm/$\lambda$ (%) is about 7% or more and about 25% or less.

TABLE 10

| Metal for the first metal film | Thickness hm/$\lambda$ (%) of the first metal film |
| --- | --- |
| Pt | 6.5 ≤ hm/$\lambda$ ≤ 25 |
| Cu | 13 ≤ hm/$\lambda$ ≤ 25 |
| Mo | 15.5 ≤ hm/$\lambda$ ≤ 25 |
| Au | 6.5 ≤ hm/$\lambda$ ≤ 25 |
| W | 7.5 ≤ hm/$\lambda$ ≤ 25 |
| Ta | 7 ≤ hm/$\lambda$ ≤ 25 |

The fifth electrode layer 3a5 is preferably made of Ti, for example. The fifth electrode layer 3a5 is a protective layer. By virtue of having the fifth electrode layer 3a5, the IDT electrodes 3 are highly resistant to, for example, moisture.

In the present preferred embodiment, 1) the Euler angles ($\phi$, $\theta$, $\psi$) of the piezoelectric substrate 2 are preferably Euler angles (0°, $-90° \leq \theta \leq -70°$, 0°), for example, and 2) the metal for and the thickness hm/$\lambda$ (%) of the first metal film, in the IDT electrodes 3 match any of the combinations listed in Table 10. These enable an elastic wave device to be smaller with reduced unwanted waves. The following explains this, taking as an example a case in which the first metal film is made of Pt.

Figure 3:
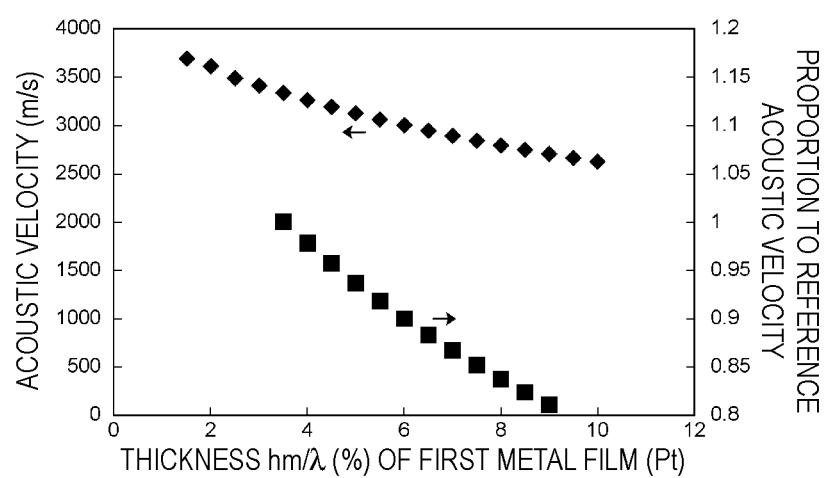
FIG. 3 illustrates the relationship between the thickness of a first metal film made of Pt and acoustic velocity.

FIG. 3 illustrates the relationship between the thickness of a first metal film made of Pt and acoustic velocity. In FIG. 3, the diamonds represent acoustic velocity, and the squares represent their proportions, relative to a reference acoustic velocity. The reference acoustic velocity on the right-hand axis in FIG. 3 is the acoustic velocity when the thickness of the first metal film is about 3.5%.

As seen in FIG. 3, the acoustic velocity decreases with increasing thickness of the first metal film. When the acoustic velocity is denoted by V, and the frequency is denoted by f, V=f$\lambda$. When the frequency f of the elastic waves used by the elastic wave device is assumed to be constant, thickening the first metal film, and thus reducing the acoustic velocity V, makes the wavelength $\lambda$ accordingly smaller, thus enabling a smaller finger pitch of the IDT electrodes. In the Preferred Embodiment 1, the first metal film, if made of Pt, has a thickness of about 6.5% or more, and the acoustic velocity is low. This means the IDT electrodes is able to be made smaller by narrowing their finger pitch, and, as a result, the elastic wave device is able to be reduced in size.

For example, in the related art, the thickness of the first metal film may be approximately 3.5%. As shown in FIG. 3, when the thickness of the first metal film is about 6.5%, the proportion of the acoustic velocity relative to the reference acoustic velocity, which is the acoustic velocity when the thickness of the first metal film is about 3.5%, is about 0.88. This means elastic wave devices according to the Preferred Embodiment 1 are able to be greatly reduced in size, by about 12% or more, in comparison with those in the related art.

In the Preferred Embodiment 1, moreover, the thickness of the first metal film is preferably about 25% or less. This ensures high productivity.

Figure 4:
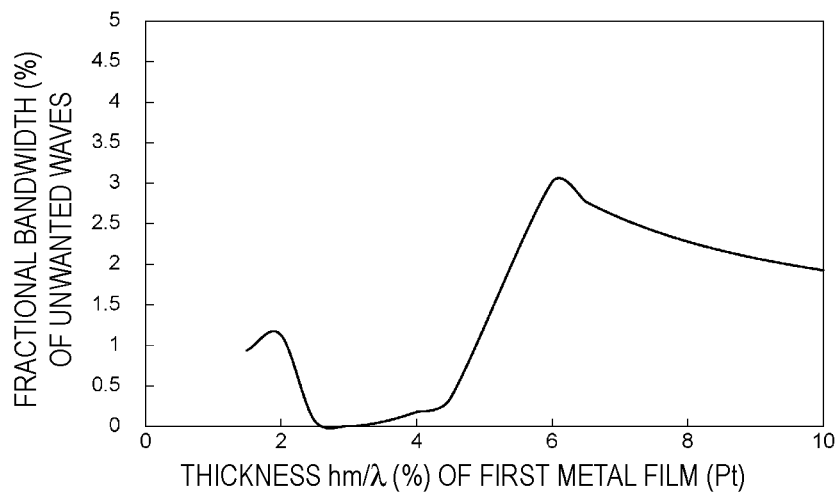
FIG. 4 illustrates the relationship between the thickness of a first metal film made of Pt and the fractional bandwidth of unwanted waves in a Comparative Example 1.

Thickening a metal film in IDT electrodes, however, may increase the fractional bandwidth of unwanted waves. The following explains this using a Comparative Example 1. The Comparative Example 1 is different from the Preferred Embodiment 1 in that the Euler angles ($\phi$, $\theta$, $\psi$) of the piezoelectric substrate are Euler angles (0°, −10°, 0°). FIG. 4, described below, presents the results for a configuration of the Comparative Example 1 in which the first metal film is made of Pt.

FIG. 4 illustrates the relationship between the thickness of the first metal film made of Pt and the fractional bandwidth of unwanted waves in the Comparative Example 1. The unwanted waves mentioned in FIG. 4 are Rayleigh waves. The same applies to FIG. 5, described hereinafter, and the subsequent drawings.

As shown in FIG. 4, in the Comparative Example 1, the fractional bandwidth of unwanted waves increases once the thickness of the first metal film exceeds approximately 3.5%.

In the Preferred Embodiment 1, the Euler angles ($\phi$, $\theta$, $\psi$) of the piezoelectric substrate are preferably Euler angles (0°, $-90° \leq \theta \leq -70°$, 0°). This ensures a small fractional bandwidth of unwanted waves. The following explains this by comparing Preferred the Embodiment 1 and a Comparative Example 2 in FIG. 5, described hereinafter. The Comparative Example 2 is different from the Preferred Embodiment 1 in that the first metal film, if made of Pt, has a thickness of less than about 6.5%. The results presented in FIG. 5 assume that the Euler angles ($\phi$, $\theta$, $\psi$) of the piezoelectric substrate are Euler angles (0°, −85°, 0°). It should be noted that the following also describes comparisons made with varying thicknesses of the first dielectric film.

Figure 5:
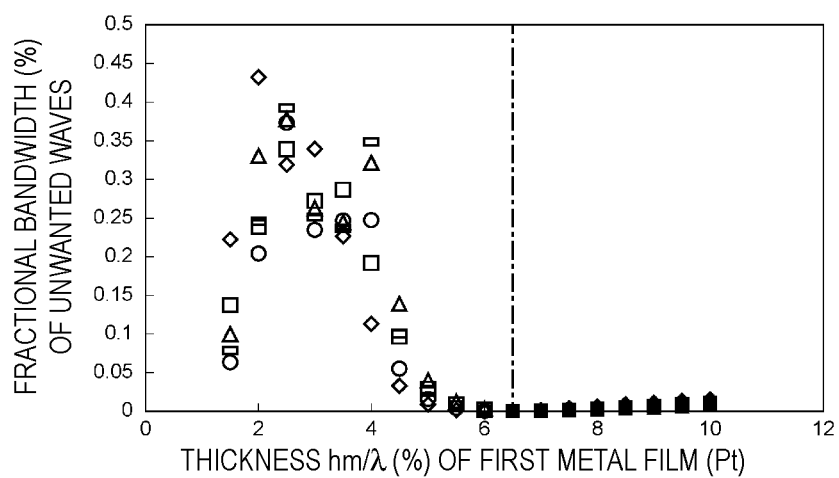
FIG. 5 illustrates the relationship between the thickness of a first metal film made of Pt and the fractional bandwidth of unwanted waves in the Preferred Embodiment 1 of the present invention and a Comparative Example 2, with varying thickness of the first dielectric film.

FIG. 5 illustrates the relationship between the thickness of a first metal film made of Pt and the fractional bandwidth of unwanted waves in the Preferred Embodiment 1 and the Comparative Example 2, with varying thicknesses of the first dielectric film.

In FIG. 5, the solid diamonds represent the results obtained with a thickness of the first dielectric film of about 22.5% in the Preferred Embodiment 1. The solid squares represent the results obtained with a thickness of the first dielectric film of about 27.5% in the Preferred Embodiment 1. The solid triangles represent the results obtained with a thickness of the first dielectric film of about 32.5% in the Preferred Embodiment 1. The solid rectangles represent the results obtained with a thickness of the first dielectric film of about 37.5% in the Preferred Embodiment 1. The solid circles represent the results obtained with a thickness of the first dielectric film of about 42.5% in the Preferred Embodiment 1. The open diamonds represent the results obtained with a thickness of the first dielectric film of about 22.5% in the Comparative Example 2. The open squares represent the results obtained with a thickness of the first dielectric film of about 27.5% in the Comparative Example 2. The open triangles represent the results obtained with a thickness of the first dielectric film of about 32.5% in the Comparative Example 2. The open rectangles represent the results obtained with a thickness of the first dielectric film of about 37.5% in the Comparative Example 2. The open circles represent the results obtained with a thickness of the first dielectric film of about 42.5% in the Comparative Example 2.

As seen in FIG. 5, the Comparative Example 2 results in a large fractional bandwidth of unwanted waves, even with varying thicknesses of the first dielectric film. By contrast, the Preferred Embodiment 1 reduces the fractional bandwidth of unwanted waves effectively, regardless of the thickness of the first dielectric film.

In the Comparative Example 2, incidentally, it is difficult to greatly reduce the size of the elastic wave device because the first metal film is thin. In the configuration of the Comparative Example 1 in FIG. 4, as well, it is difficult to reduce the size of the elastic wave device. As shown in FIG. 3, for example, the Preferred Embodiment 1 enables the elastic wave device to be greatly reduced in size, by about 12% or more, in comparison with the case of a first metal film having a thickness of approximately 3.5% in the Comparative Example 1, in which unwanted waves are limited. In this manner, the Preferred Embodiment 1 enables elastic wave devices to be reduced in size with reduced unwanted waves.

The following describes configurations of the Preferred Embodiment 1 in which the first metal film is preferably made of a metal other than Pt, i.e., one metal selected from Cu, Mo, Au, W, and Ta. Each configuration of the Comparative Example 1 described below is the same or substantially the same as that of the Comparative Example 1 in FIG. 4 except for the first metal film. Each configuration of the Comparative Example 2 described below is the same or substantially the same as that of the Comparative Example 2 in FIG. 5 except for the first metal film.

Figure 6:
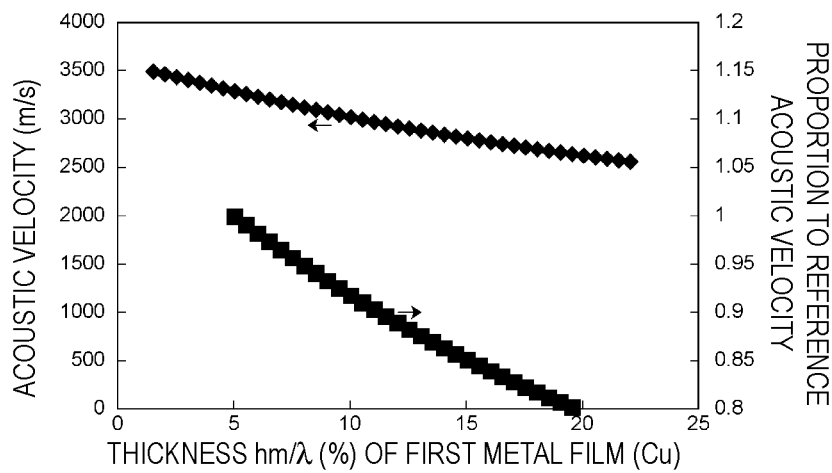
FIG. 6 illustrates the relationship between the thickness of a first metal film made of Cu and acoustic velocity.
Figure 7:
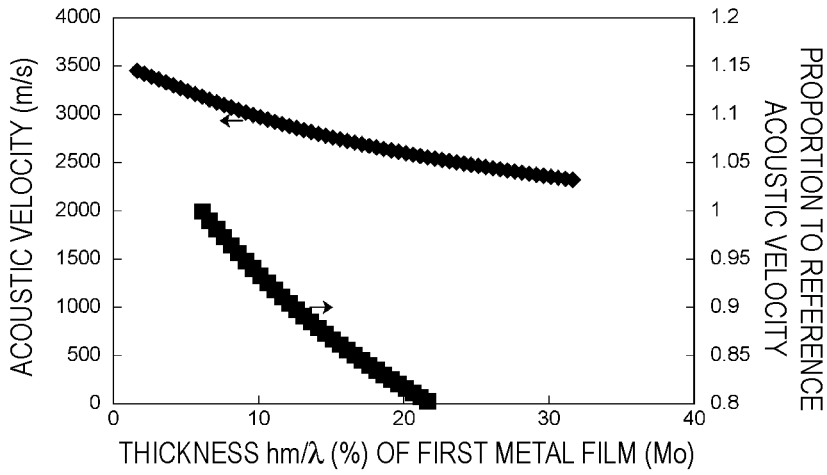
FIG. 7 illustrates the relationship between the thickness of a first metal film made of Mo and acoustic velocity.
Figure 8:
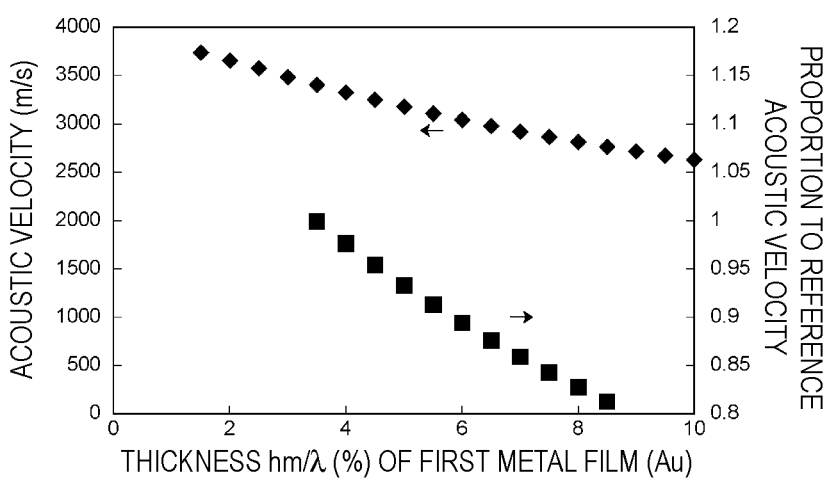
FIG. 8 illustrates the relationship between the thickness of a first metal film made of Au and acoustic velocity.
Figure 9:
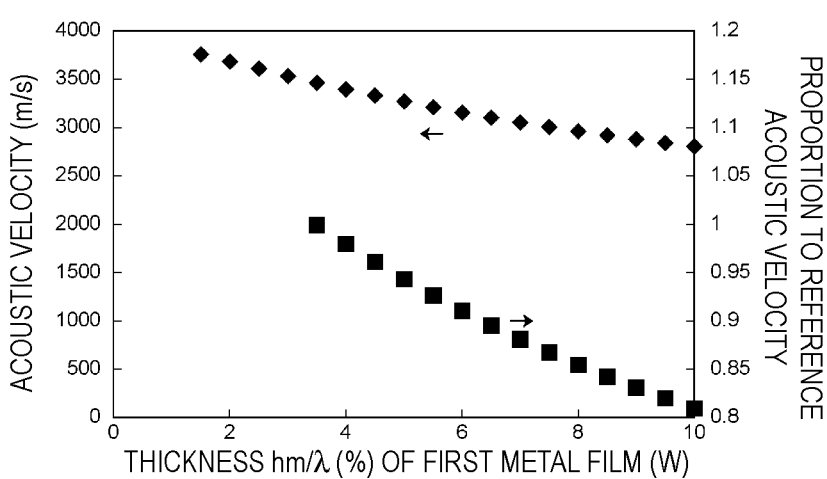
FIG. 9 illustrates the relationship between the thickness of a first metal film made of W and acoustic velocity.
Figure 10:
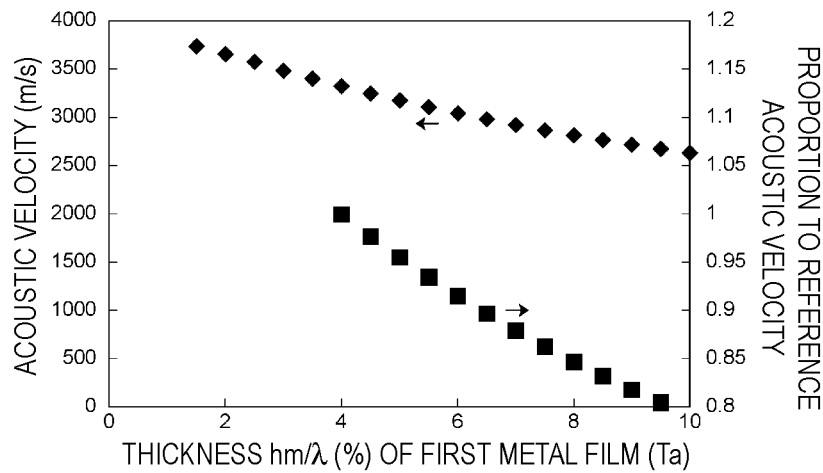
FIG. 10 illustrates the relationship between the thickness of a first metal film made of Ta and acoustic velocity.

FIG. 6 illustrates the relationship between the thickness of a first metal film made of Cu and acoustic velocity. The reference acoustic velocity on the right-hand axis in FIG. 6 is the acoustic velocity when the thickness of the first metal film is about 5%. FIG. 7 illustrates the relationship between the thickness of a first metal film made of Mo and acoustic velocity. The reference acoustic velocity on the right-hand axis in FIG. 7 is the acoustic velocity when the thickness of the first metal film is about 6%. FIG. 8 illustrates the relationship between the thickness of a first metal film made of Au and acoustic velocity. The reference acoustic velocity on the right-hand axis in FIG. 8 is the acoustic velocity when the thickness of the first metal film is about 3.5%. FIG. 9 illustrates the relationship between the thickness of a first metal film made of W and acoustic velocity. The reference acoustic velocity on the right-hand axis in FIG. 9 is the acoustic velocity when the thickness of the first metal film is about 3.5%. FIG. 10 illustrates the relationship between the thickness of a first metal film made of Ta and acoustic velocity. The reference acoustic velocity on the right-hand axis in FIG. 10 is the acoustic velocity when the thickness of the first metal film is about 4%. In FIGS. 6 to 10, the diamonds represent acoustic velocity, and the squares represent their proportions, relative to the reference acoustic velocity.

As seen in FIGS. 6 to 10, the acoustic velocity decreases with increasing thicknesses of the first metal film even if the first metal film is made of one metal selected from Cu, Mo, Au, W, and Ta. Even in such cases, therefore, the elastic wave device is able to be made smaller with increasing thickness of the first metal film as in the case in which the first metal film is made of Pt.

Figure 11:
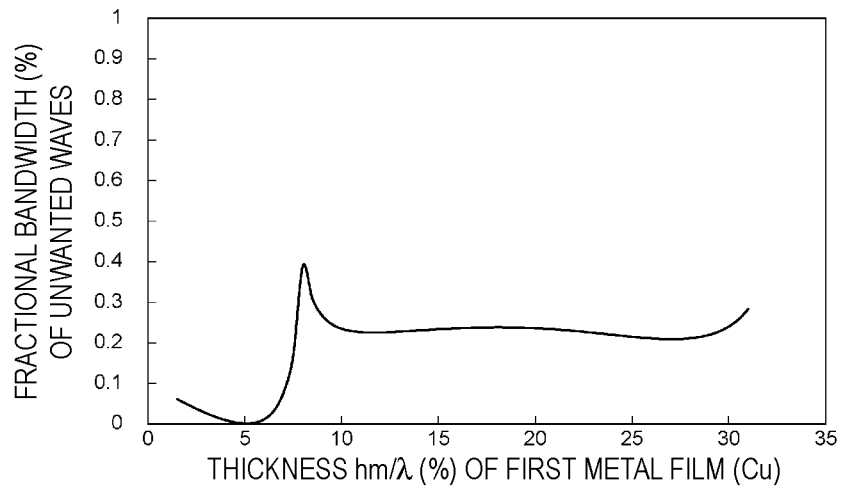
FIG. 11 illustrates the relationship between the thickness of a first metal film made of Cu and the fractional bandwidth of unwanted waves in the Comparative Example 1.
Figure 12:
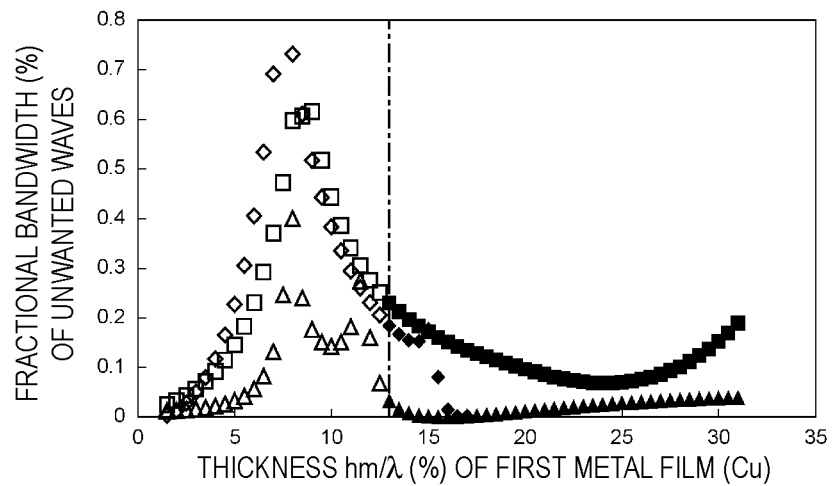
FIG. 12 illustrates the relationship between the thickness of a first metal film made of Cu and the fractional bandwidth of unwanted waves in the Preferred Embodiment 1 of the present invention and the Comparative Example 2, with varying thickness of the first dielectric film.

FIG. 11 illustrates the relationship between the thickness of a first metal film made of Cu and the fractional bandwidth of unwanted waves in the Comparative Example 1. FIG. 12 illustrates the relationship between the thickness of a first metal film made of Cu and the fractional bandwidth of unwanted waves in the Preferred Embodiment 1 and the Comparative Example 2, with varying thicknesses of the first dielectric film.

In FIG. 12, the solid diamonds represent the results obtained with a thickness of the first dielectric film of about 22.5% in the Preferred Embodiment 1. The solid squares represent the results obtained with a thickness of the first dielectric film of about 42.5% in the Preferred Embodiment 1. The solid triangles represent the results obtained with a thickness of the first dielectric film of about 82.5% in the Preferred Embodiment 1. The open diamonds represent the results obtained with a thickness of the first dielectric film of about 22.5% in the Comparative Example 2. The open squares represent the results obtained with a thickness of the first dielectric film of about 42.5% in the Comparative Example 2. The open triangles represent the results obtained with a thickness of the first dielectric film of about 82.5% in the Comparative Example 2. The same applies to FIGS. 14, 16, 18, and 20, which are described hereinafter.

As shown in FIG. 11, in the Comparative Example 1, the fractional bandwidth of unwanted waves increases once the thickness of the first metal film exceeds approximately 5%. In the Comparative Example 1, therefore, it is difficult to reduce the size of the elastic wave device while limiting unwanted waves. In the Preferred Embodiment 1, the elastic wave device is able to be greatly reduced in size because the thickness of the first metal film is about 13% or more.

Moreover, as shown in FIG. 12, the Preferred Embodiment 1 ensures a small fractional bandwidth of unwanted waves. If the manufacturer wants to make the fractional bandwidth of unwanted waves small in the Comparative Example 2, it is difficult to reduce the size of the elastic wave device because the first metal film needs to have a thickness of approximately 6% or less. In this manner, the Preferred Embodiment 1 enables elastic wave devices to be reduced in size with reduced unwanted waves, even if the first metal film is made of Cu.

Figure 13:
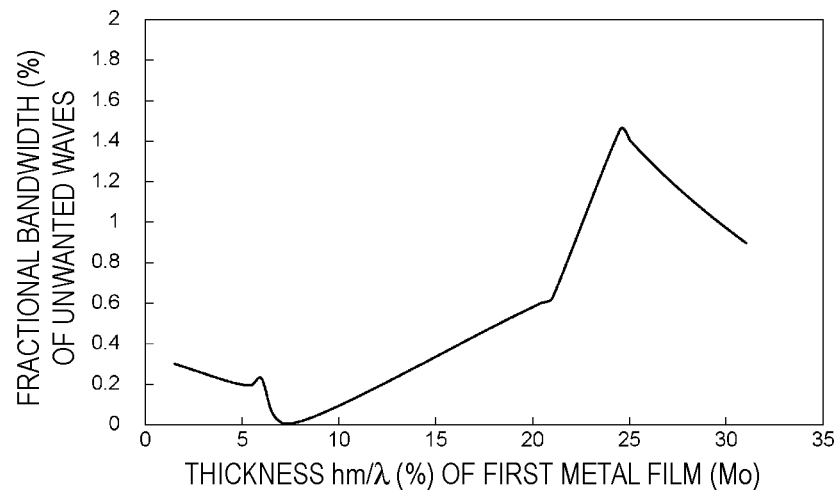
FIG. 13 illustrates the relationship between the thickness of a first metal film made of Mo and the fractional bandwidth of unwanted waves in the Comparative Example 1 of the present invention.
Figure 14:
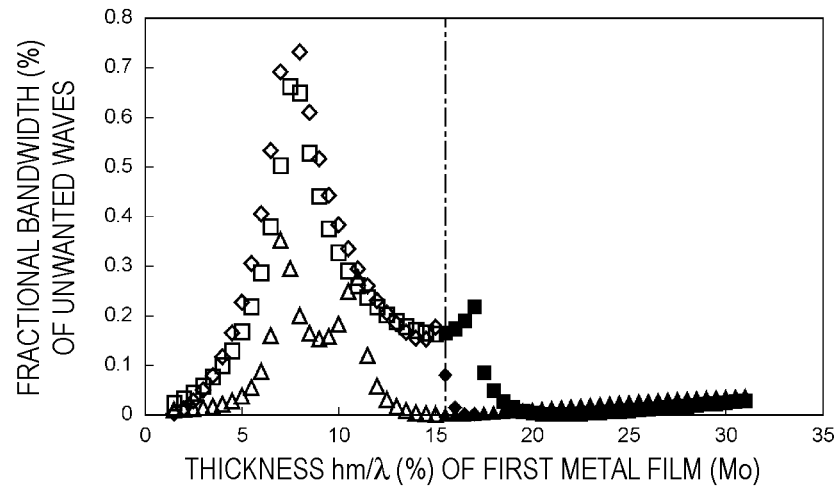
FIG. 14 illustrates the relationship between the thickness of a first metal film made of Mo and the fractional bandwidth of unwanted waves in the Preferred Embodiment 1 of the present invention and the Comparative Example 2, with varying thickness of the first dielectric film.

FIG. 13 illustrates the relationship between the thickness of a first metal film made of Mo and the fractional bandwidth of unwanted waves in the Comparative Example 1. FIG. 14 illustrates the relationship between the thickness of a first metal film made of Mo and the fractional bandwidth of unwanted waves in the Preferred Embodiment 1 and Comparative Example 2, with varying thicknesses of the first dielectric film.

As shown in FIG. 13, in the Comparative Example 1, the fractional bandwidth of unwanted waves increases once the thickness of the first metal film exceeds approximately 6%. In the Comparative Example 1, therefore, it is difficult to reduce the size of the elastic wave device while reducing unwanted waves. In the Preferred Embodiment 1, the elastic wave device is able to be greatly reduced greatly in size because the thickness of the first metal film is about 15.5% or more.

Moreover, as shown in FIG. 14, the Preferred Embodiment 1 ensures a small fractional bandwidth of unwanted waves. If the manufacturer wants to make the fractional bandwidth of unwanted waves small in the Comparative Example 2, it is difficult to reduce the size of the elastic wave device because the first metal film needs to have a thickness of approximately 5.5% or less. In this manner, the Preferred Embodiment 1 enables elastic wave devices to be reduced in size with reduced unwanted waves, even if the first metal film is made of Mo.

Figure 15:
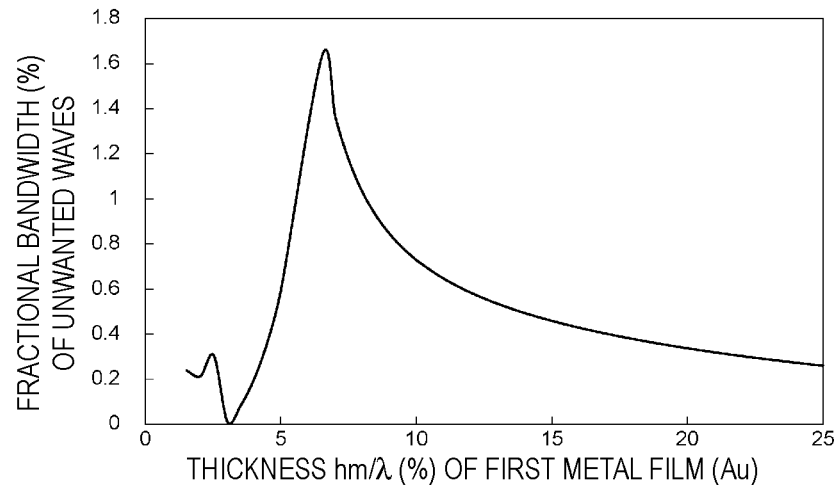
FIG. 15 illustrates the relationship between the thickness of a first metal film made of Au and the fractional bandwidth of unwanted waves in the Comparative Example 1 of the present invention.
Figure 16:
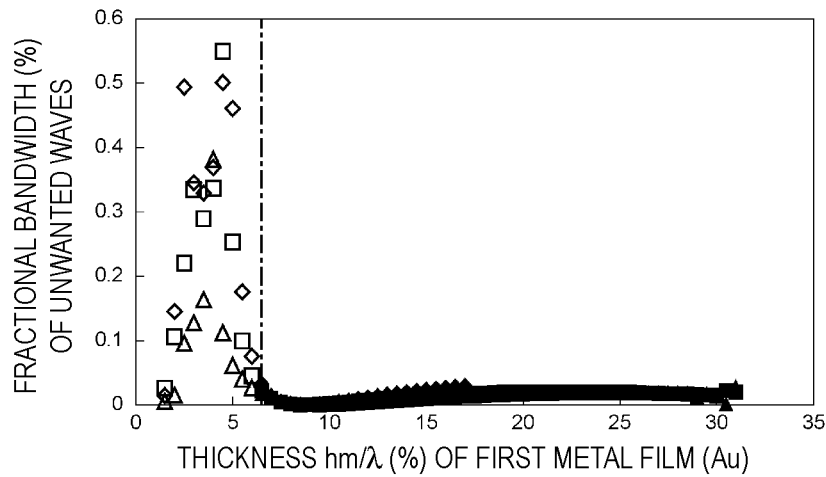
FIG. 16 illustrates the relationship between the thickness of a first metal film made of Au and the fractional bandwidth of unwanted waves in the Preferred Embodiment 1 of the present invention and the Comparative Example 2, with varying thickness of the first dielectric film.

FIG. 15 illustrates the relationship between the thickness of a first metal film made of Au and the fractional bandwidth of unwanted waves in the Comparative Example 1. FIG. 16 illustrates the relationship between the thickness of a first metal film made of Au and the fractional bandwidth of unwanted waves in the Preferred Embodiment 1 and the Comparative Example 2, with varying thicknesses of the first dielectric film.

As shown in FIG. 15, in the Comparative Example 1, the fractional bandwidth of unwanted waves increases once the thickness of the first metal film exceeds approximately 3.5%. In Comparative Example 1, therefore, it is difficult to reduce the size of the elastic wave device while reducing unwanted waves. In the Preferred Embodiment 1, the elastic wave device is able to be greatly reduced in size because the thickness of the first metal film is about 6.5% or more.

Moreover, as shown in FIG. 16, the Preferred Embodiment ensures a small fractional bandwidth of unwanted waves in comparison with the Comparative Example 2. In this manner, the Preferred Embodiment 1 enables elastic wave devices to be reduced in size with reduced unwanted waves, even if the first metal film is made of Au.

Figure 17:
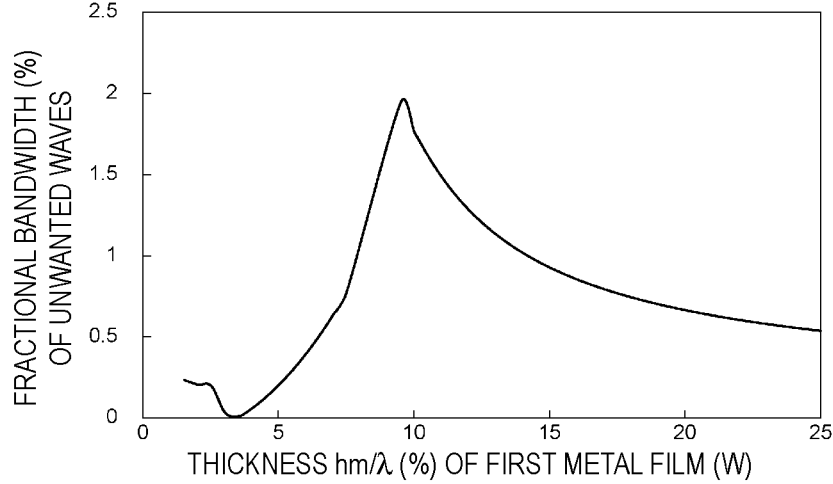
FIG. 17 illustrates the relationship between the thickness of a first metal film made of W and the fractional bandwidth of unwanted waves in the Comparative Example 1 of the present invention.
Figure 18:
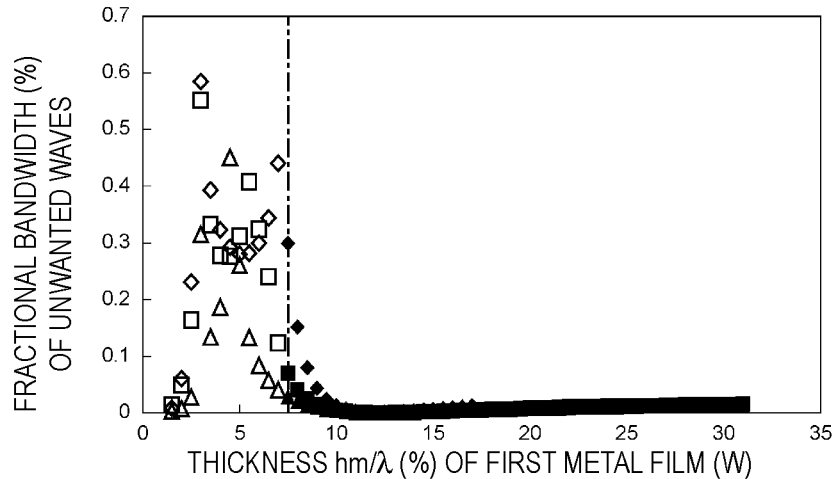
FIG. 18 illustrates the relationship between the thickness of a first metal film made of W and the fractional bandwidth of unwanted waves in the Preferred Embodiment 1 of the present invention and the Comparative Example 2, with varying thickness of the first dielectric film.

FIG. 17 illustrates the relationship between the thickness of a first metal film made of W and the fractional bandwidth of unwanted waves in the Comparative Example 1. FIG. 18 illustrates the relationship between the thickness of a first metal film made of W and the fractional bandwidth of unwanted waves in the Preferred Embodiment 1 and the Comparative Example 2, with varying thicknesses of the first dielectric film.

As shown in FIG. 17, in the Comparative Example 1, the fractional bandwidth of unwanted waves increases once the thickness of the first metal film exceeds approximately 3.5%. In the Comparative Example 1, therefore, it is difficult to reduce the size of the elastic wave device while reducing unwanted waves. In the Preferred Embodiment 1, the elastic wave device is able to be greatly reduced in size because the thickness of the first metal film is about 7.5% or more.

Moreover, as shown in FIG. 18, Preferred Embodiment 1 ensures a small fractional bandwidth of unwanted waves in comparison with the Comparative Example 2. In this manner, the Preferred Embodiment 1 enables elastic wave devices to be reduced in size with reduced unwanted waves, even if the first metal film is made of W.

Figure 19:
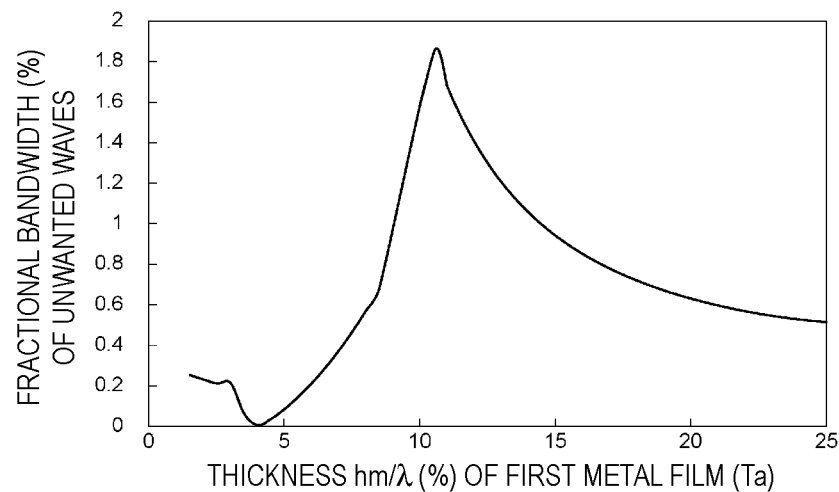
FIG. 19 illustrates the relationship between the thickness of a first metal film made of Ta and the fractional bandwidth of unwanted waves in the Comparative Example 1 of the present invention.
Figure 20:
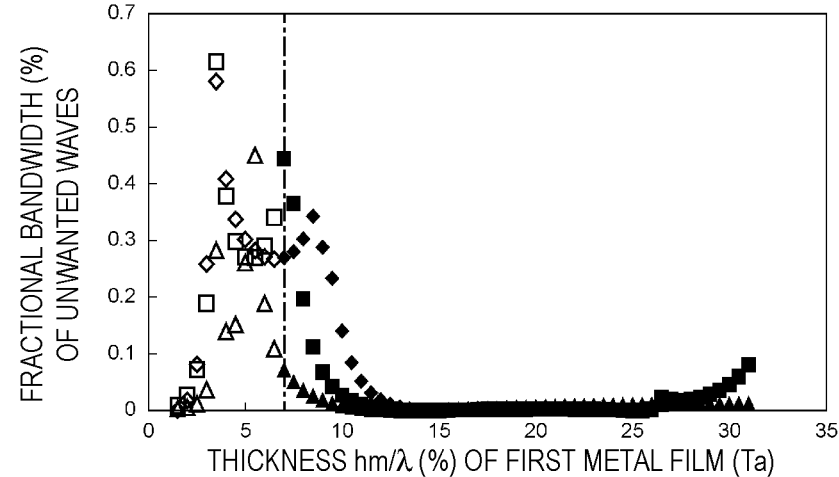
FIG. 20 illustrates the relationship between the thickness of a first metal film made of Ta and the fractional bandwidth of unwanted waves in the Preferred Embodiment 1 of the present invention and the Comparative Example 2, with varying thickness of the first dielectric film.

FIG. 19 illustrates the relationship between the thickness of a first metal film made of Ta and the fractional bandwidth of unwanted waves in the Comparative Example 1. FIG. 20 illustrates the relationship between the thickness of a first metal film made of Ta and the fractional bandwidth of unwanted waves in the Preferred Embodiment 1 and the Comparative Example 2, with varying thicknesses of the first dielectric film.

As shown in FIG. 19, in the Comparative Example 1, the fractional bandwidth of unwanted waves increases once the thickness of the first metal film exceeds approximately 4%. In the Comparative Example 1, therefore, it is difficult to reduce the size of the elastic wave device while reducing unwanted waves. In the Preferred Embodiment 1, the elastic wave device is able to be greatly reduced in size because the thickness of the first metal film is about 7% or more.

Moreover, as shown in FIG. 20, the Preferred Embodiment ensures a small fractional bandwidth of unwanted waves in comparison with the Comparative Example 2. In this manner, the Preferred Embodiment 1 enables elastic wave devices to be greatly reduced in size with reduced unwanted waves, even if the first metal film is made of Ta.

To summarize, the Preferred Embodiment 1, even with a first metal film made of a metal other than Pt, or one metal selected from Cu, Mo, Au, W, and Ta, enables elastic wave devices to be greatly reduced in size with reduced unwanted waves, as in the case in which the first metal film is made of Pt.

Moreover, even if the first metal film is made of a metal other than Pt, or one metal selected from Cu, Mo, Au, W, and Ta, productivity is high because the thickness of the first metal film is preferably about 25% or less, for example.

The present preferred embodiment offers the same advantage even if the Euler angles ($\phi$, $\theta$, $\psi$) of the piezoelectric substrate are Euler angles ($0°\pm5°$, $\theta$, $0°\pm5°$). The term $0°\pm5°$ herein means that the value falls within the range of about $0°\pm5°$.

Figure 21:
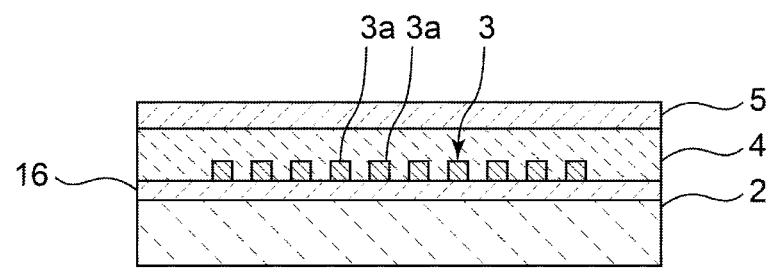
FIG. 21 is a front cross-sectional view of an elastic wave device according to a variation of the Preferred Embodiment 1 of the present invention.

FIG. 21 is a front cross-sectional view of an elastic wave device according to a variation of the Preferred Embodiment 1.

The elastic wave device of a variation of the Preferred Embodiment 1 includes an intermediate film 16 made of a dielectric material between the piezoelectric substrate 2 and the IDT electrodes 3. In this variation, the thickness of the intermediate film 16 is preferably about 10 nm, for example. This, however, is not the only possible thickness of the intermediate film 16.

Figure 22:
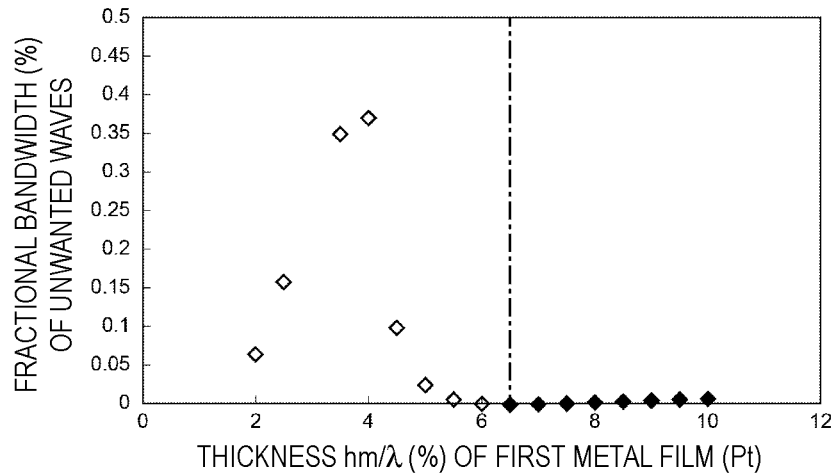
FIG. 22 illustrates the relationship between the thickness of a first metal film made of Pt and the fractional bandwidth of unwanted waves in a variation of the Preferred Embodiment 1 of the present invention and the Comparative Example 2 of the present invention.

FIG. 22 illustrates the relationship between the thickness of a first metal film made of Pt and the fractional bandwidth of unwanted waves in the variation of the Preferred Embodiment 1 and the Comparative Example 2. In FIG. 22, the solid diamonds represent the results for the variation of the Preferred Embodiment 1, and the open diamonds represent the results for the Comparative Example 2.

As shown in FIG. 22, the variation of the Preferred Embodiment 1 also limits unwanted waves. By including the intermediate film 16, an elastic wave device in this variation is able to be customized in terms of electromechanical coupling coefficient, and therefore in terms of fractional bandwidth, as well, with reduced unwanted waves.

Here, the piezoelectric substrate 2 side of the IDT electrodes 3 is defined as the lower side, and the opposite side is defined as the higher side. Referring back to FIG. 2, it is preferable that the fourth electrode layer 3a4 as the first metal film is higher than the first electrode layer 3a1 as the second metal film as in the Preferred Embodiment 1. This would further reduce the impact of the thickness of the first dielectric film 4 on the fractional bandwidth of unwanted waves.

The following describes a Preferred Embodiment 2 of the present invention.

An elastic wave device according to the Preferred Embodiment 2 is different from the Preferred Embodiment 1 in the combination of the metal for and the thickness of the first metal film in the IDT electrodes and the thickness of the first dielectric film. Except for this, the elastic wave device according to the Preferred Embodiment 2 has the same or substantially the same structure as the elastic wave device 1 according to the Preferred Embodiment 1, illustrated in FIG. 1.

To be more specific, the Euler angles ($\phi$, $\theta$, $\psi$) of the piezoelectric substrate are preferably Euler angles (0°, $-90° \leq \theta - 27.5°$, 0°), for example. The first metal film, in the IDT electrodes, is preferably made of one metal selected from Pt, Cu, and Mo, for example.

When the thickness of the first dielectric film normalized by the wavelength $\lambda$ is denoted by hs/$\lambda$ (%), the metal for and the thickness hm/$\lambda$ (%) of the first metal film, the thickness hs/$\lambda$ (%) of the first dielectric film, and $\theta$ of the Euler angles ($\phi$, $\theta$, $\psi$) of the piezoelectric substrate match any of the combinations listed in Tables 11 to 18 below.

In the Preferred Embodiment 1, described above, the thickness of the first dielectric film has little impact on the fractional bandwidth of unwanted waves. In the present preferred embodiment, each range of the thickness of the first metal film and the Euler angles ($\phi$, $\theta$, $\psi$) of the piezoelectric substrate include a value falling out of the range in the Preferred Embodiment 1, but the thickness of the first dielectric film falls within the range in Tables 11 to 18 below. This ensures that the elastic wave device is able to be reduced in size with reduced unwanted waves.

TABLE 11

| Metal for the first metal film | Thickness hs/$\lambda$ (%) of the dielectric film | $\theta$ (°) of the Euler angles | Thickness hm/$\lambda$ (%) of the first metal film |
|---|---|---|---|
| Pt | 22.5 ≤ hs/$\lambda$ < 27.5 | −85 ≤ $\theta$ ≤ −82.5 | 13 ≤ hm/$\lambda$ ≤ 18 |
|  | 22.5 ≤ hs/$\lambda$ < 27.5 | −82.5 ≤ $\theta$ ≤ −77.5 | 8.8 ≤ hm/$\lambda$ ≤ 15.7 |
|  | 22.5 ≤ hs/$\lambda$ < 27.5 | −77.5 ≤ $\theta$ ≤ −72.5 | 8 ≤ hm/$\lambda$ ≤ 12 |
|  | 22.5 ≤ hs/$\lambda$ < 27.5 | −72.5 ≤ $\theta$ ≤ −67.5 | 7.8 ≤ hm/$\lambda$ ≤ 11.5 |
|  | 22.5 ≤ hs/$\lambda$ < 27.5 | −67.5 ≤ $\theta$ ≤ −62.5 | 8 ≤ hm/$\lambda$ ≤ 11.25 |
|  | 22.5 ≤ hs/$\lambda$ < 27.5 | −62.5 ≤ $\theta$ ≤ −57.5 | 8.2 ≤ hm/$\lambda$ ≤ 11.4 |
|  | 22.5 ≤ hs/$\lambda$ < 27.5 | −57.5 ≤ $\theta$ ≤ −55 | 8.2 ≤ hm/$\lambda$ ≤ 11.4 |
|  | 27.5 ≤ hs/$\lambda$ < 32.5 | −90 ≤ $\theta$ ≤ −87.5 | 16.8 ≤ hm/$\lambda$ ≤ 17.6 |
|  | 27.5 ≤ hs/$\lambda$ < 32.5 | −87.5 ≤ $\theta$ ≤ −82.5 | 12.5 ≤ hm/$\lambda$ ≤ 19 |
|  | 27.5 ≤ hs/$\lambda$ < 32.5 | −82.5 ≤ $\theta$ ≤ −77.5 | 8.8 ≤ hm/$\lambda$ ≤ 17.2 |
|  | 27.5 ≤ hs/$\lambda$ < 32.5 | −77.5 ≤ $\theta$ ≤ −72.5 | 7.7 ≤ hm/$\lambda$ ≤ 11.5 |
|  | 27.5 ≤ hs/$\lambda$ < 32.5 | −72.5 ≤ $\theta$ ≤ −67.5 | 7.4 ≤ hm/$\lambda$ ≤ 10.8 |
|  | 27.5 ≤ hs/$\lambda$ < 32.5 | −67.5 ≤ $\theta$ ≤ −62.5 | 7.45 ≤ hm/$\lambda$ ≤ 10.5 |
|  | 27.5 ≤ hs/$\lambda$ < 32.5 | −62.5 ≤ $\theta$ ≤ −57.5 | 7.7 ≤ hm/$\lambda$ ≤ 10.5 |
|  | 27.5 ≤ hs/$\lambda$ < 32.5 | −57.5 ≤ $\theta$ ≤ −55 | 8.5 ≤ hm/$\lambda$ ≤ 10.5 |
|  | 32.5 ≤ hs/$\lambda$ < 37.5 | −90 ≤ $\theta$ ≤ −87.5 | 15.8 ≤ hm/$\lambda$ ≤ 20.4 |
|  | 32.5 ≤ hs/$\lambda$ < 37.5 | −87.5 ≤ $\theta$ ≤ −82.5 | 11.6 ≤ hm/$\lambda$ ≤ 20.6 |
|  | 32.5 ≤ hs/$\lambda$ < 37.5 | −82.5 ≤ $\theta$ ≤ −77.5 | 8.8 ≤ hm/$\lambda$ ≤ 18.25 |
|  | 32.5 ≤ hs/$\lambda$ < 37.5 | −77.5 ≤ $\theta$ ≤ −72.5 | 7.25 ≤ hm/$\lambda$ ≤ 10.4 |
|  | 32.5 ≤ hs/$\lambda$ < 37.5 | −72.5 ≤ $\theta$ ≤ −67.5 | 6.9 ≤ hm/$\lambda$ ≤ 10 |
|  | 32.5 ≤ hs/$\lambda$ < 37.5 | −67.5 ≤ $\theta$ ≤ −62.5 | 6.9 ≤ hm/$\lambda$ ≤ 9.5 |
|  | 32.5 ≤ hs/$\lambda$ < 37.5 | −62.5 ≤ $\theta$ ≤ −57.5 | 7 ≤ hm/$\lambda$ ≤ 9.4 |
|  | 32.5 ≤ hs/$\lambda$ < 37.5 | −57.5 ≤ $\theta$ ≤ −52.5 | 7.5 ≤ hm/$\lambda$ ≤ 9.4 |
|  | 32.5 ≤ hs/$\lambda$ < 37.5 | −52.5 ≤ $\theta$ ≤ −50 | 8.5 ≤ hm/$\lambda$ ≤ 9 |
|  | 37.5 ≤ hs/$\lambda$ < 42.5 | −90 ≤ $\theta$ ≤ −87.5 | 14.9 ≤ hm/$\lambda$ ≤ 20.9 |
|  | 37.5 ≤ hs/$\lambda$ < 42.5 | −87.5 ≤ $\theta$ ≤ −82.5 | 10.8 ≤ hm/$\lambda$ ≤ 20.5 |
|  | 37.5 ≤ hs/$\lambda$ < 42.5 | −82.5 ≤ $\theta$ ≤ −77.5 | 10 ≤ hm/$\lambda$ ≤ 18.8 |
|  | 37.5 ≤ hs/$\lambda$ < 42.5 | −77.5 ≤ $\theta$ ≤ −72.5 | 6.9 ≤ hm/$\lambda$ ≤ 9.6 |
|  | 37.5 ≤ hs/$\lambda$ < 42.5 | −72.5 ≤ $\theta$ ≤ −67.5 | 6.5 ≤ hm/$\lambda$ ≤ 9.2 |
|  | 37.5 ≤ hs/$\lambda$ < 42.5 | −67.5 ≤ $\theta$ ≤ −62.5 | 6.4 ≤ hm/$\lambda$ ≤ 8.75 |
|  | 37.5 ≤ hs/$\lambda$ < 42.5 | −62.5 ≤ $\theta$ ≤ −57.5 | 6.5 ≤ hm/$\lambda$ ≤ 8.5 |
|  | 37.5 ≤ hs/$\lambda$ < 42.5 | −57.5 ≤ $\theta$ ≤ −52.5 | 7 ≤ hm/$\lambda$ ≤ 8.4 |
|  | 37.5 ≤ hs/$\lambda$ < 42.5 | −52.5 ≤ $\theta$ ≤ −50 | 7.5 ≤ hm/$\lambda$ ≤ 8 |
|  | 42.5 ≤ hs/$\lambda$ < 47.5 | −90 ≤ $\theta$ ≤ −87.5 | 14.25 ≤ hm/$\lambda$ ≤ 21.1 |
|  | 42.5 ≤ hs/$\lambda$ < 47.5 | −87.5 ≤ $\theta$ ≤ −82.5 | 10.3 ≤ hm/$\lambda$ ≤ 20.8 |
|  | 42.5 ≤ hs/$\lambda$ < 47.5 | −82.5 ≤ $\theta$ ≤ −77.5 | 9 ≤ hm/$\lambda$ ≤ 19.5 |
|  | 42.5 ≤ hs/$\lambda$ < 47.5 | −77.5 ≤ $\theta$ ≤ −72.5 | 6.6 ≤ hm/$\lambda$ ≤ 8.75 |
|  | 42.5 ≤ hs/$\lambda$ < 47.5 | −72.5 ≤ $\theta$ ≤ −67.5 | 6.1 ≤ hm/$\lambda$ ≤ 8.5 |
|  | 42.5 ≤ hs/$\lambda$ < 47.5 | −67.5 ≤ $\theta$ ≤ −62.5 | 6 ≤ hm/$\lambda$ ≤ 8.1 |
|  | 42.5 ≤ hs/$\lambda$ < 47.5 | −62.5 ≤ $\theta$ ≤ −57.5 | 6 ≤ hm/$\lambda$ ≤ 7.9 |
|  | 42.5 ≤ hs/$\lambda$ < 47.5 | −57.5 ≤ $\theta$ ≤ −52.5 | 6.5 ≤ hm/$\lambda$ ≤ 7.7 |
|  | 42.5 ≤ hs/$\lambda$ < 47.5 | −52.5 ≤ $\theta$ ≤ −47.5 | 7 ≤ hm/$\lambda$ ≤ 7.5 |
|  | 42.5 ≤ hs/$\lambda$ < 47.5 | −47.5 ≤ $\theta$ ≤ −42.5 | 6.7 ≤ hm/$\lambda$ ≤ 7 |
|  | 42.5 ≤ hs/$\lambda$ < 47.5 | −42.5 ≤ $\theta$ ≤ −40 | 6.2 ≤ hm/$\lambda$ ≤ 7 |
|  | 47.5 ≤ hs/$\lambda$ < 52.5 | −90 ≤ $\theta$ ≤ −87.5 | 13.8 ≤ hm/$\lambda$ ≤ 21.2 |
|  | 47.5 ≤ hs/$\lambda$ < 52.5 | −87.5 ≤ $\theta$ ≤ −82.5 | 9.9 ≤ hm/$\lambda$ ≤ 22.1 |
|  | 47.5 ≤ hs/$\lambda$ < 52.5 | −82.5 ≤ $\theta$ ≤ −77.5 | 8.5 ≤ hm/$\lambda$ ≤ 19.5 |
|  | 47.5 ≤ hs/$\lambda$ < 52.5 | −77.5 ≤ $\theta$ ≤ −72.5 | 6.35 ≤ hm/$\lambda$ ≤ 9.6 |
|  | 47.5 ≤ hs/$\lambda$ < 52.5 | −72.5 ≤ $\theta$ ≤ −67.5 | 6 ≤ hm/$\lambda$ ≤ 8 |

TABLE 11-continued

| Metal for the first metal film | Thickness hs/λ (%) of the dielectric film | θ (°) of the Euler angles | Thickness hm/λ (%) of the first metal film |
|---|---|---|---|
| | 47.5 ≤ hs/λ < 52.5 | −67.5 ≤ θ ≤ −62.5 | 6 ≤ hm/λ ≤ 7.7 |
| | 47.5 ≤ hs/λ < 52.5 | −62.5 ≤ θ ≤ −57.5 | 6 ≤ hm/λ ≤ 7.4 |
| | 47.5 ≤ hs/λ < 52.5 | −57.5 ≤ θ ≤ −52.5 | 6 ≤ hm/λ ≤ 7.2 |
| | 47.5 ≤ hs/λ < 52.5 | −52.5 ≤ θ ≤ −47.5 | 6.5 ≤ hm/λ ≤ 7 |
| | 47.5 ≤ hs/λ < 52.5 | −47.5 ≤ θ ≤ −42.5 | 6.2 ≤ hm/λ ≤ 6.5 |
| | 47.5 ≤ hs/λ < 52.5 | −42.5 ≤ θ ≤ −40 | 6 ≤ hm/λ ≤ 6.5 |

TABLE 12

| Metal for the first metal film | Thickness hs/λ (%) of the dielectric film | θ (°) of the Euler angles | Thickness hm/λ (%) of the first metal film |
|---|---|---|---|
| Pt | 52.5 ≤ hs/λ < 57.5 | −90 ≤ θ ≤ −87.5 | 13.6 ≤ hm/λ ≤ 20 |
| | 52.5 ≤ hs/λ < 57.5 | −87.5 ≤ θ ≤ −82.5 | 9.6 ≤ hm/λ ≤ 20.1 |
| | 52.5 ≤ hs/λ < 57.5 | −82.5 ≤ θ ≤ −77.5 | 8.25 ≤ hm/λ ≤ 20.5 |
| | 52.5 ≤ hs/λ < 57.5 | −77.5 ≤ θ ≤ −72.5 | 6.2 ≤ hm/λ ≤ 9.7 |
| | 52.5 ≤ hs/λ < 57.5 | −72.5 ≤ θ ≤ −67.5 | 6 ≤ hm/λ ≤ 7.5 |
| | 52.5 ≤ hs/λ < 57.5 | −67.5 ≤ θ ≤ −62.5 | 6 ≤ hm/λ ≤ 7.3 |
| | 52.5 ≤ hs/λ < 57.5 | −62.5 ≤ θ ≤ −57.5 | 6 ≤ hm/λ ≤ 7 |
| | 52.5 ≤ hs/λ < 57.5 | −57.5 ≤ θ ≤ −52.5 | 6 ≤ hm/λ ≤ 6.7 |
| | 52.5 ≤ hs/λ < 57.5 | −52.5 ≤ θ ≤ −50 | 6 ≤ hm/λ ≤ 6.5 |
| | 57.5 ≤ hs/λ < 62.5 | −90 ≤ θ ≤ −87.5 | 13.2 ≤ hm/λ ≤ 19.7 |
| | 57.5 ≤ hs/λ < 62.5 | −87.5 ≤ θ ≤ −82.5 | 9.4 ≤ hm/λ ≤ 20 |
| | 57.5 ≤ hs/λ < 62.5 | −82.5 ≤ θ ≤ −77.5 | 8 ≤ hm/λ ≤ 20.5 |
| | 57.5 ≤ hs/λ < 62.5 | −77.5 ≤ θ ≤ −72.5 | 6 ≤ hm/λ ≤ 9.7 |
| | 57.5 ≤ hs/λ < 62.5 | −72.5 ≤ θ ≤ −67.5 | 6 ≤ hm/λ ≤ 7 |
| | 57.5 ≤ hs/λ < 62.5 | −67.5 ≤ θ ≤ −62.5 | 6 ≤ hm/λ ≤ 7 |
| | 57.5 ≤ hs/λ < 62.5 | −62.5 ≤ θ ≤ −57.5 | 6 ≤ hm/λ ≤ 6.6 |
| | 57.5 ≤ hs/λ < 62.5 | −57.5 ≤ θ ≤ −52.5 | 6 ≤ hm/λ ≤ 6.5 |
| | 57.5 ≤ hs/λ < 62.5 | −52.5 ≤ θ ≤ −50 | 6 ≤ hm/λ ≤ 6.2 |
| | 62.5 ≤ hs/λ ≤ 67.5 | −90 ≤ θ ≤ −87.5 | 13.3 ≤ hm/λ ≤ 19.9 |
| | 62.5 ≤ hs/λ ≤ 67.5 | −87.5 ≤ θ ≤ −82.5 | 9.2 ≤ hm/λ ≤ 20 |
| | 62.5 ≤ hs/λ ≤ 67.5 | −82.5 ≤ θ ≤ −77.5 | 7.7 ≤ hm/λ ≤ 20.6 |
| | 62.5 ≤ hs/λ ≤ 67.5 | −77.5 ≤ θ ≤ −72.5 | 6 ≤ hm/λ ≤ 9.8 |
| | 62.5 ≤ hs/λ ≤ 67.5 | −72.5 ≤ θ ≤ −67.5 | 6 ≤ hm/λ ≤ 7 |
| | 62.5 ≤ hs/λ ≤ 67.5 | −67.5 ≤ θ ≤ −62.5 | 6 ≤ hm/λ ≤ 6.7 |
| | 62.5 ≤ hs/λ ≤ 67.5 | −62.5 ≤ θ ≤ −57.5 | 6 ≤ hm/λ ≤ 6.4 |
| | 62.5 ≤ hs/λ ≤ 67.5 | −57.5 ≤ θ ≤ −55 | 6 ≤ hm/λ ≤ 6.1 |

TABLE 13

| Metal for the first metal film | Thickness hs/λ (%) of the dielectric film | θ (°) of the Euler angles | Thickness hm/λ (%) of the first metal film |
|---|---|---|---|
| Cu | 32.5 ≤ hs/λ < 37.5 | −90 ≤ θ ≤ −87.5 | 30.7 ≤ hm/λ ≤ 31.8 |
| | 32.5 ≤ hs/λ < 37.5 | −87.5 ≤ θ ≤ −82.5 | 30.6 ≤ hm/λ ≤ 32 |
| | 32.5 ≤ hs/λ < 37.5 | −82.5 ≤ θ ≤ −77.5 | 26.8 ≤ hm/λ ≤ 32 |
| | 32.5 ≤ hs/λ < 37.5 | −77.5 ≤ θ ≤ −72.5 | 26.4 ≤ hm/λ ≤ 32 |
| | 32.5 ≤ hs/λ < 37.5 | −72.5 ≤ θ ≤ −67.5 | 27.4 ≤ hm/λ ≤ 32 |
| | 32.5 ≤ hs/λ < 37.5 | −67.5 ≤ θ ≤ −62.5 | 28.8 ≤ hm/λ ≤ 32 |
| | 37.5 ≤ hs/λ < 42.5 | −90 ≤ θ ≤ −87.5 | 33.3 ≤ hm/λ ≤ 36.7 |
| | 37.5 ≤ hs/λ < 42.5 | −87.5 ≤ θ ≤ −82.5 | 30.3 ≤ hm/λ ≤ 37 |
| | 37.5 ≤ hs/λ < 42.5 | −82.5 ≤ θ ≤ −77.5 | 29.2 ≤ hm/λ ≤ 37 |
| | 37.5 ≤ hs/λ < 42.5 | −77.5 ≤ θ ≤ −72.5 | 34.8 ≤ hm/λ ≤ 37 |
| | 37.5 ≤ hs/λ < 42.5 | −72.5 ≤ θ ≤ −67.5 | 36.4 ≤ hm/λ ≤ 37 |
| | 42.5 ≤ hs/λ < 47.5 | −90 ≤ θ ≤ −87.5 | 33.2 ≤ hm/λ ≤ 42 |
| | 42.5 ≤ hs/λ < 47.5 | −87.5 ≤ θ ≤ −82.5 | 31.5 ≤ hm/λ ≤ 42 |
| | 42.5 ≤ hs/λ < 47.5 | −82.5 ≤ θ ≤ −77.5 | 25.6 ≤ hm/λ ≤ 33.9 |
| | 42.5 ≤ hs/λ < 47.5 | −77.5 ≤ θ ≤ −72.5 | 21.9 ≤ hm/λ ≤ 32.2 |
| | 42.5 ≤ hs/λ < 47.5 | −72.5 ≤ θ ≤ −67.5 | 21.1 ≤ hm/λ ≤ 30.4 |
| | 42.5 ≤ hs/λ < 47.5 | −67.5 ≤ θ ≤ −62.5 | 21.5 ≤ hm/λ ≤ 29.5 |
| | 42.5 ≤ hs/λ < 47.5 | −62.5 ≤ θ ≤ −60 | 22.9 ≤ hm/λ ≤ 27 |
| | 47.5 ≤ hs/λ < 52.5 | −90 ≤ θ ≤ −87.5 | 35.7 ≤ hm/λ ≤ 47 |
| | 47.5 ≤ hs/λ < 52.5 | −87.5 ≤ θ ≤ −82.5 | 33.7 ≤ hm/λ ≤ 40.3 |
| | 47.5 ≤ hs/λ < 52.5 | −82.5 ≤ θ ≤ −77.5 | 27 ≤ hm/λ ≤ 37.5 |
| | 47.5 ≤ hs/λ < 52.5 | −77.5 ≤ θ ≤ −72.5 | 19.6 ≤ hm/λ ≤ 36.3 |
| | 47.5 ≤ hs/λ < 52.5 | −72.5 ≤ θ ≤ −67.5 | 18.6 ≤ hm/λ ≤ 35.5 |
| | 47.5 ≤ hs/λ < 52.5 | −67.5 ≤ θ ≤ −62.5 | 18.5 ≤ hm/λ ≤ 34.6 |
| | 47.5 ≤ hs/λ < 52.5 | −62.5 ≤ θ ≤ −57.5 | 18.8 ≤ hm/λ ≤ 33 |
| | 47.5 ≤ hs/λ < 52.5 | −57.5 ≤ θ ≤ −52.5 | 20.5 ≤ hm/λ ≤ 29.5 |
| | 52.5 ≤ hs/λ < 57.5 | −85 ≤ θ ≤ −82.5 | 48.95 ≤ hm/λ ≤ 49.1 |
| | 52.5 ≤ hs/λ < 57.5 | −85 ≤ θ ≤ −82.5 | 46.45 ≤ hm/λ ≤ 46.6 |
| | 52.5 ≤ hs/λ < 57.5 | −85 ≤ θ ≤ −82.5 | 43.92 ≤ hm/λ ≤ 44.15 |
| | 52.5 ≤ hs/λ < 57.5 | −85 ≤ θ ≤ −82.5 | 41.4 ≤ hm/λ ≤ 41.65 |
| | 52.5 ≤ hs/λ < 57.5 | −85 ≤ θ ≤ −82.5 | 26 ≤ hm/λ ≤ 35.6 |
| | 52.5 ≤ hs/λ < 57.5 | −82.5 ≤ θ ≤ −77.5 | 49.3 ≤ hm/λ ≤ 49 |
| | 52.5 ≤ hs/λ < 57.5 | −82.5 ≤ θ ≤ −77.5 | 46.45 ≤ hm/λ ≤ 46.8 |
| | 52.5 ≤ hs/λ < 57.5 | −82.5 ≤ θ ≤ −77.5 | 39.2 ≤ hm/λ ≤ 44.15 |
| | 52.5 ≤ hs/λ < 57.5 | −82.5 ≤ θ ≤ −77.5 | 41.4 ≤ hm/λ ≤ 41.7 |
| | 52.5 ≤ hs/λ < 57.5 | −82.5 ≤ θ ≤ −77.5 | 23.2 ≤ hm/λ ≤ 40 |
| | 52.5 ≤ hs/λ < 57.5 | −77.5 ≤ θ ≤ −72.5 | 44 ≤ hm/λ ≤ 44.3 |

TABLE 13-continued

| Metal for the first metal film | Thickness hs/λ (%) of the dielectric film | θ (°) of the Euler angles | Thickness hm/λ (%) of the first metal film |
|---|---|---|---|
| | 52.5 ≤ hs/λ < 57.5 | −77.5 ≤ θ ≤ −72.5 | 41.4 ≤ hm/λ ≤ 41.8 |
| | 52.5 ≤ hs/λ < 57.5 | −77.5 ≤ θ ≤ −72.5 | 35 ≤ hm/λ ≤ 40 |
| | 52.5 ≤ hs/λ < 57.5 | −77.5 ≤ θ ≤ −72.5 | 18.3 ≤ hm/λ ≤ 34 |
| | 52.5 ≤ hs/λ < 57.5 | −72.5 ≤ θ ≤ −67.5 | 44 ≤ hm/λ ≤ 44.5 |
| | 52.5 ≤ hs/λ < 57.5 | −72.5 ≤ θ ≤ −67.5 | 41.4 ≤ hm/λ ≤ 41.9 |
| | 52.5 ≤ hs/λ < 57.5 | −72.5 ≤ θ ≤ −67.5 | 34.5 ≤ hm/λ ≤ 39.9 |
| | 52.5 ≤ hs/λ < 57.5 | −72.5 ≤ θ ≤ −67.5 | 17.1 ≤ hm/λ ≤ 23.5 |
| | 52.5 ≤ hs/λ < 57.5 | −67.5 ≤ θ ≤ −62.5 | 44.5 ≤ hm/λ ≤ 44.6 |
| | 52.5 ≤ hs/λ < 57.5 | −67.5 ≤ θ ≤ −62.5 | 42 ≤ hm/λ ≤ 42.1 |
| | 52.5 ≤ hs/λ < 57.5 | −67.5 ≤ θ ≤ −62.5 | 34.5 ≤ hm/λ ≤ 39.2 |
| | 52.5 ≤ hs/λ < 57.5 | −67.5 ≤ θ ≤ −62.5 | 16.9 ≤ hm/λ ≤ 23 |
| | 52.5 ≤ hs/λ < 57.5 | −62.5 ≤ θ ≤ −57.5 | 34.5 ≤ hm/λ ≤ 38 |
| | 52.5 ≤ hs/λ < 57.5 | −62.5 ≤ θ ≤ −57.5 | 17 ≤ hm/λ ≤ 22.5 |
| | 52.5 ≤ hs/λ < 57.5 | −57.5 ≤ θ ≤ −52.5 | 35 ≤ hm/λ ≤ 36 |
| | 52.5 ≤ hs/λ < 57.5 | −57.5 ≤ θ ≤ −52.5 | 17.5 ≤ hm/λ ≤ 22 |
| | 52.5 ≤ hs/λ < 57.5 | −52.5 ≤ θ ≤ −47.5 | 19.5 ≤ hm/λ ≤ 21 |
| | 57.5 ≤ hs/λ < 62.5 | −90 ≤ θ ≤ −87.5 | 43.1 ≤ hm/λ ≤ 57 |
| | 57.5 ≤ hs/λ < 62.5 | −90 ≤ θ ≤ −87.5 | 29.6 ≤ hm/λ ≤ 40.4 |
| | 57.5 ≤ hs/λ < 62.5 | −87.5 ≤ θ ≤ −82.5 | 50.2 ≤ hm/λ ≤ 57 |
| | 57.5 ≤ hs/λ < 62.5 | −87.5 ≤ θ ≤ −82.5 | 42 ≤ hm/λ ≤ 47.4 |
| | 57.5 ≤ hs/λ < 62.5 | −87.5 ≤ θ ≤ −82.5 | 23.5 ≤ hm/λ ≤ 41 |
| | 57.5 ≤ hs/λ < 62.5 | −82.5 ≤ θ ≤ −77.5 | 41.5 ≤ hm/λ ≤ 45.6 |
| | 57.5 ≤ hs/λ < 62.5 | −82.5 ≤ θ ≤ −77.5 | 21.1 ≤ hm/λ ≤ 40.5 |
| | 57.5 ≤ hs/λ < 62.5 | −77.5 ≤ θ ≤ −72.5 | 17.3 ≤ hm/λ ≤ 44.7 |
| | 57.5 ≤ hs/λ < 62.5 | −72.5 ≤ θ ≤ −67.5 | 40.4 ≤ hm/λ ≤ 44.2 |
| | 57.5 ≤ hs/λ < 62.5 | −72.5 ≤ θ ≤ −67.5 | 16 ≤ hm/λ ≤ 20.5 |
| | 57.5 ≤ hs/λ < 62.5 | −67.5 ≤ θ ≤ −62.5 | 15.7 ≤ hm/λ ≤ 20.5 |
| | 57.5 ≤ hs/λ < 62.5 | −62.5 ≤ θ ≤ −57.5 | 15.7 ≤ hm/λ ≤ 20 |
| | 57.5 ≤ hs/λ < 62.5 | −57.5 ≤ θ ≤ −52.5 | 16 ≤ hm/λ ≤ 19.5 |
| | 57.5 ≤ hs/λ < 62.5 | −52.5 ≤ θ ≤ −47.5 | 17.5 ≤ hm/λ ≤ 19 |
| | 57.5 ≤ hs/λ < 62.5 | −47.5 ≤ θ ≤ −42.5 | 17.7 ≤ hm/λ ≤ 18 |
| | 57.5 ≤ hs/λ < 62.5 | −42.5 ≤ θ ≤ −37.5 | 16.1 ≤ hm/λ ≤ 17 |
| | 57.5 ≤ hs/λ < 62.5 | −37.5 ≤ θ ≤ −32.5 | 15.2 ≤ hm/λ ≤ 16 |
| | 57.5 ≤ hs/λ < 62.5 | −32.5 ≤ θ ≤ −27.5 | 14.2 ≤ hm/λ ≤ 15 |

TABLE 14

| Metal for the first metal film | Thickness hs/λ (%) of the dielectric film | θ (°) of the Euler angles | Thickness hm/λ (%) of the first metal film |
|---|---|---|---|
| Cu | 62.5 ≤ hs/λ < 67.5 | −90 ≤ θ ≤ −87.5 | 47.4 ≤ hm/λ ≤ 62 |
| | 62.5 ≤ hs/λ < 67.5 | −90 ≤ θ ≤ −87.5 | 27.7 ≤ hm/λ ≤ 46.2 |
| | 62.5 ≤ hs/λ < 67.5 | −87.5 ≤ θ ≤ −82.5 | 53.3 ≤ hm/λ ≤ 62 |
| | 62.5 ≤ hs/λ < 67.5 | −87.5 ≤ θ ≤ −82.5 | 46.7 ≤ hm/λ ≤ 51.4 |
| | 62.5 ≤ hs/λ < 67.5 | −87.5 ≤ θ ≤ −82.5 | 22.2 ≤ hm/λ ≤ 46.4 |
| | 62.5 ≤ hs/λ < 67.5 | −82.5 ≤ θ ≤ −77.5 | 57.7 ≤ hm/λ ≤ 62 |
| | 62.5 ≤ hs/λ < 67.5 | −82.5 ≤ θ ≤ −77.5 | 20 ≤ hm/λ ≤ 50 |
| | 62.5 ≤ hs/λ < 67.5 | −77.5 ≤ θ ≤ −72.5 | 36.5 ≤ hm/λ ≤ 49.15 |
| | 62.5 ≤ hs/λ < 67.5 | −77.5 ≤ θ ≤ −72.5 | 16.7 ≤ hm/λ ≤ 34 |
| | 62.5 ≤ hs/λ < 67.5 | −72.5 ≤ θ ≤ −67.5 | 45.75 ≤ hm/λ ≤ 48.6 |
| | 62.5 ≤ hs/λ < 67.5 | −72.5 ≤ θ ≤ −67.5 | 15.25 ≤ hm/λ ≤ 19.6 |
| | 62.5 ≤ hs/λ < 67.5 | −67.5 ≤ θ ≤ −62.5 | 14.9 ≤ hm/λ ≤ 19 |
| | 62.5 ≤ hs/λ < 67.5 | −62.5 ≤ θ ≤ −57.5 | 14.9 ≤ hm/λ ≤ 18.5 |
| | 62.5 ≤ hs/λ < 67.5 | −57.5 ≤ θ ≤ −52.5 | 15 ≤ hm/λ ≤ 18 |
| | 62.5 ≤ hs/λ < 67.5 | −52.5 ≤ θ ≤ −47.5 | 16 ≤ hm/λ ≤ 17.5 |
| | 62.5 ≤ hs/λ < 67.5 | −47.5 ≤ θ ≤ −42.5 | 16.15 ≤ hm/λ ≤ 17 |
| | 62.5 ≤ hs/λ < 67.5 | −42.5 ≤ θ ≤ −37.5 | 14.8 ≤ hm/λ ≤ 16.05 |
| | 62.5 ≤ hs/λ < 67.5 | −37.5 ≤ θ ≤ −32.5 | 14 ≤ hm/λ ≤ 15 |
| | 62.5 ≤ hs/λ < 67.5 | −32.5 ≤ θ ≤ −27.5 | 13.7 ≤ hm/λ ≤ 14.5 |
| | 67.5 ≤ hs/λ < 72.5 | −90 ≤ θ ≤ −87.5 | 51.8 ≤ hm/λ ≤ 67 |
| | 67.5 ≤ hs/λ < 72.5 | −90 ≤ θ ≤ −87.5 | 26.7 ≤ hm/λ ≤ 51.4 |
| | 67.5 ≤ hs/λ < 72.5 | −87.5 ≤ θ ≤ −82.5 | 56.9 ≤ hm/λ ≤ 87 |
| | 67.5 ≤ hs/λ < 72.5 | −87.5 ≤ θ ≤ −82.5 | 21.3 ≤ hm/λ ≤ 55.5 |
| | 67.5 ≤ hs/λ < 72.5 | −82.5 ≤ θ ≤ −77.5 | 59.8 ≤ hm/λ ≤ 67 |
| | 67.5 ≤ hs/λ < 72.5 | −82.5 ≤ θ ≤ −77.5 | 19.15 ≤ hm/λ ≤ 54.4 |
| | 67.5 ≤ hs/λ < 72.5 | −77.5 ≤ θ ≤ −72.5 | 43 ≤ hm/λ ≤ 53.6 |
| | 67.5 ≤ hs/λ < 72.5 | −77.5 ≤ θ ≤ −72.5 | 16.2 ≤ hm/λ ≤ 30.9 |
| | 67.5 ≤ hs/λ < 72.5 | −72.5 ≤ θ ≤ −67.5 | 50.7 ≤ hm/λ ≤ 53.2 |
| | 67.5 ≤ hs/λ < 72.5 | −72.5 ≤ θ ≤ −67.5 | 14.6 ≤ hm/λ ≤ 18.7 |
| | 67.5 ≤ hs/λ < 72.5 | −67.5 ≤ θ ≤ −62.5 | 14.3 ≤ hm/λ ≤ 18 |
| | 67.5 ≤ hs/λ < 72.5 | −62.5 ≤ θ ≤ −57.5 | 14.2 ≤ hm/λ ≤ 17.5 |
| | 67.5 ≤ hs/λ < 72.5 | −57.5 ≤ θ ≤ −52.5 | 14.5 ≤ hm/λ ≤ 17.4 |
| | 67.5 ≤ hs/λ < 72.5 | −52.5 ≤ θ ≤ −47.5 | 14.9 ≤ hm/λ ≤ 16.5 |
| | 67.5 ≤ hs/λ < 72.5 | −47.5 ≤ θ ≤ −42.5 | 15.1 ≤ hm/λ ≤ 16 |

TABLE 14-continued

| Metal for the first metal film | Thickness hs/λ (%) of the dielectric film | θ (°) of the Euler angles | Thickness hm/λ (%) of the first metal film |
|---|---|---|---|
| | 67.5 ≤ hs/λ < 72.5 | −42.5 ≤ θ ≤ −37.5 | 13.9 ≤ hm/λ ≤ 15 |
| | 67.5 ≤ hs/λ < 72.5 | −37.5 ≤ θ ≤ −32.5 | 13.2 ≤ hm/λ ≤ 14.5 |
| | 67.5 ≤ hs/λ < 72.5 | −32.5 ≤ θ ≤ −30 | 13 ≤ hm/λ ≤ 14.5 |
| | 72.5 ≤ hs/λ < 77.5 | −90 ≤ θ ≤ −87.5 | 26.1 ≤ hm/λ ≤ 72 |
| | 72.5 ≤ hs/λ < 77.5 | −87.5 ≤ θ ≤ −82.5 | 60.8 ≤ hm/λ ≤ 72 |
| | 72.5 ≤ hs/λ < 77.5 | −87.5 ≤ θ ≤ −82.5 | 20.7 ≤ hm/λ ≤ 59.8 |
| | 72.5 ≤ hs/λ < 77.5 | −82.5 ≤ θ ≤ −77.5 | 62.8 ≤ hm/λ ≤ 72 |
| | 72.5 ≤ hs/λ < 77.5 | −82.5 ≤ θ ≤ −77.5 | 18.5 ≤ hm/λ ≤ 58.9 |
| | 72.5 ≤ hs/λ < 77.5 | −77.5 ≤ θ ≤ −72.5 | 47.5 ≤ hm/λ ≤ 58.2 |
| | 72.5 ≤ hs/λ < 77.5 | −77.5 ≤ θ ≤ −72.5 | 15.8 ≤ hm/λ ≤ 29.8 |
| | 72.5 ≤ hs/λ < 77.5 | −72.5 ≤ θ ≤ −67.5 | 55.7 ≤ hm/λ ≤ 57.8 |
| | 72.5 ≤ hs/λ < 77.5 | −72.5 ≤ θ ≤ −67.5 | 14.1 ≤ hm/λ ≤ 17.5 |
| | 72.5 ≤ hs/λ < 77.5 | −67.5 ≤ θ ≤ −62.5 | 13.7 ≤ hm/λ ≤ 17.5 |
| | 72.5 ≤ hs/λ < 77.5 | −62.5 ≤ θ ≤ −57.5 | 13.7 ≤ hm/λ ≤ 17 |
| | 72.5 ≤ hs/λ < 77.5 | −57.5 ≤ θ ≤ −52.5 | 13.7 ≤ hm/λ ≤ 16.5 |
| | 72.5 ≤ hs/λ < 77.5 | −52.5 ≤ θ ≤ −47.5 | 14.5 ≤ hm/λ ≤ 16 |
| | 72.5 ≤ hs/λ < 77.5 | −47.5 ≤ θ ≤ −42.5 | 14.15 ≤ hm/λ ≤ 15.5 |
| | 72.5 ≤ hs/λ < 77.5 | −42.5 ≤ θ ≤ −37.5 | 13.2 ≤ hm/λ ≤ 14.5 |
| | 72.5 ≤ hs/λ < 77.5 | −37.5 ≤ θ ≤ −32.5 | 12.6 ≤ hm/λ ≤ 14 |
| | 72.5 ≤ hs/λ < 77.5 | −32.5 ≤ θ ≤ −27.5 | 12.4 ≤ hm/λ ≤ 14 |
| | 77.5 ≤ hs/λ < 82.5 | −90 ≤ θ ≤ −87.5 | 25.75 ≤ hm/λ ≤ 77 |
| | 77.5 ≤ hs/λ < 82.5 | −87.5 ≤ θ ≤ −82.5 | 64.9 ≤ hm/λ ≤ 77 |
| | 77.5 ≤ hs/λ < 82.5 | −87.5 ≤ θ ≤ −82.5 | 20.2 ≤ hm/λ ≤ 64.2 |
| | 77.5 ≤ hs/λ < 82.5 | −82.5 ≤ θ ≤ −77.5 | 66.3 ≤ hm/λ ≤ 77 |
| | 77.5 ≤ hs/λ < 82.5 | −82.5 ≤ θ ≤ −77.5 | 18 ≤ hm/λ ≤ 63.5 |
| | 77.5 ≤ hs/λ < 82.5 | −77.5 ≤ θ ≤ −72.5 | 72.6 ≤ hm/λ ≤ 77 |
| | 77.5 ≤ hs/λ < 82.5 | −77.5 ≤ θ ≤ −72.5 | 51.2 ≤ hm/λ ≤ 63.9 |
| | 77.5 ≤ hs/λ < 82.5 | −77.5 ≤ θ ≤ −72.5 | 17.5 ≤ hm/λ ≤ 29.3 |
| | 77.5 ≤ hs/λ < 82.5 | −72.5 ≤ θ ≤ −67.5 | 60.4 ≤ hm/λ ≤ 62.5 |
| | 77.5 ≤ hs/λ < 82.5 | −72.5 ≤ θ ≤ −67.5 | 13.7 ≤ hm/λ ≤ 17.3 |
| | 77.5 ≤ hs/λ < 82.5 | −67.5 ≤ θ ≤ −62.5 | 13.4 ≤ hm/λ ≤ 16.5 |
| | 77.5 ≤ hs/λ < 82.5 | −62.5 ≤ θ ≤ −57.5 | 13.3 ≤ hm/λ ≤ 16.4 |
| | 77.5 ≤ hs/λ < 82.5 | −57.5 ≤ θ ≤ −52.5 | 13.3 ≤ hm/λ ≤ 16.4 |

TABLE 15

| Metal for the first metal film | Thickness hs/λ (%) of the dielectric film | θ (°) of the Euler angles | Thickness hm/λ (%) of the first metal film |
|---|---|---|---|
| Cu | 82.5 ≤ hs/λ < 87.5 | −90 ≤ θ ≤ −87.5 | 25.6 ≤ hm/λ ≤ 82 |
| | 82.5 ≤ hs/λ < 87.5 | −87.5 ≤ θ ≤ −82.5 | 69.3 ≤ hm/λ ≤ 82 |
| | 82.5 ≤ hs/λ < 87.5 | −87.5 ≤ θ ≤ −82.5 | 19.9 ≤ hm/λ ≤ 68.8 |
| | 82.5 ≤ hs/λ < 87.5 | −82.5 ≤ θ ≤ −77.5 | 70.2 ≤ hm/λ ≤ 82 |
| | 82.5 ≤ hs/λ < 87.5 | −82.5 ≤ θ ≤ −77.5 | 17.6 ≤ hm/λ ≤ 68.1 |
| | 82.5 ≤ hs/λ < 87.5 | −77.5 ≤ θ ≤ −72.5 | 74.3 ≤ hm/λ ≤ 82 |
| | 82.5 ≤ hs/λ < 87.5 | −77.5 ≤ θ ≤ −72.5 | 54.2 ≤ hm/λ ≤ 67.6 |
| | 82.5 ≤ hs/λ < 87.5 | −77.5 ≤ θ ≤ −72.5 | 17 ≤ hm/λ ≤ 29 |
| | 82.5 ≤ hs/λ < 87.5 | −72.5 ≤ θ ≤ −67.5 | 63.3 ≤ hm/λ ≤ 67 |
| | 82.5 ≤ hs/λ < 87.5 | −72.5 ≤ θ ≤ −67.5 | 13.2 ≤ hm/λ ≤ 18.3 |
| | 82.5 ≤ hs/λ < 87.5 | −67.5 ≤ θ ≤ −62.5 | 13 ≤ hm/λ ≤ 16.5 |
| | 82.5 ≤ hs/λ < 87.5 | −62.5 ≤ θ ≤ −57.5 | 12.9 ≤ hm/λ ≤ 15.9 |
| | 82.5 ≤ hs/λ < 87.5 | −57.5 ≤ θ ≤ −52.5 | 13 ≤ hm/λ ≤ 15.5 |
| | 82.5 ≤ hs/λ < 87.5 | −52.5 ≤ θ ≤ −47.5 | 13.4 ≤ hm/λ ≤ 15 |
| | 82.5 ≤ hs/λ < 87.5 | −47.5 ≤ θ ≤ −42.5 | 13 ≤ hm/λ ≤ 14.3 |
| | 82.5 ≤ hs/λ < 87.5 | −42.5 ≤ θ ≤ −37.5 | 12.2 ≤ hm/λ ≤ 13.6 |
| | 82.5 ≤ hs/λ < 87.5 | −37.5 ≤ θ ≤ −32.5 | 11.6 ≤ hm/λ ≤ 13 |
| | 82.5 ≤ hs/λ < 87.5 | −32.5 ≤ θ ≤ −30 | 11.6 ≤ hm/λ ≤ 13 |
| | 87.5 ≤ hs/λ < 92.5 | −90 ≤ θ ≤ −87.5 | 25.5 ≤ hm/λ ≤ 87 |
| | 87.5 ≤ hs/λ < 92.5 | −87.5 ≤ θ ≤ −82.5 | 73.6 ≤ hm/λ ≤ 87 |
| | 87.5 ≤ hs/λ < 92.5 | −87.5 ≤ θ ≤ −82.5 | 19.6 ≤ hm/λ ≤ 73.3 |
| | 87.5 ≤ hs/λ < 92.5 | −82.5 ≤ θ ≤ −77.5 | 74.3 ≤ hm/λ ≤ 87 |
| | 87.5 ≤ hs/λ < 92.5 | −82.5 ≤ θ ≤ −77.5 | 17.2 ≤ hm/λ ≤ 72.8 |
| | 87.5 ≤ hs/λ < 92.5 | −77.5 ≤ θ ≤ −72.5 | 77.2 ≤ hm/λ ≤ 87 |
| | 87.5 ≤ hs/λ < 92.5 | −77.5 ≤ θ ≤ −72.5 | 56.8 ≤ hm/λ ≤ 72.3 |
| | 87.5 ≤ hs/λ < 92.5 | −77.5 ≤ θ ≤ −72.5 | 16.4 ≤ hm/λ ≤ 28.7 |
| | 87.5 ≤ hs/λ < 92.5 | −72.5 ≤ θ ≤ −67.5 | 82.2 ≤ hm/λ ≤ 87 |
| | 87.5 ≤ hs/λ < 92.5 | −72.5 ≤ θ ≤ −67.5 | 68 ≤ hm/λ ≤ 72 |
| | 87.5 ≤ hs/λ < 92.5 | −72.5 ≤ θ ≤ −67.5 | 12.9 ≤ hm/λ ≤ 18.4 |
| | 87.5 ≤ hs/λ < 92.5 | −67.5 ≤ θ ≤ −62.5 | 12.65 ≤ hm/λ ≤ 16 |
| | 87.5 ≤ hs/λ < 92.5 | −62.5 ≤ θ ≤ −57.5 | 12.6 ≤ hm/λ ≤ 15.5 |
| | 87.5 ≤ hs/λ < 92.5 | −57.5 ≤ θ ≤ −52.5 | 12.7 ≤ hm/λ ≤ 15 |
| | 87.5 ≤ hs/λ < 92.5 | −52.5 ≤ θ ≤ −47.5 | 12.9 ≤ hm/λ ≤ 14.5 |
| | 87.5 ≤ hs/λ < 92.5 | −47.5 ≤ θ ≤ −42.5 | 12.5 ≤ hm/λ ≤ 13.8 |
| | 87.5 ≤ hs/λ < 92.5 | −42.5 ≤ θ ≤ −37.5 | 11.8 ≤ hm/λ ≤ 13 |

TABLE 15-continued

| Metal for the first metal film | Thickness hs/λ (%) of the dielectric film | θ (°) of the Euler angles | Thickness hm/λ (%) of the first metal film |
|---|---|---|---|
| | 87.5 ≤ hs/λ < 92.5 | −37.5 ≤ θ ≤ −32.5 | 11.2 ≤ hm/λ ≤ 13 |
| | 87.5 ≤ hs/λ < 92.5 | −32.5 ≤ θ ≤ −27.5 | 11.3 ≤ hm/λ ≤ 13 |
| | 92.5 ≤ hs/λ ≤ 97.5 | −90 ≤ θ ≤ −87.5 | 25.5 ≤ hm/λ ≤ 92 |
| | 92.5 ≤ hs/λ ≤ 97.5 | −87.5 ≤ θ ≤ −82.5 | 19.3 ≤ hm/λ ≤ 92 |
| | 92.5 ≤ hs/λ ≤ 97.5 | −82.5 ≤ θ ≤ −77.5 | 78.8 ≤ hm/λ ≤ 92 |
| | 92.5 ≤ hs/λ ≤ 97.5 | −82.5 ≤ θ ≤ −77.5 | 17 ≤ hm/λ ≤ 77.6 |
| | 92.5 ≤ hs/λ ≤ 97.5 | −77.5 ≤ θ ≤ −72.5 | 80.6 ≤ hm/λ ≤ 92 |
| | 92.5 ≤ hs/λ ≤ 97.5 | −77.5 ≤ θ ≤ −72.5 | 59 ≤ hm/λ ≤ 77 |
| | 92.5 ≤ hs/λ ≤ 97.5 | −77.5 ≤ θ ≤ −72.5 | 16 ≤ hm/λ ≤ 28.5 |
| | 92.5 ≤ hs/λ ≤ 97.5 | −72.5 ≤ θ ≤ −67.5 | 86.5 ≤ hm/λ ≤ 92 |
| | 92.5 ≤ hs/λ ≤ 97.5 | −72.5 ≤ θ ≤ −67.5 | 72 ≤ hm/λ ≤ 76.5 |
| | 92.5 ≤ hs/λ ≤ 97.5 | −72.5 ≤ θ ≤ −67.5 | 12.6 ≤ hm/λ ≤ 18.4 |
| | 92.5 ≤ hs/λ ≤ 97.5 | −67.5 ≤ θ ≤ −62.5 | 12.4 ≤ hm/λ ≤ 15.5 |
| | 92.5 ≤ hs/λ ≤ 97.5 | −62.5 ≤ θ ≤ −57.5 | 12.4 ≤ hm/λ ≤ 15.2 |
| | 92.5 ≤ hs/λ ≤ 97.5 | −57.5 ≤ θ ≤ −52.5 | 12.5 ≤ hm/λ ≤ 14.7 |
| | 92.5 ≤ hs/λ ≤ 97.5 | −52.5 ≤ θ ≤ −47.5 | 12.9 ≤ hm/λ ≤ 14.2 |
| | 92.5 ≤ hs/λ ≤ 97.5 | −47.5 ≤ θ ≤ −42.5 | 12.2 ≤ hm/λ ≤ 13.5 |
| | 92.5 ≤ hs/λ ≤ 97.5 | −42.5 ≤ θ ≤ −37.5 | 11.5 ≤ hm/λ ≤ 13.1 |
| | 92.5 ≤ hs/λ ≤ 97.5 | −37.5 ≤ θ ≤ −32.5 | 11.5 ≤ hm/λ ≤ 12.5 |
| | 92.5 ≤ hs/λ ≤ 97.5 | −32.5 ≤ θ ≤ −27.5 | 11.5 ≤ hm/λ ≤ 13 |

TABLE 16

| Metal for the first metal film | Thickness hs/λ (%) of the dielectric film | θ (°) of the Euler angles | Thickness hm/λ (%) of the first metal film |
|---|---|---|---|
| Mo | 32.5 ≤ hs/λ < 37.5 | −85 ≤ θ ≤ −82.5 | 31.4 ≤ Tm ≤ 32 |
| | 32.5 ≤ hs/λ < 37.5 | −82.5 ≤ θ ≤ −77.5 | 24.75 ≤ Tm ≤ 32 |
| | 32.5 ≤ hs/λ < 37.5 | −77.5 ≤ θ ≤ −72.5 | 23.6 ≤ Tm ≤ 30.5 |
| | 32.5 ≤ hs/λ < 37.5 | −72.5 ≤ θ ≤ −67.5 | 23.6 ≤ Tm ≤ 30.6 |
| | 32.5 ≤ hs/λ < 37.5 | −67.5 ≤ θ ≤ −62.5 | 24.5 ≤ Tm ≤ 30.5 |
| | 32.5 ≤ hs/λ < 37.5 | −62.5 ≤ θ ≤ −57.5 | 25.5 ≤ Tm ≤ 30.5 |
| | 32.5 ≤ hs/λ < 37.5 | −57.5 ≤ θ ≤ −52.5 | 28.75 ≤ Tm ≤ 29.75 |
| | 32.5 ≤ hs/λ < 37.5 | −52.5 ≤ θ ≤ −50 | 29.7 ≤ Tm ≤ 29.75 |
| | 37.5 ≤ hs/λ < 42.5 | −85 ≤ θ ≤ −82.5 | 34.25 ≤ Tm ≤ 37 |
| | 37.5 ≤ hs/λ < 42.5 | −82.5 ≤ θ ≤ −77.5 | 25.4 ≤ Tm ≤ 37 |
| | 37.5 ≤ hs/λ < 42.5 | −77.5 ≤ θ ≤ −72.5 | 23.1 ≤ Tm ≤ 34 |
| | 37.5 ≤ hs/λ < 42.5 | −72.5 ≤ θ ≤ −67.5 | 22.9 ≤ Tm ≤ 34 |
| | 37.5 ≤ hs/λ < 42.5 | −67.5 ≤ θ ≤ −62.5 | 23.7 ≤ Tm ≤ 34 |
| | 37.5 ≤ hs/λ < 42.5 | −62.5 ≤ θ ≤ −57.5 | 25.4 ≤ Tm ≤ 34 |
| | 37.5 ≤ hs/λ < 42.5 | −57.5 ≤ θ ≤ −52.5 | 31.5 ≤ Tm ≤ 33.5 |
| | 37.5 ≤ hs/λ < 42.5 | −52.5 ≤ θ ≤ −50 | 33.5 ≤ Tm ≤ 34 |
| | 42.5 ≤ hs/λ < 47.5 | −90 ≤ θ ≤ −87.5 | 40.5 ≤ Tm ≤ 42 |
| | 42.5 ≤ hs/λ < 47.5 | −87.5 ≤ θ ≤ −82.5 | 36.7 ≤ Tm ≤ 42 |
| | 42.5 ≤ hs/λ < 47.5 | −82.5 ≤ θ ≤ −77.5 | 25.4 ≤ Tm ≤ 42 |
| | 42.5 ≤ hs/λ < 47.5 | −77.5 ≤ θ ≤ −72.5 | 21.1 ≤ Tm ≤ 37 |
| | 42.5 ≤ hs/λ < 47.5 | −72.5 ≤ θ ≤ −67.5 | 20.4 ≤ Tm ≤ 37.5 |
| | 42.5 ≤ hs/λ < 47.5 | −67.5 ≤ θ ≤ −62.5 | 20.6 ≤ Tm ≤ 37.5 |
| | 42.5 ≤ hs/λ < 47.5 | −62.5 ≤ θ ≤ −57.5 | 21.5 ≤ Tm ≤ 37 |
| | 42.5 ≤ hs/λ < 47.5 | −57.5 ≤ θ ≤ −52.5 | 27 ≤ Tm ≤ 36.5 |
| | 42.5 ≤ hs/λ < 47.5 | −52.5 ≤ θ ≤ −50 | 37 ≤ Tm ≤ 37.5 |
| | 47.5 ≤ hs/λ < 52.5 | −90 ≤ θ ≤ −87.5 | 43.2 ≤ Tm ≤ 47 |
| | 47.5 ≤ hs/λ < 52.5 | −87.5 ≤ θ ≤ −82.5 | 36.5 ≤ Tm ≤ 47 |
| | 47.5 ≤ hs/λ < 52.5 | −82.5 ≤ θ ≤ −77.5 | 35 ≤ Tm ≤ 47 |
| | 47.5 ≤ hs/λ < 52.5 | −82.5 ≤ θ ≤ −77.5 | 25.8 ≤ Tm ≤ 34 |
| | 47.5 ≤ hs/λ < 52.5 | −77.5 ≤ θ ≤ −72.5 | 19.4 ≤ Tm ≤ 38 |
| | 47.5 ≤ hs/λ < 52.5 | −72.5 ≤ θ ≤ −67.5 | 18.3 ≤ Tm ≤ 39 |
| | 47.5 ≤ hs/λ < 52.5 | −67.5 ≤ θ ≤ −62.5 | 18.3 ≤ Tm ≤ 39.5 |
| | 47.5 ≤ hs/λ < 52.5 | −62.5 ≤ θ ≤ −57.5 | 18.6 ≤ Tm ≤ 39 |
| | 47.5 ≤ hs/λ < 52.5 | −57.5 ≤ θ ≤ −52.5 | 20 ≤ Tm ≤ 37 |
| | 47.5 ≤ hs/λ < 52.5 | −52.5 ≤ θ ≤ −50 | 35.5 ≤ Tm ≤ 40.5 |
| | 47.5 ≤ hs/λ < 52.5 | −52.5 ≤ θ ≤ −50 | 24.5 ≤ Tm ≤ 29 |
| | 52.5 ≤ hs/λ < 57.5 | −90 ≤ θ ≤ −87.5 | 44.3 ≤ Tm ≤ 52 |
| | 52.5 ≤ hs/λ < 57.5 | −87.5 ≤ θ ≤ −82.5 | 29.8 ≤ Tm ≤ 52 |
| | 52.5 ≤ hs/λ < 57.5 | −82.5 ≤ θ ≤ −77.5 | 26 ≤ Tm ≤ 52 |
| | 52.5 ≤ hs/λ < 57.5 | −77.5 ≤ θ ≤ −72.5 | 27.2 ≤ Tm ≤ 31.2 |
| | 52.5 ≤ hs/λ < 57.5 | −77.5 ≤ θ ≤ −72.5 | 18.1 ≤ Tm ≤ 26 |
| | 52.5 ≤ hs/λ < 57.5 | −72.5 ≤ θ ≤ −67.5 | 16.9 ≤ Tm ≤ 26.3 |
| | 52.5 ≤ hs/λ < 57.5 | −67.5 ≤ θ ≤ −62.5 | 16.7 ≤ Tm ≤ 25.2 |
| | 52.5 ≤ hs/λ < 57.5 | −62.5 ≤ θ ≤ −57.5 | 16.8 ≤ Tm ≤ 24.7 |

TABLE 16-continued

| Metal for the first metal film | Thickness hs/λ (%) of the dielectric film | θ (°) of the Euler angles | Thickness hm/λ (%) of the first metal film |
|---|---|---|---|
| | 52.5 ≤ hs/λ < 57.5 | −57.5 ≤ θ ≤ −52.5 | 17.5 ≤ Tm ≤ 24 |
| | 52.5 ≤ hs/λ < 57.5 | −52.5 ≤ θ ≤ −47.5 | 19.5 ≤ Tm ≤ 22.5 |
| | 52.5 ≤ hs/λ < 57.5 | −42.5 ≤ θ ≤ −37.5 | 21 ≤ Tm ≤ 21.5 |
| | 52.5 ≤ hs/λ < 57.5 | −42.5 ≤ θ ≤ −37.5 | 18 ≤ Tm ≤ 19 |
| | 52.5 ≤ hs/λ < 57.5 | −37.5 ≤ θ ≤ −32.5 | 19.5 ≤ Tm ≤ 21 |
| | 52.5 ≤ hs/λ < 57.5 | −37.5 ≤ θ ≤ −32.5 | 16.6 ≤ Tm ≤ 17 |
| | 52.5 ≤ hs/λ < 57.5 | −32.5 ≤ θ ≤ −30 | 18 ≤ Tm ≤ 19 |
| | 52.5 ≤ hs/λ < 57.5 | −32.5 ≤ θ ≤ −30 | 15.2 ≤ Tm ≤ 15.5 |
| | 57.5 ≤ hs/λ < 62.5 | −90 ≤ θ ≤ −87.5 | 37.8 ≤ Tm ≤ 57 |
| | 57.5 ≤ hs/λ < 62.5 | −87.5 ≤ θ ≤ −82.5 | 26.7 ≤ Tm ≤ 57 |
| | 57.5 ≤ hs/λ < 62.5 | −82.5 ≤ θ ≤ −77.5 | 23.1 ≤ Tm ≤ 57 |
| | 57.5 ≤ hs/λ < 62.5 | −77.5 ≤ θ ≤ −72.5 | 17.2 ≤ Tm ≤ 33.2 |
| | 57.5 ≤ hs/λ < 62.5 | −72.5 ≤ θ ≤ −67.5 | 15.9 ≤ Tm ≤ 23 |
| | 57.5 ≤ hs/λ < 62.5 | −67.5 ≤ θ ≤ −62.5 | 15.5 ≤ Tm ≤ 22 |
| | 57.5 ≤ hs/λ < 62.5 | −62.5 ≤ θ ≤ −57.5 | 15.5 ≤ Tm ≤ 21.3 |
| | 57.5 ≤ hs/λ < 62.5 | −57.5 ≤ θ ≤ −52.5 | 16 ≤ Tm ≤ 21 |
| | 57.5 ≤ hs/λ < 62.5 | −52.5 ≤ θ ≤ −47.5 | 17.5 ≤ Tm ≤ 20 |
| | 57.5 ≤ hs/λ < 62.5 | −47.5 ≤ θ ≤ −42.5 | 18.5 ≤ Tm ≤ 18.5 |
| | 57.5 ≤ hs/λ < 62.5 | −42.5 ≤ θ ≤ −37.5 | 18.5 ≤ Tm ≤ 18.5 |
| | 57.5 ≤ hs/λ < 62.5 | −42.5 ≤ θ ≤ −37.5 | 16 ≤ Tm ≤ 17.5 |
| | 57.5 ≤ hs/λ < 62.5 | −37.5 ≤ θ ≤ −32.5 | 17.5 ≤ Tm ≤ 18.5 |
| | 57.5 ≤ hs/λ < 62.5 | −37.5 ≤ θ ≤ −32.5 | 14.9 ≤ Tm ≤ 16 |
| | 57.5 ≤ hs/λ < 62.5 | −32.5 ≤ θ ≤ −30 | 16.5 ≤ Tm ≤ 17.5 |
| | 57.5 ≤ hs/λ < 62.5 | −32.5 ≤ θ ≤ −30 | 14 ≤ Tm ≤ 14.5 |

TABLE 17

| Metal for the first metal film | Thickness hs/λ (%) of the dielectric film | θ (°) of the Euler angles | Thickness hm/λ (%) of the first metal film |
|---|---|---|---|
| Mo | 62.5 ≤ hs/λ < 67.5 | −90 ≤ θ ≤ −87.5 | 34.2 ≤ hm/λ ≤ 62 |
| | 62.5 ≤ hs/λ < 67.5 | −87.5 ≤ θ ≤ −82.5 | 25 ≤ hm/λ ≤ 62 |
| | 62.5 ≤ hs/λ < 67.5 | −82.5 ≤ θ ≤ −77.5 | 21.7 ≤ hm/λ ≤ 62 |
| | 62.5 ≤ hs/λ < 67.5 | −77.5 ≤ θ ≤ −72.5 | 16.5 ≤ hm/λ ≤ 32.1 |
| | 62.5 ≤ hs/λ < 67.5 | −72.5 ≤ θ ≤ −67.5 | 15 ≤ hm/λ ≤ 21 |
| | 62.5 ≤ hs/λ < 67.5 | −67.5 ≤ θ ≤ −62.5 | 14.7 ≤ hm/λ ≤ 20.3 |
| | 62.5 ≤ hs/λ < 67.5 | −62.5 ≤ θ ≤ −57.5 | 14.6 ≤ hm/λ ≤ 19.5 |
| | 62.5 ≤ hs/λ < 67.5 | −57.5 ≤ θ ≤ −52.5 | 14.7 ≤ hm/λ ≤ 19 |

TABLE 17-continued

| Metal for the first metal film | Thickness hs/λ (%) of the dielectric film | θ (°) of the Euler angles | Thickness hm/λ (%) of the first metal film |
|---|---|---|---|
| | 62.5 ≤ hs/λ < 67.5 | −52.5 ≤ θ ≤ −47.5 | 16 ≤ hm/λ ≤ 18.5 |
| | 62.5 ≤ hs/λ < 67.5 | −47.5 ≤ θ ≤ −42.5 | 16.2 ≤ hm/λ ≤ 17.5 |
| | 62.5 ≤ hs/λ < 67.5 | −42.5 ≤ θ ≤ −37.5 | 14.6 ≤ hm/λ ≤ 17 |
| | 62.5 ≤ hs/λ < 67.5 | −37.5 ≤ θ ≤ −32.5 | 16 ≤ hm/λ ≤ 17 |
| | 62.5 ≤ hs/λ < 67.5 | −37.5 ≤ θ ≤ −32.5 | 14 ≤ hm/λ ≤ 15 |
| | 62.5 ≤ hs/λ < 67.5 | −32.5 ≤ θ ≤ −30 | 15 ≤ hm/λ ≤ 16 |
| | 67.5 ≤ hs/λ < 72.5 | −90 ≤ θ ≤ −87.5 | 32.4 ≤ hm/λ ≤ 67 |
| | 67.5 ≤ hs/λ < 72.5 | −87.5 ≤ θ ≤ −82.5 | 23.8 ≤ hm/λ ≤ 67 |
| | 67.5 ≤ hs/λ < 72.5 | −82.5 ≤ θ ≤ −77.5 | 20.6 ≤ hm/λ ≤ 67 |
| | 67.5 ≤ hs/λ < 72.5 | −77.5 ≤ θ ≤ −72.5 | 15.9 ≤ hm/λ ≤ 31.3 |
| | 67.5 ≤ hs/λ < 72.5 | −72.5 ≤ θ ≤ −67.5 | 14.4 ≤ hm/λ ≤ 19.5 |
| | 67.5 ≤ hs/λ < 72.5 | −67.5 ≤ θ ≤ −62.5 | 14 ≤ hm/λ ≤ 19 |
| | 67.5 ≤ hs/λ < 72.5 | −62.5 ≤ θ ≤ −57.5 | 14 ≤ hm/λ ≤ 18.3 |
| | 67.5 ≤ hs/λ < 72.5 | −57.5 ≤ θ ≤ −52.5 | 14 ≤ hm/λ ≤ 17.8 |
| | 67.5 ≤ hs/λ < 72.5 | −52.5 ≤ θ ≤ −47.5 | 15 ≤ hm/λ ≤ 17.3 |
| | 67.5 ≤ hs/λ < 72.5 | −47.5 ≤ θ ≤ −42.5 | 15 ≤ hm/λ ≤ 16.4 |
| | 67.5 ≤ hs/λ < 72.5 | −42.5 ≤ θ ≤ −37.5 | 14 ≤ hm/λ ≤ 15 |
| | 67.5 ≤ hs/λ < 72.5 | −37.5 ≤ θ ≤ −32.5 | 14 ≤ hm/λ ≤ 15.5 |
| | 67.5 ≤ hs/λ < 72.5 | −32.5 ≤ θ ≤ −30 | 14.5 ≤ hm/λ ≤ 14.6 |
| | 72.5 ≤ hs/λ < 77.5 | −90 ≤ θ ≤ −87.5 | 32.4 ≤ hm/λ ≤ 72 |
| | 72.5 ≤ hs/λ < 77.5 | −87.5 ≤ θ ≤ −82.5 | 21.6 ≤ hm/λ ≤ 72 |
| | 72.5 ≤ hs/λ < 77.5 | −82.5 ≤ θ ≤ −77.5 | 18.25 ≤ hm/λ ≤ 72 |
| | 72.5 ≤ hs/λ < 77.5 | −77.5 ≤ θ ≤ −72.5 | 63.8 ≤ hm/λ ≤ 71 |
| | 72.5 ≤ hs/λ < 77.5 | −77.5 ≤ θ ≤ −72.5 | 17.5 ≤ hm/λ ≤ 31.7 |
| | 72.5 ≤ hs/λ < 77.5 | −77.5 ≤ θ ≤ −72.5 | 14.8 ≤ hm/λ ≤ 16.2 |
| | 72.5 ≤ hs/λ < 77.5 | −72.5 ≤ θ ≤ −67.5 | 14 ≤ hm/λ ≤ 16.5 |
| | 72.5 ≤ hs/λ < 77.5 | −67.5 ≤ θ ≤ −62.5 | 14 ≤ hm/λ ≤ 16.5 |
| | 72.5 ≤ hs/λ < 77.5 | −62.5 ≤ θ ≤ −57.5 | 14 ≤ hm/λ ≤ 15.7 |
| | 72.5 ≤ hs/λ < 77.5 | −57.5 ≤ θ ≤ −52.5 | 14 ≤ hm/λ ≤ 15.1 |
| | 72.5 ≤ hs/λ < 77.5 | −52.5 ≤ θ ≤ −50 | 14 ≤ hm/λ ≤ 14.4 |
| | 77.5 ≤ hs/λ < 82.5 | −90 ≤ θ ≤ −87.5 | 30.2 ≤ hm/λ ≤ 77 |
| | 77.5 ≤ hs/λ < 82.5 | −87.5 ≤ θ ≤ −82.5 | 22.4 ≤ hm/λ ≤ 77 |
| | 77.5 ≤ hs/λ < 82.5 | −82.5 ≤ θ ≤ −77.5 | 19.7 ≤ hm/λ ≤ 77 |
| | 77.5 ≤ hs/λ < 82.5 | −77.5 ≤ θ ≤ −72.5 | 65.7 ≤ hm/λ ≤ 77 |
| | 77.5 ≤ hs/λ < 82.5 | −77.5 ≤ θ ≤ −72.5 | 18.5 ≤ hm/λ ≤ 30.3 |
| | 77.5 ≤ hs/λ < 82.5 | −77.5 ≤ θ ≤ −72.5 | 15.2 ≤ hm/λ ≤ 17.5 |
| | 77.5 ≤ hs/λ < 82.5 | −72.5 ≤ θ ≤ −67.5 | 14 ≤ hm/λ ≤ 17.9 |
| | 77.5 ≤ hs/λ < 82.5 | −67.5 ≤ θ ≤ −62.5 | 14 ≤ hm/λ ≤ 17.5 |
| | 77.5 ≤ hs/λ < 82.5 | −62.5 ≤ θ ≤ −57.5 | 14 ≤ hm/λ ≤ 16.7 |
| | 77.5 ≤ hs/λ < 82.5 | −57.5 ≤ θ ≤ −52.5 | 14 ≤ hm/λ ≤ 16.1 |
| | 77.5 ≤ hs/λ < 82.5 | −52.5 ≤ θ ≤ −47.5 | 14 ≤ hm/λ ≤ 15.5 |
| | 77.5 ≤ hs/λ < 82.5 | −47.5 ≤ θ ≤ −45 | 14 ≤ hm/λ ≤ 14.7 |

TABLE 18

| Metal for the first metal film | Thickness hs/λ (%) of the dielectric film | θ (°) of the Euler angles | Thickness hm/λ (%) of the first metal film |
|---|---|---|---|
| Mo | 82.5 ≤ hs/λ < 87.5 | −90 ≤ θ ≤ −87.5 | 30.3 ≤ hm/λ ≤ 82 |
| | 82.5 ≤ hs/λ < 87.5 | −87.5 ≤ θ ≤ −82.5 | 22 ≤ hm/λ ≤ 82 |
| | 82.5 ≤ hs/λ < 87.5 | −82.5 ≤ θ ≤ −77.5 | 18.7 ≤ hm/λ ≤ 82 |
| | 82.5 ≤ hs/λ < 87.5 | −77.5 ≤ θ ≤ −72.5 | 69 ≤ hm/λ ≤ 82 |
| | 82.5 ≤ hs/λ < 87.5 | −77.5 ≤ θ ≤ −72.5 | 18 ≤ hm/λ ≤ 30.1 |
| | 82.5 ≤ hs/λ < 87.5 | −77.5 ≤ θ ≤ −72.5 | 15 ≤ hm/λ ≤ 17 |
| | 82.5 ≤ hs/λ < 87.5 | −72.5 ≤ θ ≤ −67.5 | 14 ≤ hm/λ ≤ 16.9 |
| | 82.5 ≤ hs/λ < 87.5 | −67.5 ≤ θ ≤ −62.5 | 14 ≤ hm/λ ≤ 16.9 |
| | 82.5 ≤ hs/λ < 87.5 | −62.5 ≤ θ ≤ −57.5 | 14 ≤ hm/λ ≤ 16.2 |
| | 82.5 ≤ hs/λ < 87.5 | −57.5 ≤ θ ≤ −52.5 | 14 ≤ hm/λ ≤ 15.5 |
| | 82.5 ≤ hs/λ < 87.5 | −52.5 ≤ θ ≤ −47.5 | 14 ≤ hm/λ ≤ 14.9 |
| | 82.5 ≤ hs/λ < 87.5 | −47.5 ≤ θ ≤ −45 | 14 ≤ hm/λ ≤ 14.1 |
| | 87.5 ≤ hs/λ < 92.5 | −90 ≤ θ ≤ −87.5 | 30.2 ≤ hm/λ ≤ 87 |
| | 87.5 ≤ hs/λ < 92.5 | −87.5 ≤ θ ≤ −82.5 | 21.7 ≤ hm/λ ≤ 87 |
| | 87.5 ≤ hs/λ < 92.5 | −82.5 ≤ θ ≤ −77.5 | 18.3 ≤ hm/λ ≤ 87 |
| | 87.5 ≤ hs/λ < 92.5 | −77.5 ≤ θ ≤ −72.5 | 72.2 ≤ hm/λ ≤ 87 |
| | 87.5 ≤ hs/λ < 92.5 | −77.5 ≤ θ ≤ −72.5 | 17.5 ≤ hm/λ ≤ 29.8 |
| | 87.5 ≤ hs/λ < 92.5 | −77.5 ≤ θ ≤ −72.5 | 15.8 ≤ hm/λ ≤ 16.2 |
| | 87.5 ≤ hs/λ < 92.5 | −72.5 ≤ θ ≤ −67.5 | 14 ≤ hm/λ ≤ 16.5 |
| | 87.5 ≤ hs/λ < 92.5 | −67.5 ≤ θ ≤ −62.5 | 14 ≤ hm/λ ≤ 16.4 |
| | 87.5 ≤ hs/λ < 92.5 | −62.5 ≤ θ ≤ −57.5 | 14 ≤ hm/λ ≤ 15.7 |
| | 87.5 ≤ hs/λ < 92.5 | −57.5 ≤ θ ≤ −52.5 | 14 ≤ hm/λ ≤ 15 |
| | 87.5 ≤ hs/λ < 92.5 | −52.5 ≤ θ ≤ −50 | 14 ≤ hm/λ ≤ 14.4 |
| | 92.5 ≤ hs/λ ≤ 97.5 | −90 ≤ θ ≤ −87.5 | 30 ≤ hm/λ ≤ 92 |
| | 92.5 ≤ hs/λ ≤ 97.5 | −87.5 ≤ θ ≤ −82.5 | 21.4 ≤ hm/λ ≤ 92 |
| | 92.5 ≤ hs/λ ≤ 97.5 | −82.5 ≤ θ ≤ −77.5 | 18 ≤ hm/λ ≤ 92 |
| | 92.5 ≤ hs/λ ≤ 97.5 | −77.5 ≤ θ ≤ −72.5 | 75.4 ≤ hm/λ ≤ 92 |
| | 92.5 ≤ hs/λ ≤ 97.5 | −77.5 ≤ θ ≤ −72.5 | 17 ≤ hm/λ ≤ 29.5 |
| | 92.5 ≤ hs/λ ≤ 97.5 | −77.5 ≤ θ ≤ −72.5 | 14 ≤ hm/λ ≤ 16.7 |
| | 92.5 ≤ hs/λ ≤ 97.5 | −72.5 ≤ θ ≤ −67.5 | 14 ≤ hm/λ ≤ 16 |
| | 92.5 ≤ hs/λ ≤ 97.5 | −67.5 ≤ θ ≤ −62.5 | 14 ≤ hm/λ ≤ 15.4 |
| | 92.5 ≤ hs/λ ≤ 97.5 | −62.5 ≤ θ ≤ −57.5 | 14 ≤ hm/λ ≤ 14.6 |
| | 92.5 ≤ hs/λ ≤ 97.5 | −57.5 ≤ θ ≤ −55 | 14 ≤ hm/λ ≤ 14.1 |

As shown in FIGS. 3, 6, and 7, the acoustic velocity decreases with increasing thickness of the first metal film. In the present preferred embodiment, an elastic wave device is able to be further reduced in size, as in the Preferred Embodiment 1, because the thickness of the first metal film falls within the range in Tables 11 to 18.

The following specifically demonstrates, by using FIGS. 23 to 57, described below, that the present preferred embodiment effectively reduces unwanted waves.

Figure 23:
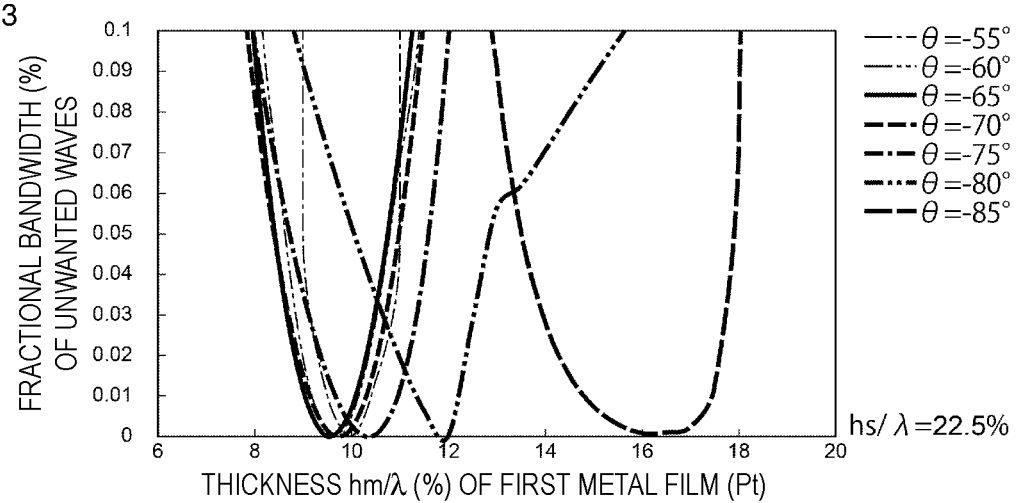
FIG. 23 illustrates the relationship between the thickness of a first metal film made of Pt, θ of the Euler angles (0°, θ, 0°), and the fractional bandwidth of unwanted waves in a Preferred Embodiment 2 of the present invention when the thickness hs/λ of the first dielectric film is about 22.5%.
Figure 24:
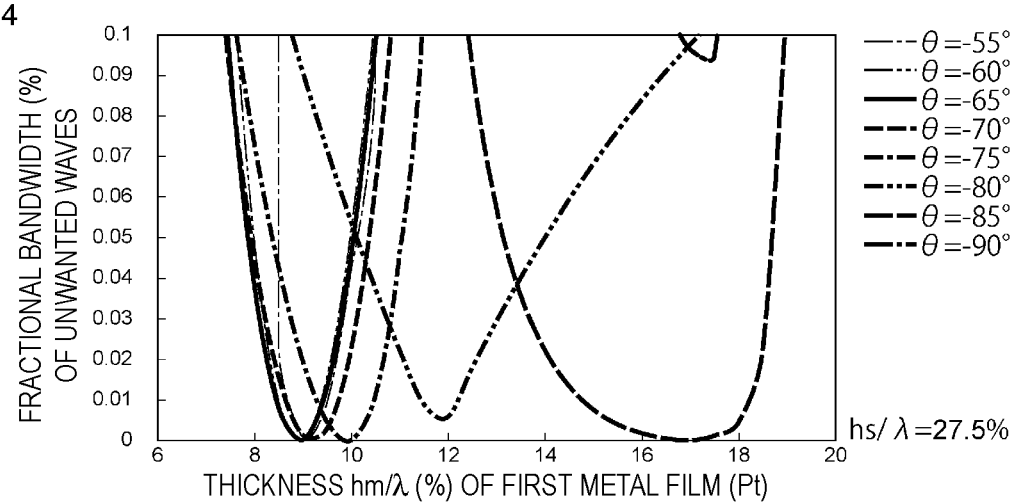
FIG. 24 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 27.5%.
Figure 25:
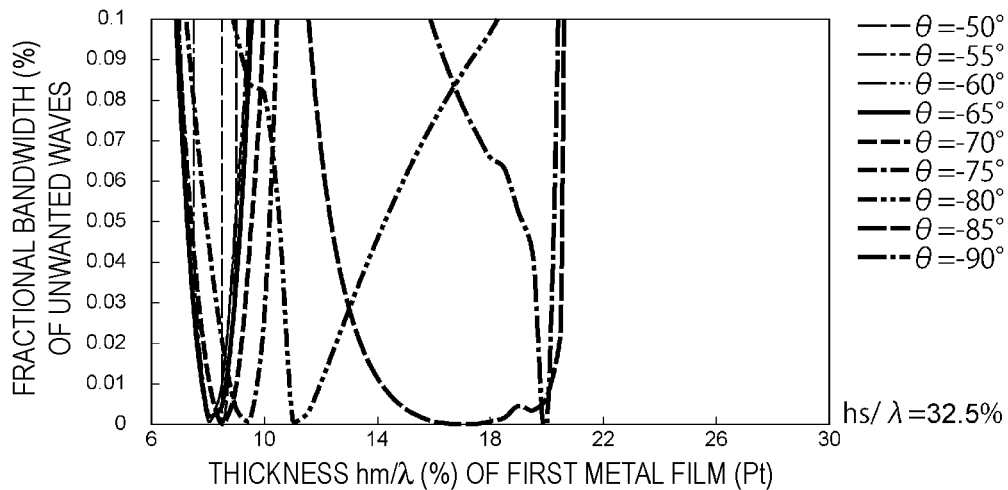
FIG. 25 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 32.5%.
Figure 26:
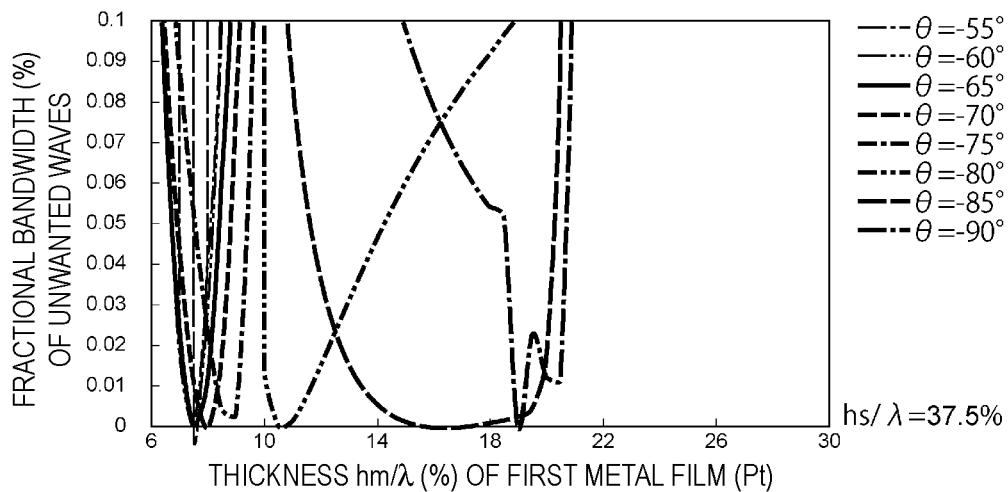
FIG. 26 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 37.5%.
Figure 27:
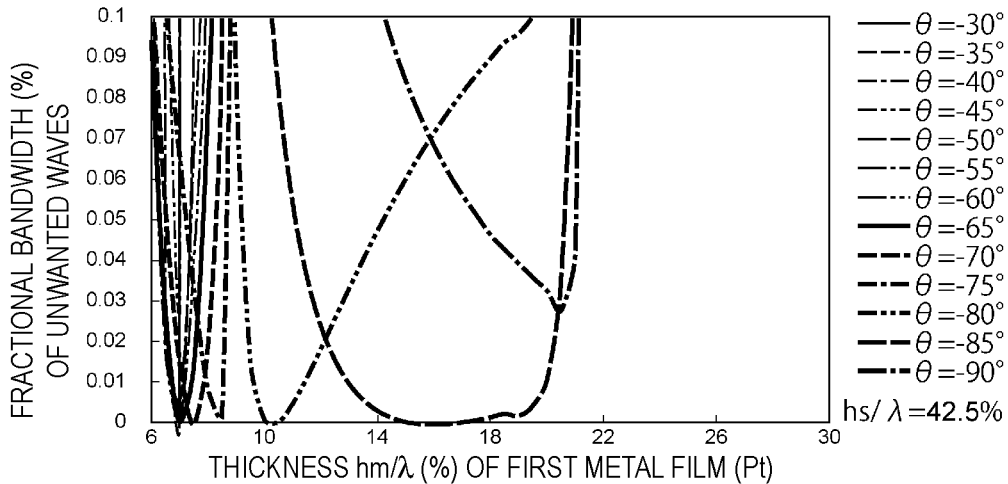
FIG. 27 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 42.5%.
Figure 28:
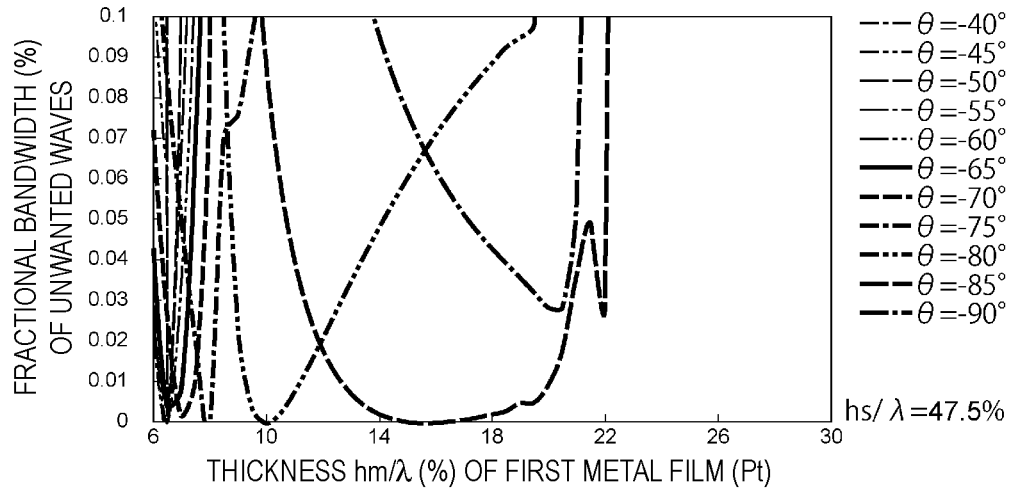
FIG. 28 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 47.5%.
Figure 29:
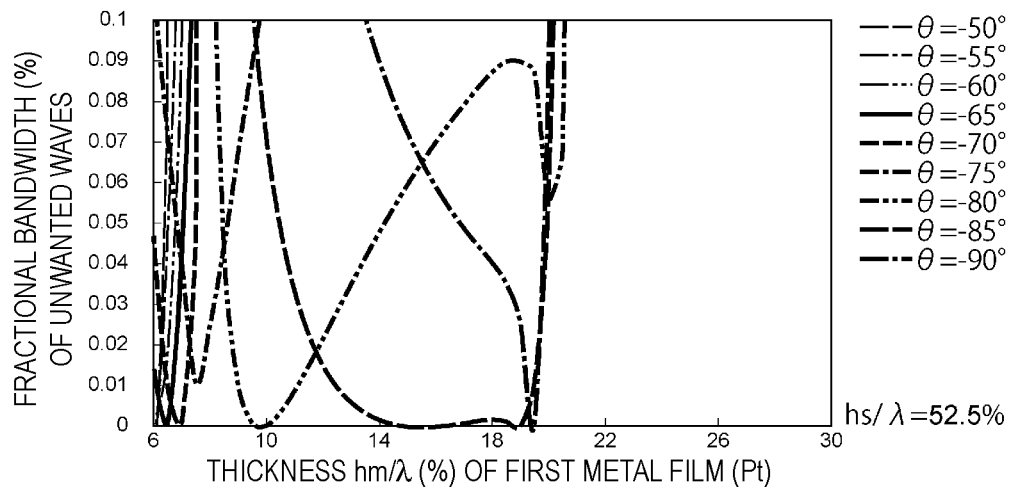
FIG. 29 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 52.5%.
Figure 30:
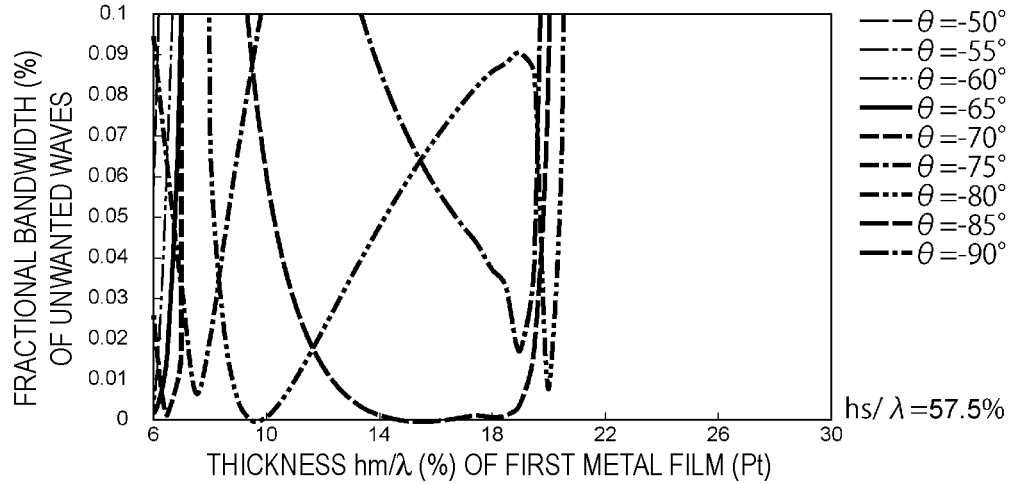
FIG. 30 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 57.5%.
Figure 31:
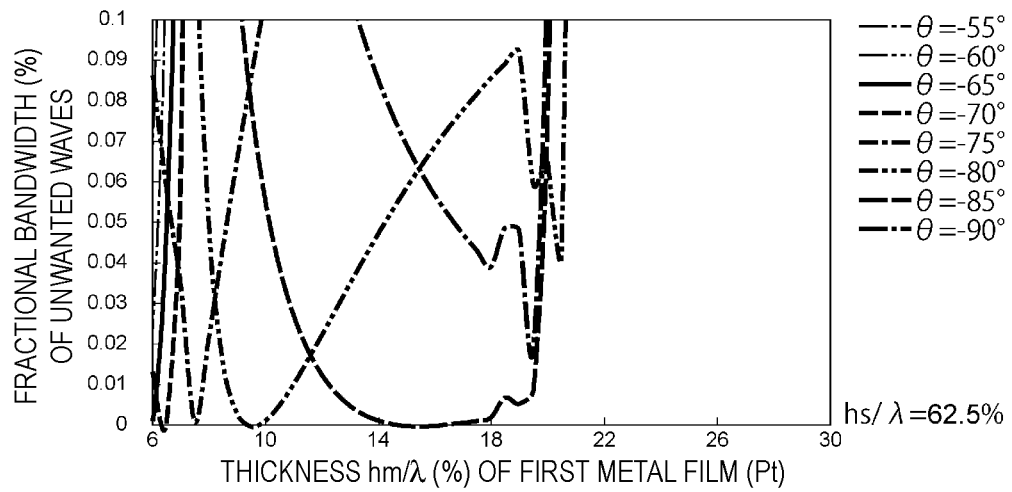
FIG. 31 illustrates the relationship between the thickness of a first metal film made of Pt, θ of the Euler angles (0°, θ, 0°), and the fractional bandwidth of unwanted waves in the Preferred Embodiment 2 of the present invention when the thickness hs/λ of the first dielectric film is about 62.5%.

FIG. 23 illustrates the relationship between the thickness of a first metal film made of Pt, θ of the Euler angles (0°, θ, 0°), and the fractional bandwidth of unwanted waves when the thickness hs/λ of the first dielectric film is about 22.5%. Likewise, FIGS. 24 to 31 illustrate the relationship between the thickness of a first metal film made of Pt, θ of the Euler angles (0°, θ, 0°), and the fractional bandwidth of unwanted waves when the thickness hs/λ of the first dielectric film is from about 27.5% to about 62.5%.

As shown in FIGS. 23 to 31, the present preferred embodiment maintains the fractional bandwidth of unwanted waves to about 0.1% or less, thus effectively reducing unwanted waves, if the first metal film is made of Pt.

Figure 32:
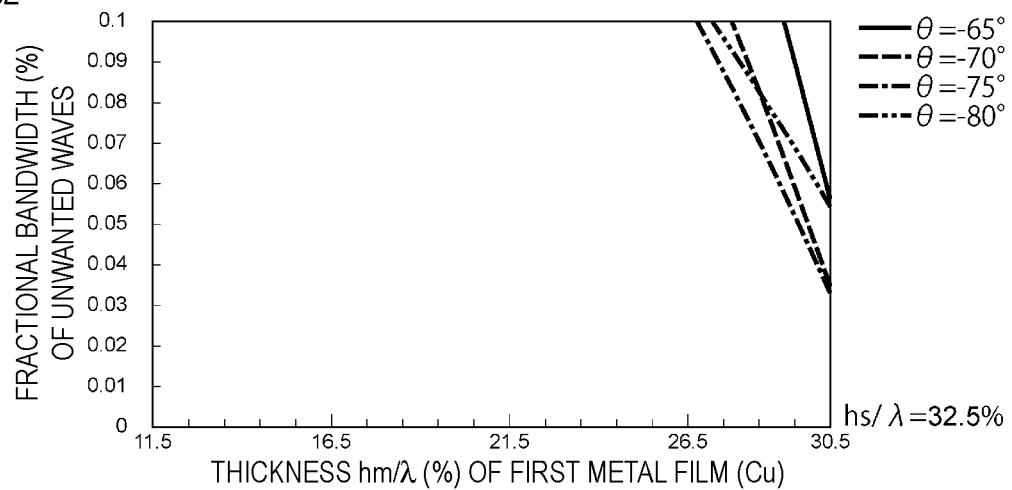
FIG. 32 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 32.5%.
Figure 33:
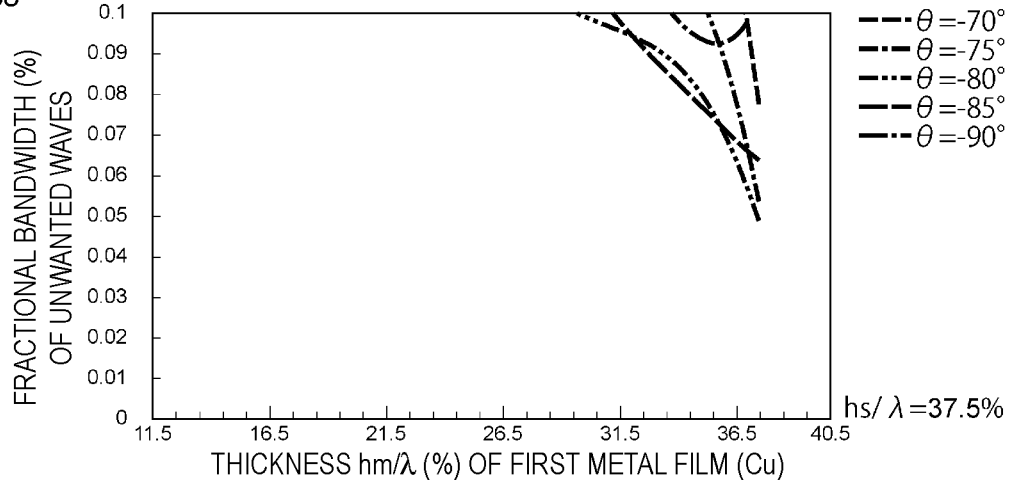
FIG. 33 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 37.5%.
Figure 34:
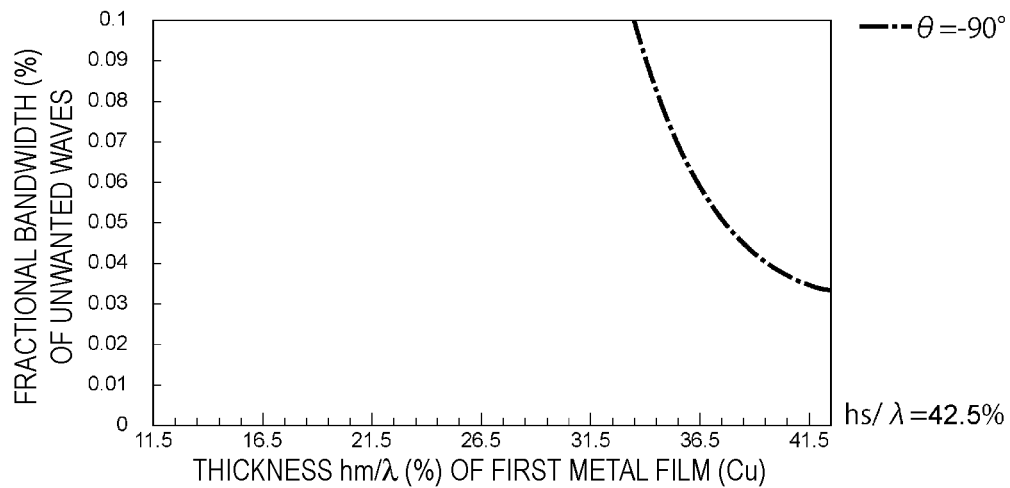
FIG. 34 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 42.5%.
Figure 35:
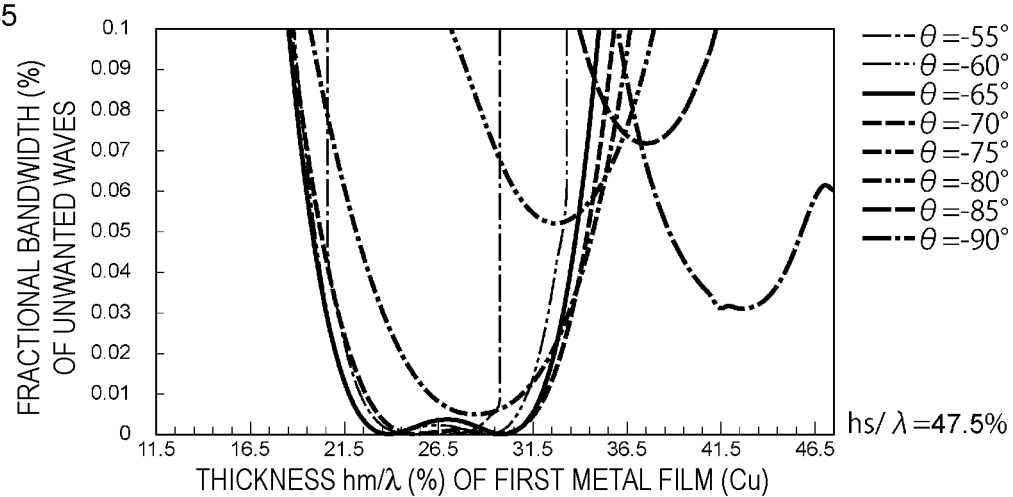
FIG. 35 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 47.5%.
Figure 36:
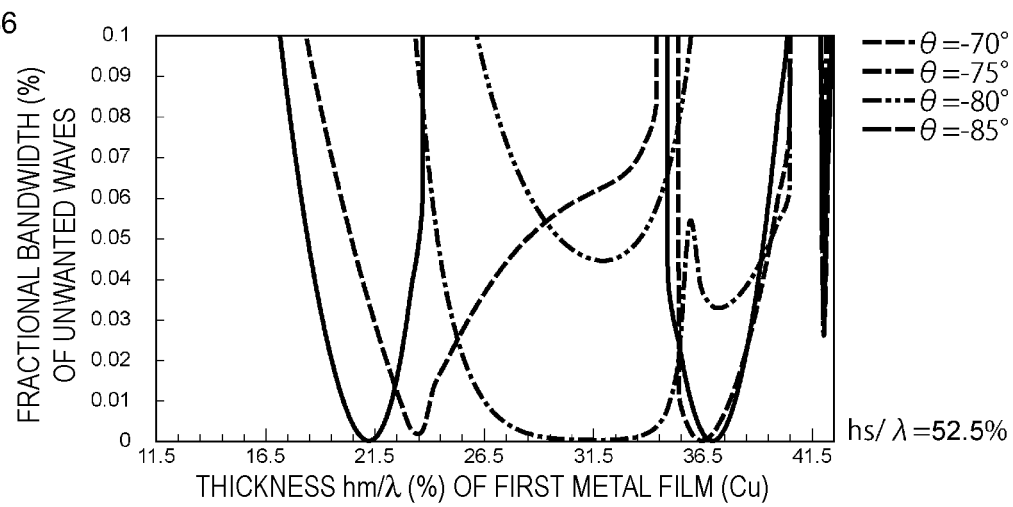
FIG. 36 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 52.5%.
Figure 37:
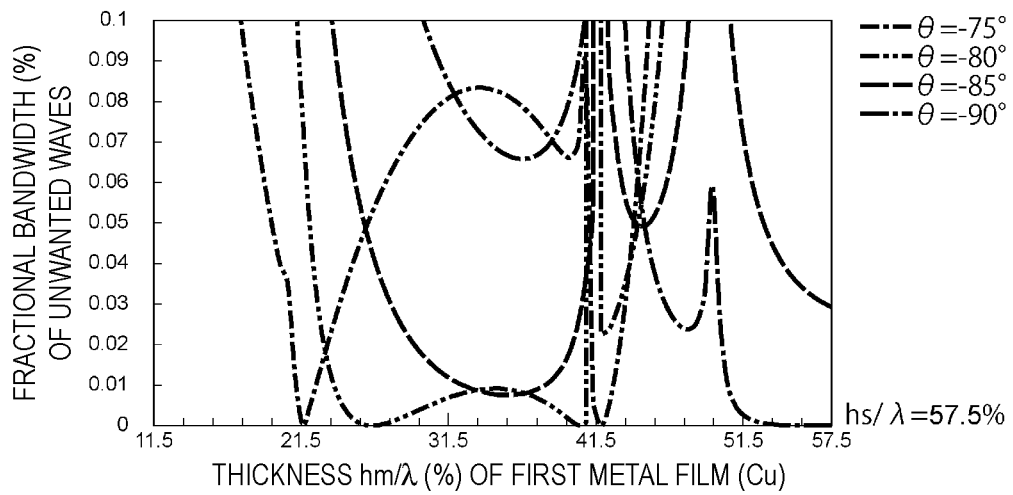
FIG. 37 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 57.5%.
Figure 38:
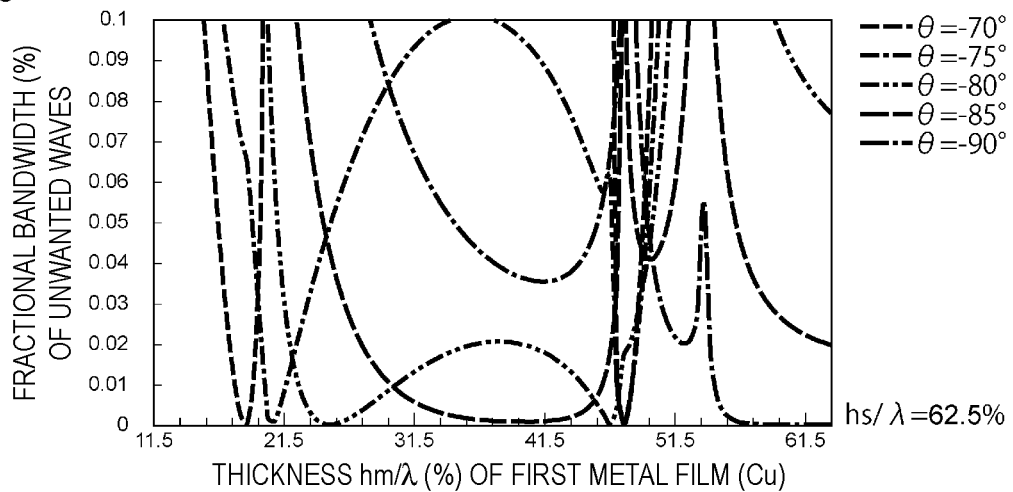
FIG. 38 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 62.5%.
Figure 39:
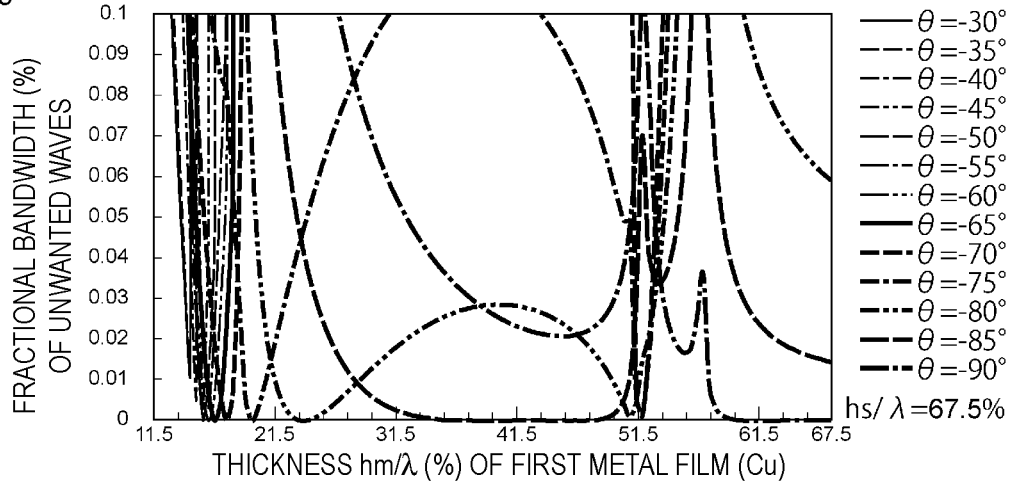
FIG. 39 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 67.5%.
Figure 40:
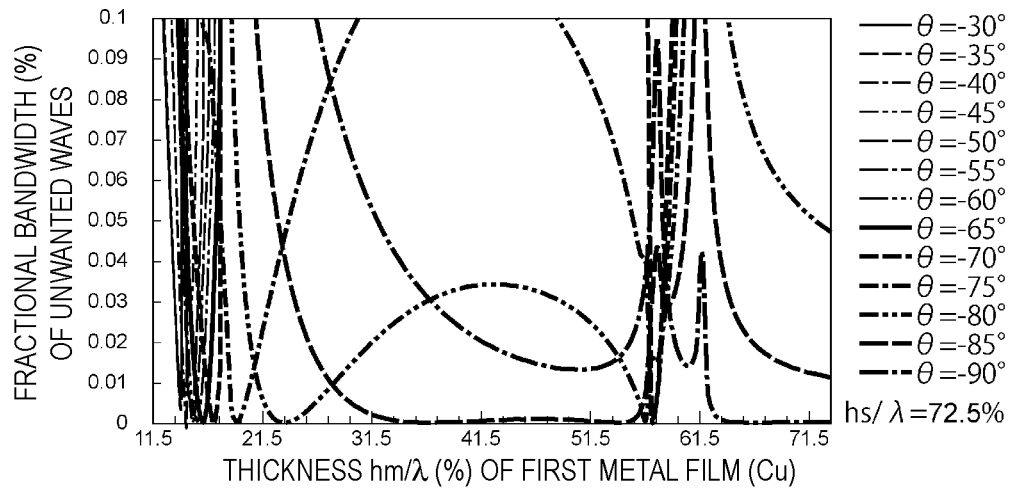
FIG. 40 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 72.5%.
Figure 41:
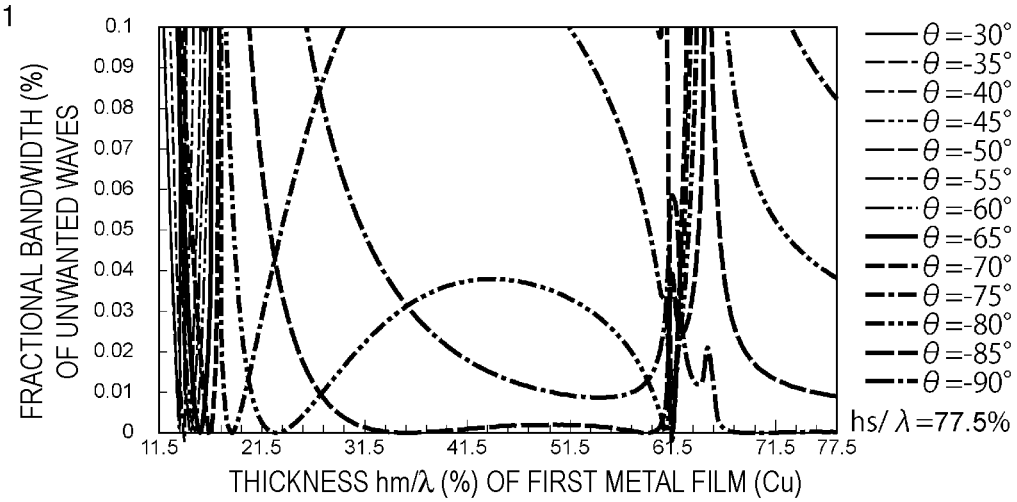
FIG. 41 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 77.5%.
Figure 42:
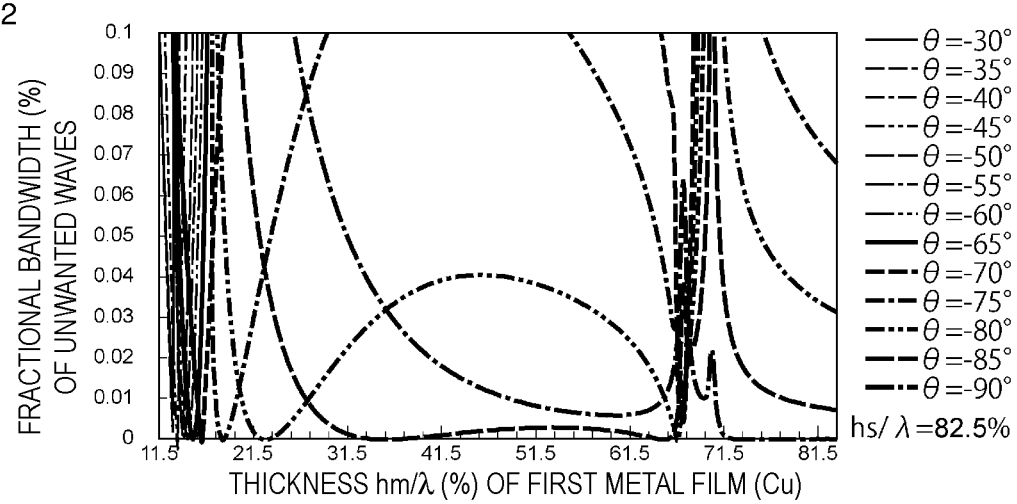
FIG. 42 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 82.5%.
Figure 43:
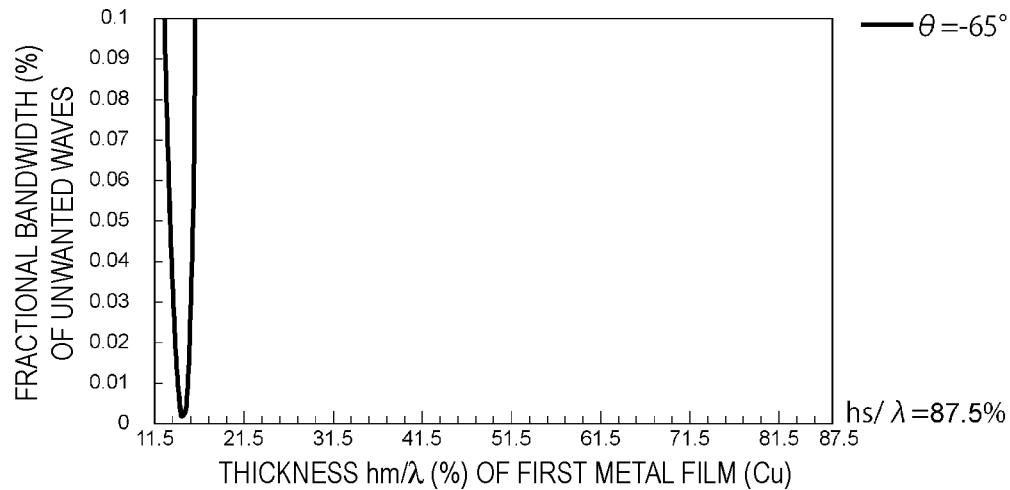
FIG. 43 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 87.5%.
Figure 44:
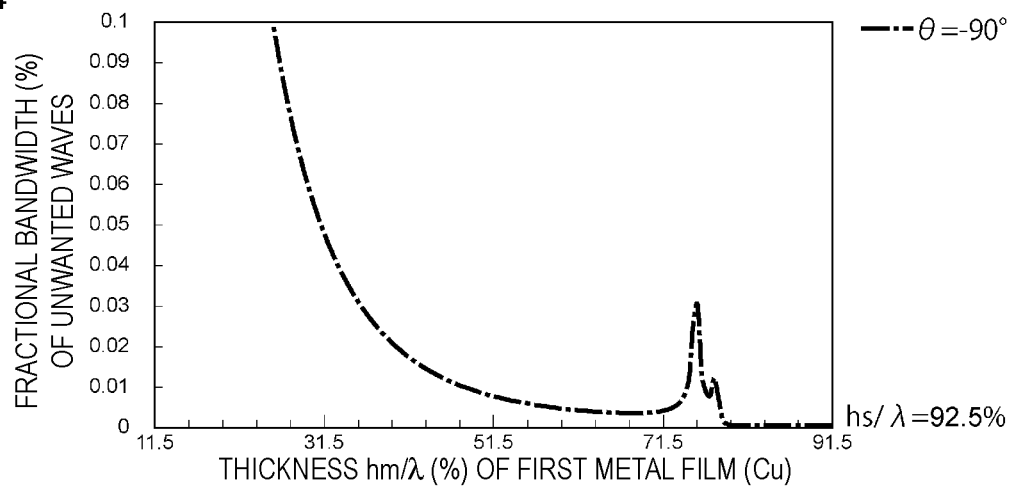
FIG. 44 illustrates the relationship between the thickness of a first metal film made of Cu, θ of the Euler angles (0°, θ, 0°), and the fractional bandwidth of unwanted waves in the Preferred Embodiment 2 of the present invention when the thickness hs/λ of the first dielectric film is about 92.5%.

FIG. 32 illustrates the relationship between the thickness of a first metal film made of Cu, θ of the Euler angles (0°, θ, 0°), and the fractional bandwidth of unwanted waves when the thickness hs/λ of the first dielectric film is about 32.5%. Likewise, FIGS. 33 to 44 illustrate the relationship between the thickness of a first metal film made of Cu, θ of the Euler angles (0°, θ, 0°), and the fractional bandwidth of unwanted waves when the thickness hs/λ of the first dielectric film is from about 37.5% to about 92.5%.

As shown in FIGS. 32 to 44, the present preferred embodiment maintains the fractional bandwidth of unwanted waves to about 0.1% or less, thus effectively reducing unwanted waves, even if the first metal film is made of Cu.

Figure 45:
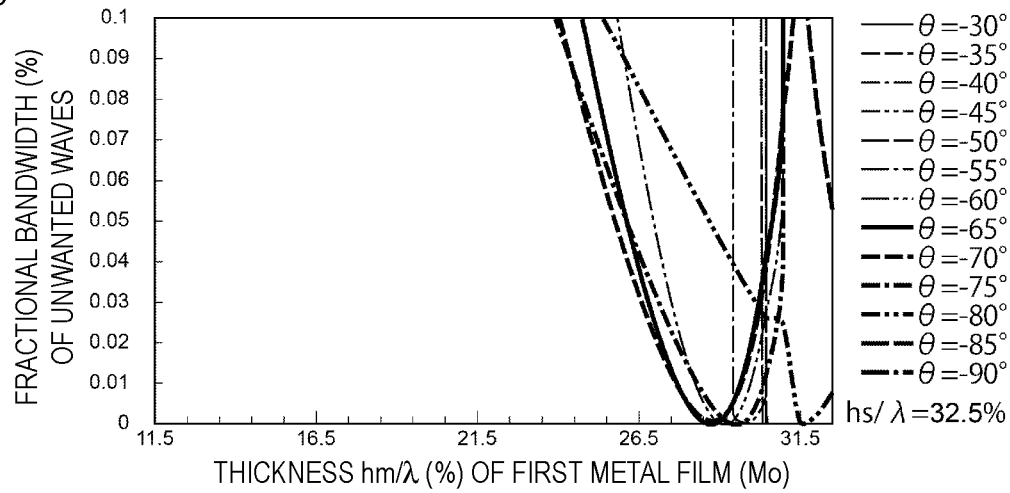
FIG. 45 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 32.5%.
Figure 46:
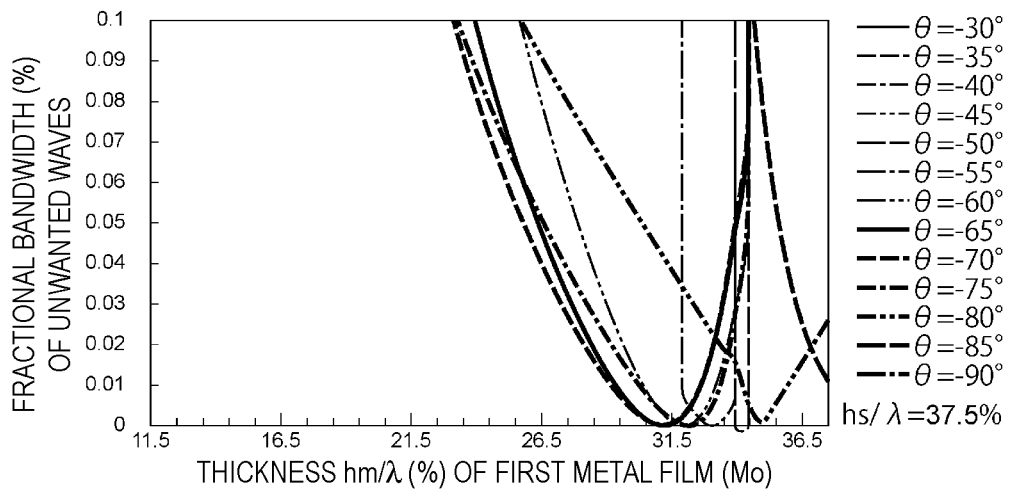
FIG. 46 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 37.5%.
Figure 47:
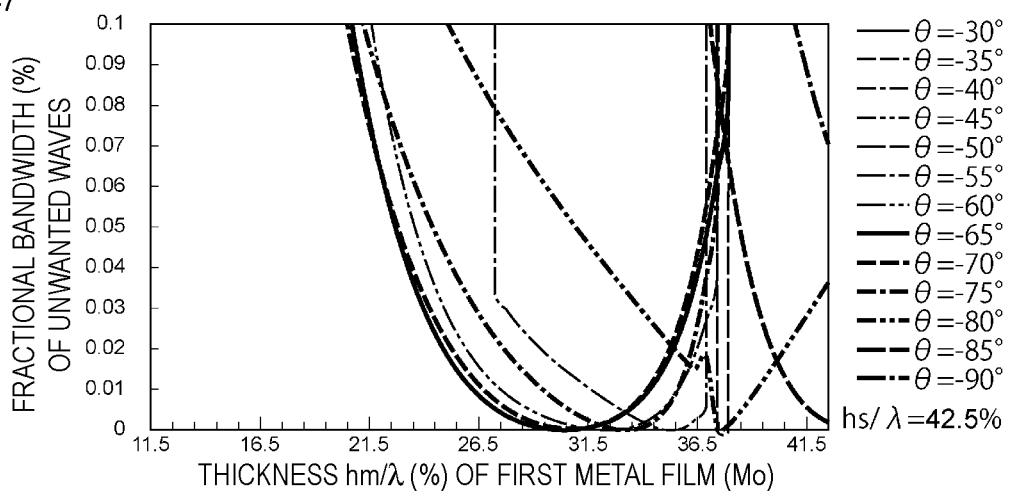
FIG. 47 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 42.5%.
Figure 48:
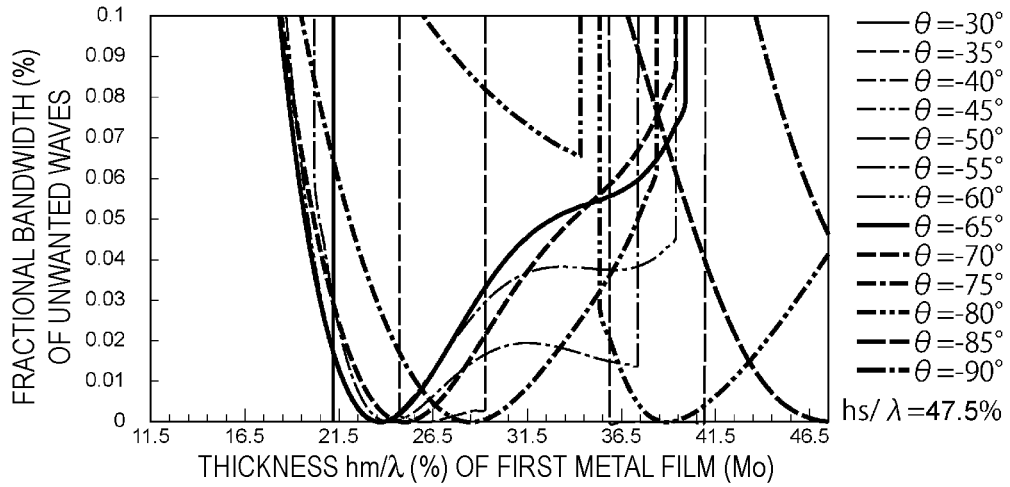
FIG. 48 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 47.5%.
Figure 49:
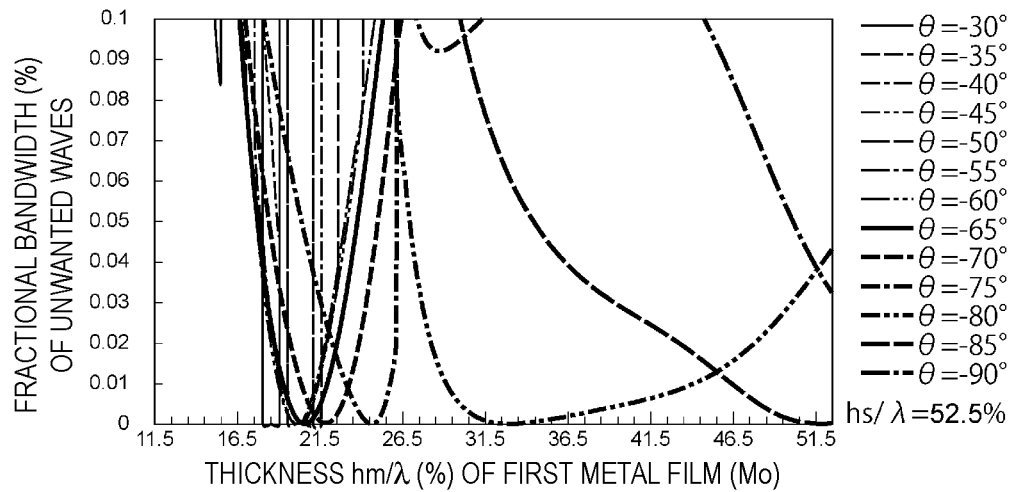
FIG. 49 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 52.5%.
Figure 50:
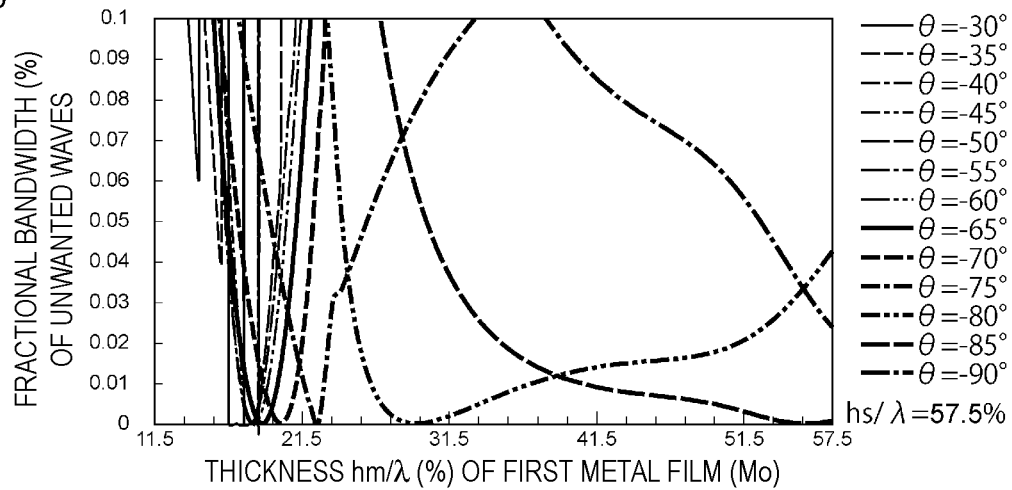
FIG. 50 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 57.5%.
Figure 51:
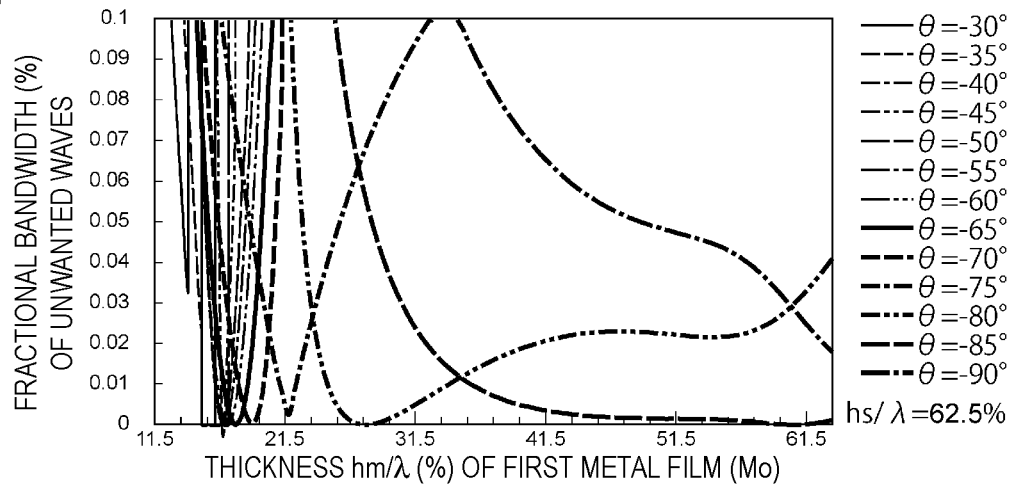
FIG. 51 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 62.5%.
Figure 52:
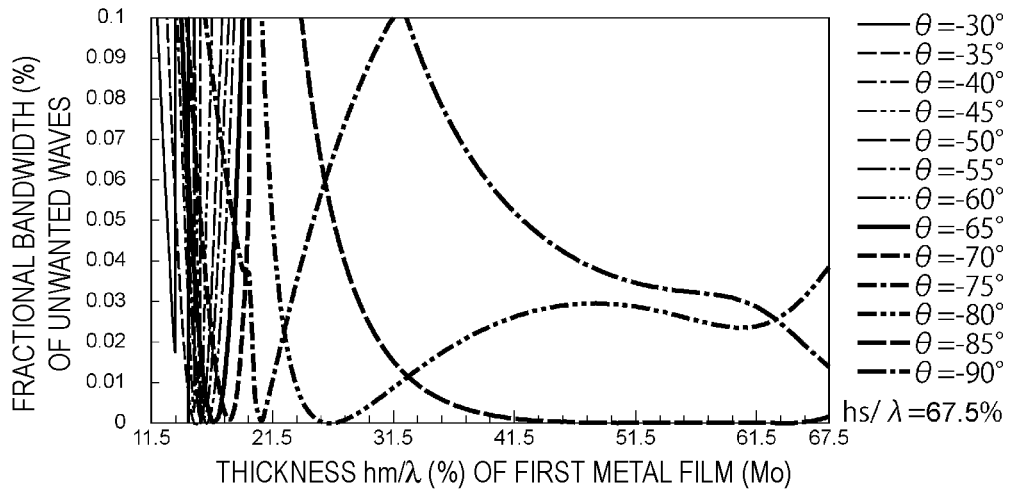
FIG. 52 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 67.5%.
Figure 53:
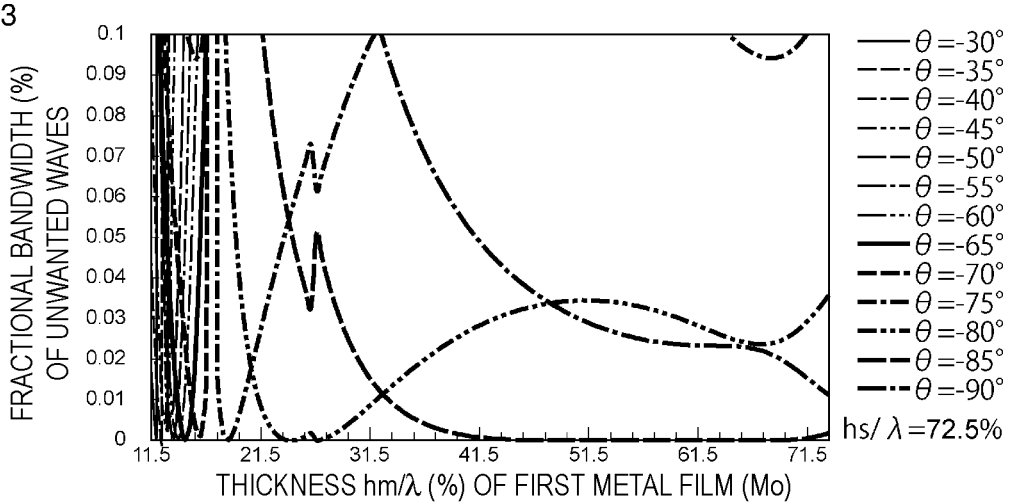
FIG. 53 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 72.5%.
Figure 54:
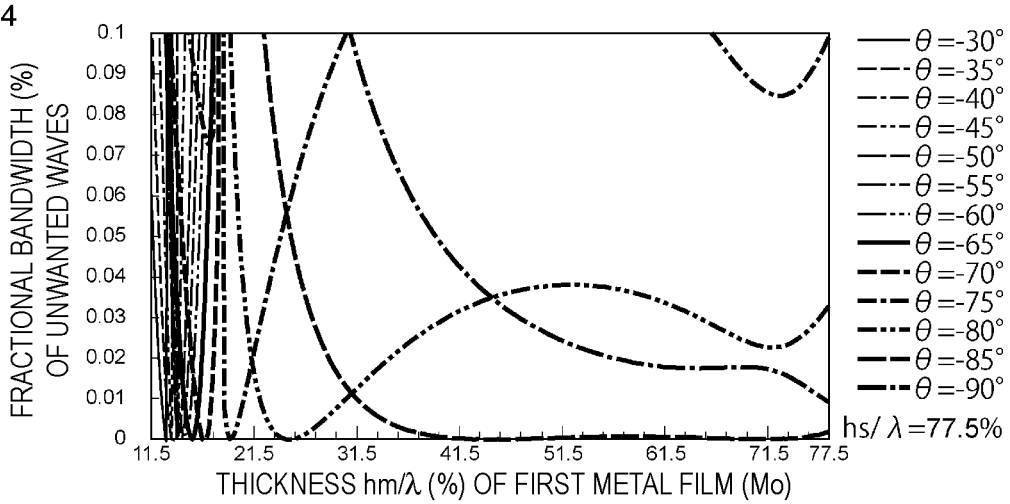
FIG. 54 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 77.5%.
Figure 55:
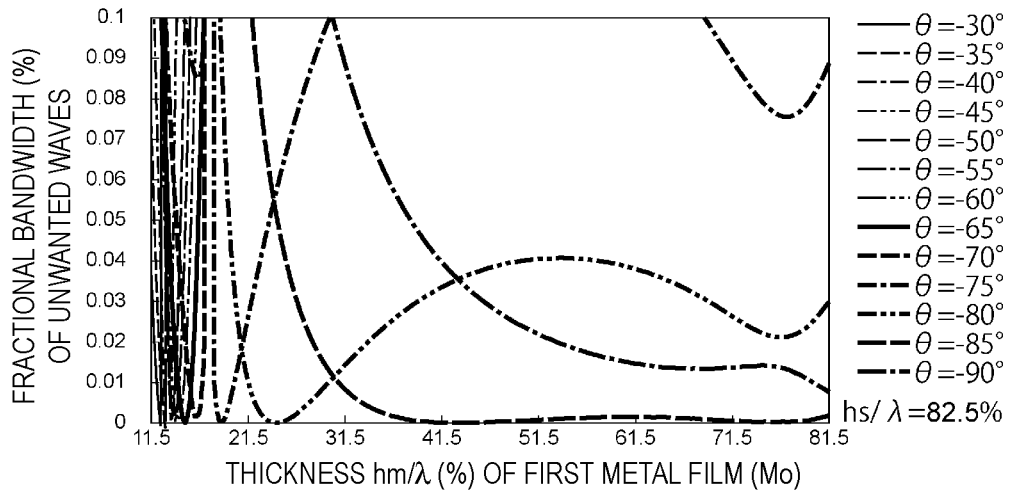
FIG. 55 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 82.5%.
Figure 56:
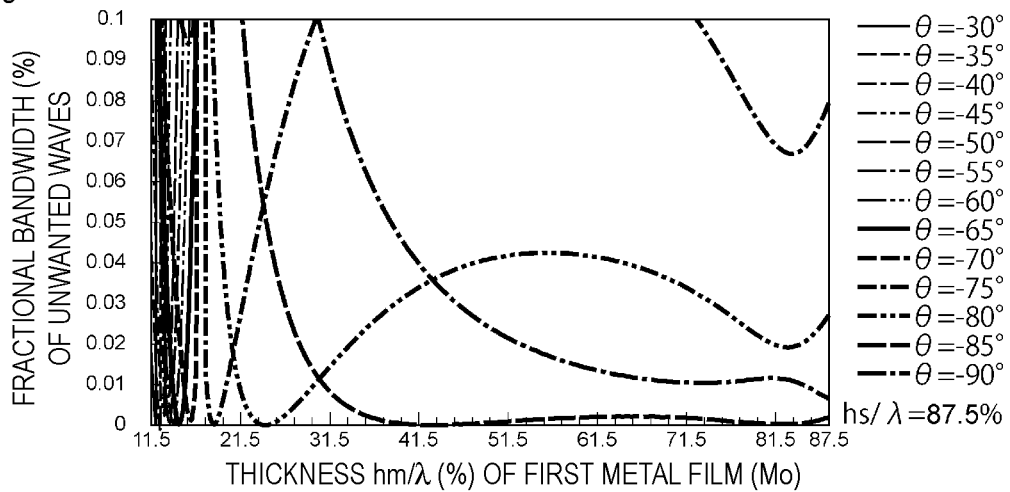
FIG. 56 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 87.5%.
Figure 57:
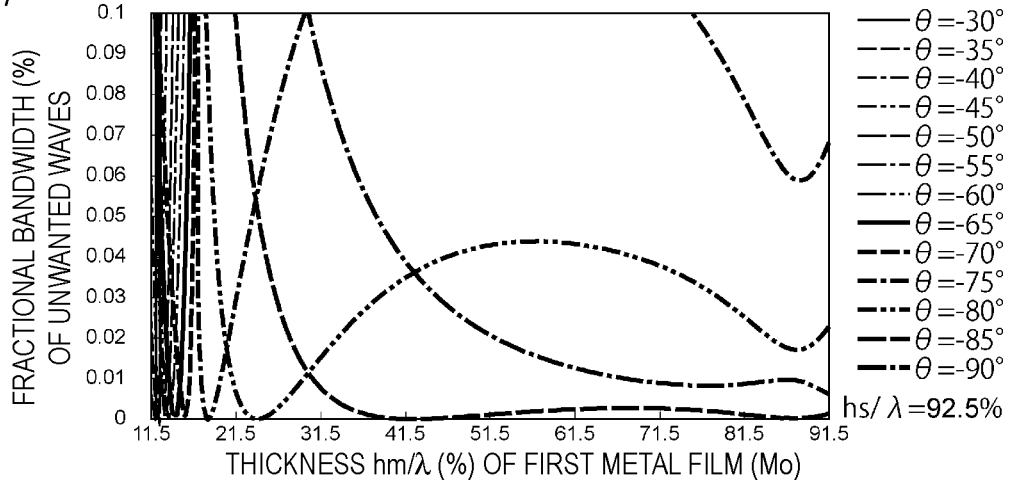
FIG. 57 illustrates the relationship between the thickness of a first metal film made of Mo, θ of the Euler angles (0°, θ, 0°), and the fractional bandwidth of unwanted waves in the Preferred Embodiment 2 of the present invention when the thickness hs/λ of the first dielectric film is about 92.5%.

FIG. 45 illustrates the relationship between the thickness of a first metal film made of Mo, θ of the Euler angles (0°, θ, 0°), and the fractional bandwidth of unwanted waves when the thickness hs/λ of the first dielectric film is about 32.5%. Likewise, FIGS. 46 to 57 illustrate the relationship between the thickness of a first metal film made of Mo, θ of the Euler angles (0°, θ, 0°), and the fractional bandwidth of unwanted waves when the thickness hs/λ of the first dielectric film is from about 37.5% to about 92.5%.

As shown in FIGS. 45 to 57, the present preferred embodiment maintains the fractional bandwidth of unwanted waves to about 0.1% or less, thus effectively reducing unwanted waves, even if the first metal film is made of Mo.

The present preferred embodiment provides the same or substantially the same advantages even if the Euler angles (φ, θ, ψ) of the piezoelectric substrate are Euler angles (0°±5°, θ, 0°±5°).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate made of $LiNbO_3$;
IDT electrodes on the piezoelectric substrate; and
a first dielectric film provided on the piezoelectric substrate to cover the IDT electrodes and made of a silicon oxide; wherein
the IDT electrodes include a first metal film made of one metal selected from Pt, Cu, and Mo;
Euler angles (φ, θ, ψ) of the piezoelectric substrate are Euler angles (0°±5°, −90°≤θ≤31 27.5, 0°±5°; and
when a wavelength, determined by a finger pitch of the IDT electrodes, is denoted by λ, a thickness of the first metal film normalized by the wavelength λ is denoted by hm/λ (%), and a thickness of the first dielectric film normalized by the wavelength λ is denoted by hs/λ (%), the metal for the first metal film, the thickness hm/λ (%), the thickness hs/λ (%), and θ of the Euler angles (φ, θ, ψ) of the piezoelectric substrate match any of combinations listed in Tables 2 to 9 below:

TABLE 2

| Metal for the first metal film | Thickness hs/λ (%) of the dielectric film | θ (°) of the Euler angles | Thickness hm/λ (%) of the first metal film |
|---|---|---|---|
| Pt | 22.5 ≤ hs/λ < 27.5 | −85 ≤ θ ≤ −82.5 | 13 ≤ hm/λ ≤ 18 |
|  | 22.5 ≤ hs/λ < 27.5 | −82.5 ≤ θ ≤ −77.5 | 8.8 ≤ hm/λ ≤ 15.7 |
|  | 22.5 ≤ hs/λ < 27.5 | −77.5 ≤ θ ≤ −72.5 | 8 ≤ hm/λ ≤ 12 |
|  | 22.5 ≤ hs/λ < 27.5 | −72.5 ≤ θ ≤ −67.5 | 7.8 ≤ hm/λ ≤ 11.5 |
|  | 22.5 ≤ hs/λ < 27.5 | −67.5 ≤ θ ≤ −62.5 | 8 ≤ hm/λ ≤ 11.25 |
|  | 22.5 ≤ hs/λ < 27.5 | −62.5 ≤ θ ≤ −57.5 | 8.2 ≤ hm/λ ≤ 11.4 |
|  | 22.5 ≤ hs/λ < 27.5 | −57.5 ≤ θ ≤ −55 | 8.2 ≤ hm/λ ≤ 11.4 |
|  | 27.5 ≤ hs/λ < 32.5 | −90 ≤ θ ≤ −87.5 | 16.8 ≤ hm/λ ≤ 17.6 |
|  | 27.5 ≤ hs/λ < 32.5 | −87.5 ≤ θ ≤ −82.5 | 12.5 ≤ hm/λ ≤ 19 |
|  | 27.5 ≤ hs/λ < 32.5 | −82.5 ≤ θ ≤ −77.5 | 8.8 ≤ hm/λ ≤ 17.2 |
|  | 27.5 ≤ hs/λ < 32.5 | −77.5 ≤ θ ≤ −72.5 | 7.7 ≤ hm/λ ≤ 11.5 |
|  | 27.5 ≤ hs/λ < 32.5 | −72.5 ≤ θ ≤ −67.5 | 7.4 ≤ hm/λ ≤ 10.8 |
|  | 27.5 ≤ hs/λ < 32.5 | −67.5 ≤ θ ≤ −62.5 | 7.45 ≤ hm/λ ≤ 10.5 |
|  | 27.5 ≤ hs/λ < 32.5 | −62.5 ≤ θ ≤ −57.5 | 7.7 ≤ hm/λ ≤ 10.5 |
|  | 27.5 ≤ hs/λ < 32.5 | −57.5 ≤ θ ≤ −55 | 8.5 ≤ hm/λ ≤ 10.5 |
|  | 32.5 ≤ hs/λ < 37.5 | −90 ≤ θ ≤ −87.5 | 15.8 ≤ hm/λ ≤ 20.4 |
|  | 32.5 ≤ hs/λ < 37.5 | −87.5 ≤ θ ≤ −82.5 | 11.6 ≤ hm/λ ≤ 20.6 |
|  | 32.5 ≤ hs/λ < 37.5 | −82.5 ≤ θ ≤ −77.5 | 8.8 ≤ hm/λ ≤ 18.25 |
|  | 32.5 ≤ hs/λ < 37.5 | −77.5 ≤ θ ≤ −72.5 | 7.25 ≤ hm/λ ≤ 10.4 |
|  | 32.5 ≤ hs/λ < 37.5 | −72.5 ≤ θ ≤ −67.5 | 6.9 ≤ hm/λ ≤ 10 |
|  | 32.5 ≤ hs/λ < 37.5 | −67.5 ≤ θ ≤ −62.5 | 6.9 ≤ hm/λ ≤ 9.5 |
|  | 32.5 ≤ hs/λ < 37.5 | −62.5 ≤ θ ≤ −57.5 | 7 ≤ hm/λ ≤ 9.4 |
|  | 32.5 ≤ hs/λ < 37.5 | −57.5 ≤ θ ≤ −52.5 | 7.5 ≤ hm/λ ≤ 9.4 |
|  | 32.5 ≤ hs/λ < 37.5 | −52.5 ≤ θ ≤ −50 | 8.5 ≤ hm/λ ≤ 9 |
|  | 37.5 ≤ hs/λ < 42.5 | −90 ≤ θ ≤ −87.5 | 14.9 ≤ hm/λ ≤ 20.9 |

TABLE 2-continued

| Metal for the first metal film | Thickness hs/λ (%) of the dielectric film | θ (°) of the Euler angles | Thickness hm/λ (%) of the first metal film |
|---|---|---|---|
| | 37.5 ≤ hs/λ < 42.5 | −87.5 ≤ θ ≤ −82.5 | 10.8 ≤ hm/λ ≤ 20.5 |
| | 37.5 ≤ hs/λ < 42.5 | −82.5 ≤ θ ≤ −77.5 | 10 ≤ hm/λ ≤ 18.8 |
| | 37.5 ≤ hs/λ < 42.5 | −77.5 ≤ θ ≤ −72.5 | 6.9 ≤ hm/λ ≤ 9.6 |
| | 37.5 ≤ hs/λ < 42.5 | −72.5 ≤ θ ≤ −67.5 | 6.5 ≤ hm/λ ≤ 9.2 |
| | 37.5 ≤ hs/λ < 42.5 | −67.5 ≤ θ ≤ −62.5 | 6.4 ≤ hm/λ ≤ 8.75 |
| | 37.5 ≤ hs/λ < 42.5 | −62.5 ≤ θ ≤ −57.5 | 6.5 ≤ hm/λ ≤ 8.5 |
| | 37.5 ≤ hs/λ < 42.5 | −57.5 ≤ θ ≤ −52.5 | 7 ≤ hm/λ ≤ 8.4 |
| | 37.5 ≤ hs/λ < 42.5 | −52.5 ≤ θ ≤ −50 | 7.5 ≤ hm/λ ≤ 8 |
| | 42.5 ≤ hs/λ < 47.5 | −90 ≤ θ ≤ −87.5 | 14.25 ≤ hm/λ ≤ 21.1 |
| | 42.5 ≤ hs/λ < 47.5 | −87.5 ≤ θ ≤ −82.5 | 10.3 ≤ hm/λ ≤ 20.8 |
| | 42.5 ≤ hs/λ < 47.5 | −82.5 ≤ θ ≤ −77.5 | 9 ≤ hm/λ ≤ 19.5 |
| | 42.5 ≤ hs/λ < 47.5 | −77.5 ≤ θ ≤ −72.5 | 6.6 ≤ hm/λ ≤ 8.75 |
| | 42.5 ≤ hs/λ < 47.5 | −72.5 ≤ θ ≤ −67.5 | 6.1 ≤ hm/λ ≤ 8.5 |
| | 42.5 ≤ hs/λ < 47.5 | −67.5 ≤ θ ≤ −62.5 | 6 ≤ hm/λ ≤ 8.1 |
| | 42.5 ≤ hs/λ < 47.5 | −62.5 ≤ θ ≤ −57.5 | 6 ≤ hm/λ ≤ 7.9 |
| | 42.5 ≤ hs/λ < 47.5 | −57.5 ≤ θ ≤ −52.5 | 6.5 ≤ hm/λ ≤ 7.7 |
| | 42.5 ≤ hs/λ < 47.5 | −52.5 ≤ θ ≤ −47.5 | 7 ≤ hm/λ ≤ 7.5 |
| | 42.5 ≤ hs/λ < 47.5 | −47.5 ≤ θ ≤ −42.5 | 6.7 ≤ hm/λ ≤ 7 |
| | 42.5 ≤ hs/λ < 47.5 | −42.5 ≤ θ ≤ −40 | 6.2 ≤ hm/λ ≤ 7 |
| | 47.5 ≤ hs/λ < 52.5 | −90 ≤ θ ≤ −87.5 | 13.8 ≤ hm/λ ≤ 21.2 |
| | 47.5 ≤ hs/λ < 52.5 | −87.5 ≤ θ ≤ −82.5 | 9.9 ≤ hm/λ ≤ 22.1 |
| | 47.5 ≤ hs/λ < 52.5 | −82.5 ≤ θ ≤ −77.5 | 8.5 ≤ hm/λ ≤ 19.5 |
| | 47.5 ≤ hs/λ < 52.5 | −77.5 ≤ θ ≤ −72.5 | 6.35 ≤ hm/λ ≤ 9.6 |
| | 47.5 ≤ hs/λ < 52.5 | −72.5 ≤ θ ≤ −67.5 | 6 ≤ hm/λ ≤ 8 |
| | 47.5 ≤ hs/λ < 52.5 | −67.5 ≤ θ ≤ −62.5 | 6 ≤ hm/λ ≤ 7.7 |
| | 47.5 ≤ hs/λ < 52.5 | −62.5 ≤ θ ≤ −57.5 | 6 ≤ hm/λ ≤ 7.4 |
| | 47.5 ≤ hs/λ < 52.5 | −57.5 ≤ θ ≤ −52.5 | 6 ≤ hm/λ ≤ 7.2 |
| | 47.5 ≤ hs/λ < 52.5 | −52.5 ≤ θ ≤ −47.5 | 6.5 ≤ hm/λ ≤ 7 |
| | 47.5 ≤ hs/λ < 52.5 | −47.5 ≤ θ ≤ −42.5 | 6.2 ≤ hm/λ ≤ 6.5 |
| | 47.5 ≤ hs/λ < 52.5 | −42.5 ≤ θ ≤ −40 | 6 ≤ hm/λ ≤ 6.5 |

TABLE 3

| Metal for the first metal film | Thickness hs/λ (%) of the dielectric film | θ (°) of the Euler angles | Thickness hm/λ (%) of the first metal film |
|---|---|---|---|
| Pt | 52.5 ≤ hs/λ < 57.5 | −90 ≤ θ ≤ −87.5 | 13.6 ≤ hm/λ ≤ 20 |
| | 52.5 ≤ hs/λ < 57.5 | −87.5 ≤ θ ≤ −82.5 | 9.6 ≤ hm/λ ≤ 20.1 |
| | 52.5 ≤ hs/λ < 57.5 | −82.5 ≤ θ ≤ −77.5 | 8.25 ≤ hm/λ ≤ 20.5 |
| | 52.5 ≤ hs/λ < 57.5 | −77.5 ≤ θ ≤ −72.5 | 6.2 ≤ hm/λ ≤ 9.7 |
| | 52.5 ≤ hs/λ < 57.5 | −72.5 ≤ θ ≤ −67.5 | 6 ≤ hm/λ ≤ 7.5 |
| | 52.5 ≤ hs/λ < 57.5 | −67.5 ≤ θ ≤ −62.5 | 6 ≤ hm/λ ≤ 7.3 |
| | 52.5 ≤ hs/λ < 57.5 | −62.5 ≤ θ ≤ −57.5 | 6 ≤ hm/λ ≤ 7 |
| | 52.5 ≤ hs/λ < 57.5 | −57.5 ≤ θ ≤ −52.5 | 6 ≤ hm/λ ≤ 6.7 |
| | 52.5 ≤ hs/λ < 57.5 | −52.5 ≤ θ ≤ −50 | 6 ≤ hm/λ ≤ 6.5 |
| | 57.5 ≤ hs/λ < 62.5 | −90 ≤ θ ≤ −87.5 | 13.2 ≤ hm/λ ≤ 19.7 |
| | 57.5 ≤ hs/λ < 62.5 | −87.5 ≤ θ ≤ −82.5 | 9.4 ≤ hm/λ ≤ 20 |
| | 57.5 ≤ hs/λ < 62.5 | −82.5 ≤ θ ≤ −77.5 | 8 ≤ hm/λ ≤ 20.5 |
| | 57.5 ≤ hs/λ < 62.5 | −77.5 ≤ θ ≤ −72.5 | 6 ≤ hm/λ ≤ 9.7 |
| | 57.5 ≤ hs/λ < 62.5 | −72.5 ≤ θ ≤ −67.5 | 6 ≤ hm/λ ≤ 7 |
| | 57.5 ≤ hs/λ < 62.5 | −67.5 ≤ θ ≤ −62.5 | 6 ≤ hm/λ ≤ 7 |
| | 57.5 ≤ hs/λ < 62.5 | −62.5 ≤ θ ≤ −57.5 | 6 ≤ hm/λ ≤ 6.6 |
| | 57.5 ≤ hs/λ < 62.5 | −57.5 ≤ θ ≤ −52.5 | 6 ≤ hm/λ ≤ 6.5 |
| | 57.5 ≤ hs/λ < 62.5 | −52.5 ≤ θ ≤ −50 | 6 ≤ hm/λ ≤ 6.2 |
| | 62.5 ≤ hs/λ ≤ 67.5 | −90 ≤ θ ≤ −87.5 | 13.3 ≤ hm/λ ≤ 19.9 |
| | 62.5 ≤ hs/λ ≤ 67.5 | −87.5 ≤ θ ≤ −82.5 | 9.2 ≤ hm/λ ≤ 20 |
| | 62.5 ≤ hs/λ ≤ 67.5 | −82.5 ≤ θ ≤ −77.5 | 7.7 ≤ hm/λ ≤ 20.6 |
| | 62.5 ≤ hs/λ ≤ 67.5 | −77.5 ≤ θ ≤ −72.5 | 6 ≤ hm/λ ≤ 9.8 |
| | 62.5 ≤ hs/λ ≤ 67.5 | −72.5 ≤ θ ≤ −67.5 | 6 ≤ hm/λ ≤ 7 |
| | 62.5 ≤ hs/λ ≤ 67.5 | −67.5 ≤ θ ≤ −62.5 | 6 ≤ hm/λ ≤ 6.7 |
| | 62.5 ≤ hs/λ ≤ 67.5 | −62.5 ≤ θ ≤ −57.5 | 6 ≤ hm/λ ≤ 6.4 |
| | 62.5 ≤ hs/λ ≤ 67.5 | −57.5 ≤ θ ≤ −55 | 6 ≤ hm/λ ≤ 6.1 |

TABLE 4

| Metal for the first metal film | Thickness hs/λ (%) of the dielectric film | θ (°) of the Euler angles | Thickness hm/λ (%) of the first metal film |
|---|---|---|---|
| Cu | 32.5 ≤ hs/λ < 37.5 | −90 ≤ θ ≤ −87.5 | 30.7 ≤ hm/λ ≤ 31.8 |
| | 32.5 ≤ hs/λ < 37.5 | −87.5 ≤ θ ≤ −82.5 | 30.6 ≤ hm/λ ≤ 32 |
| | 32.5 ≤ hs/λ < 37.5 | −82.5 ≤ θ ≤ −77.5 | 26.8 ≤ hm/λ ≤ 32 |
| | 32.5 ≤ hs/λ < 37.5 | −77.5 ≤ θ ≤ −72.5 | 26.4 ≤ hm/λ ≤ 32 |
| | 32.5 ≤ hs/λ < 37.5 | −72.5 ≤ θ ≤ −67.5 | 27.4 ≤ hm/λ ≤ 32 |
| | 32.5 ≤ hs/λ < 37.5 | −67.5 ≤ θ ≤ −62.5 | 28.8 ≤ hm/λ ≤ 32 |
| | 37.5 ≤ hs/λ < 42.5 | −90 ≤ θ ≤ −87.5 | 33.3 ≤ hm/λ ≤ 36.7 |
| | 37.5 ≤ hs/λ < 42.5 | −87.5 ≤ θ ≤ −82.5 | 30.3 ≤ hm/λ ≤ 37 |
| | 37.5 ≤ hs/λ < 42.5 | −82.5 ≤ θ ≤ −77.5 | 29.2 ≤ hm/λ ≤ 37 |
| | 37.5 ≤ hs/λ < 42.5 | −77.5 ≤ θ ≤ −72.5 | 34.8 ≤ hm/λ ≤ 37 |
| | 37.5 ≤ hs/λ < 42.5 | −72.5 ≤ θ ≤ −67.5 | 36.4 ≤ hm/λ ≤ 37 |
| | 42.5 ≤ hs/λ < 47.5 | −90 ≤ θ ≤ −87.5 | 33.2 ≤ hm/λ ≤ 42 |
| | 42.5 ≤ hs/λ < 47.5 | −87.5 ≤ θ ≤ −82.5 | 31.5 ≤ hm/λ ≤ 42 |
| | 42.5 ≤ hs/λ < 47.5 | −82.5 ≤ θ ≤ −77.5 | 25.6 ≤ hm/λ ≤ 33.9 |
| | 42.5 ≤ hs/λ < 47.5 | −77.5 ≤ θ ≤ −72.5 | 21.9 ≤ hm/λ ≤ 32.2 |
| | 42.5 ≤ hs/λ < 47.5 | −72.5 ≤ θ ≤ −67.5 | 21.1 ≤ hm/λ ≤ 30.4 |
| | 42.5 ≤ hs/λ < 47.5 | −67.5 ≤ θ ≤ −62.5 | 21.5 ≤ hm/λ ≤ 29.5 |
| | 42.5 ≤ hs/λ < 47.5 | −62.5 ≤ θ ≤ −60 | 22.9 ≤ hm/λ ≤ 27 |
| | 47.5 ≤ hs/λ < 52.5 | −90 ≤ θ ≤ −87.5 | 35.7 ≤ hm/λ ≤ 47 |
| | 47.5 ≤ hs/λ < 52.5 | −87.5 ≤ θ ≤ −82.5 | 33.7 ≤ hm/λ ≤ 40.3 |
| | 47.5 ≤ hs/λ < 52.5 | −82.5 ≤ θ ≤ −77.5 | 27 ≤ hm/λ ≤ 37.5 |
| | 47.5 ≤ hs/λ < 52.5 | −77.5 ≤ θ ≤ −72.5 | 19.6 ≤ hm/λ ≤ 36.3 |
| | 47.5 ≤ hs/λ < 52.5 | −72.5 ≤ θ ≤ −67.5 | 18.6 ≤ hm/λ ≤ 35.5 |
| | 47.5 ≤ hs/λ < 52.5 | −67.5 ≤ θ ≤ −62.5 | 18.5 ≤ hm/λ ≤ 34.6 |
| | 47.5 ≤ hs/λ < 52.5 | −62.5 ≤ θ ≤ −57.5 | 18.8 ≤ hm/λ ≤ 33 |
| | 47.5 ≤ hs/λ < 52.5 | −57.5 ≤ θ ≤ −52.5 | 20.5 ≤ hm/λ ≤ 29.5 |
| | 52.5 ≤ hs/λ < 57.5 | −85 ≤ θ ≤ −82.5 | 48.95 ≤ hm/λ ≤ 49.1 |
| | 52.5 ≤ hs/λ < 57.5 | −85 ≤ θ ≤ −82.5 | 46.45 ≤ hm/λ ≤ 46.6 |
| | 52.5 ≤ hs/λ < 57.5 | −85 ≤ θ ≤ −82.5 | 43.92 ≤ hm/λ ≤ 44.15 |
| | 52.5 ≤ hs/λ < 57.5 | −85 ≤ θ ≤ −82.5 | 41.4 ≤ hm/λ ≤ 41.65 |
| | 52.5 ≤ hs/λ < 57.5 | −85 ≤ θ ≤ −82.5 | 26 ≤ hm/λ ≤ 35.6 |
| | 52.5 ≤ hs/λ < 57.5 | −82.5 ≤ θ ≤ −77.5 | 49.3 ≤ hm/λ ≤ 49 |
| | 52.5 ≤ hs/λ < 57.5 | −82.5 ≤ θ ≤ −77.5 | 46.45 ≤ hm/λ ≤ 46.8 |
| | 52.5 ≤ hs/λ < 57.5 | −82.5 ≤ θ ≤ −77.5 | 39.2 ≤ hm/λ ≤ 44.15 |
| | 52.5 ≤ hs/λ < 57.5 | −82.5 ≤ θ ≤ −77.5 | 41.4 ≤ hm/λ ≤ 41.7 |
| | 52.5 ≤ hs/λ < 57.5 | −82.5 ≤ θ ≤ −77.5 | 23.2 ≤ hm/λ ≤ 40 |
| | 52.5 ≤ hs/λ < 57.5 | −77.5 ≤ θ ≤ −72.5 | 44 ≤ hm/λ ≤ 44.3 |
| | 52.5 ≤ hs/λ < 57.5 | −77.5 ≤ θ ≤ −72.5 | 41.4 ≤ hm/λ ≤ 41.8 |
| | 52.5 ≤ hs/λ < 57.5 | −77.5 ≤ θ ≤ −72.5 | 35 ≤ hm/λ ≤ 40 |
| | 52.5 ≤ hs/λ < 57.5 | −77.5 ≤ θ ≤ −72.5 | 18.3 ≤ hm/λ ≤ 34 |
| | 52.5 ≤ hs/λ < 57.5 | −72.5 ≤ θ ≤ −67.5 | 44 ≤ hm/λ ≤ 44.5 |
| | 52.5 ≤ hs/λ < 57.5 | −72.5 ≤ θ ≤ −67.5 | 41.4 ≤ hm/λ ≤ 41.9 |
| | 52.5 ≤ hs/λ < 57.5 | −72.5 ≤ θ ≤ −67.5 | 34.5 ≤ hm/λ ≤ 39.9 |
| | 52.5 ≤ hs/λ < 57.5 | −72.5 ≤ θ ≤ −67.5 | 17.1 ≤ hm/λ ≤ 23.5 |
| | 52.5 ≤ hs/λ < 57.5 | −67.5 ≤ θ ≤ −62.5 | 44.5 ≤ hm/λ ≤ 44.6 |
| | 52.5 ≤ hs/λ < 57.5 | −67.5 ≤ θ ≤ −62.5 | 42 ≤ hm/λ ≤ 42.1 |
| | 52.5 ≤ hs/λ < 57.5 | −67.5 ≤ θ ≤ −62.5 | 34.5 ≤ hm/λ ≤ 39.2 |
| | 52.5 ≤ hs/λ < 57.5 | −67.5 ≤ θ ≤ −62.5 | 16.9 ≤ hm/λ ≤ 23 |
| | 52.5 ≤ hs/λ < 57.5 | −62.5 ≤ θ ≤ −57.5 | 34.5 ≤ hm/λ ≤ 38 |
| | 52.5 ≤ hs/λ < 57.5 | −62.5 ≤ θ ≤ −57.5 | 17 ≤ hm/λ ≤ 22.5 |
| | 52.5 ≤ hs/λ < 57.5 | −57.5 ≤ θ ≤ −52.5 | 35 ≤ hm/λ ≤ 36 |
| | 52.5 ≤ hs/λ < 57.5 | −57.5 ≤ θ ≤ −52.5 | 17.5 ≤ hm/λ ≤ 22 |
| | 52.5 ≤ hs/λ < 57.5 | −52.5 ≤ θ ≤ −47.5 | 19.5 ≤ hm/λ ≤ 21 |
| | 57.5 ≤ hs/λ < 62.5 | −90 ≤ θ ≤ −87.5 | 43.1 ≤ hm/λ ≤ 57 |
| | 57.5 ≤ hs/λ < 62.5 | −90 ≤ θ ≤ −87.5 | 29.6 ≤ hm/λ ≤ 40.4 |
| | 57.5 ≤ hs/λ < 62.5 | −87.5 ≤ θ ≤ −82.5 | 50.2 ≤ hm/λ ≤ 57 |
| | 57.5 ≤ hs/λ < 62.5 | −87.5 ≤ θ ≤ −82.5 | 42 ≤ hm/λ ≤ 47.4 |
| | 57.5 ≤ hs/λ < 62.5 | −87.5 ≤ θ ≤ −82.5 | 23.5 ≤ hm/λ ≤ 41 |
| | 57.5 ≤ hs/λ < 62.5 | −82.5 ≤ θ ≤ −77.5 | 41.5 ≤ hm/λ ≤ 45.6 |
| | 57.5 ≤ hs/λ < 62.5 | −82.5 ≤ θ ≤ −77.5 | 21.1 ≤ hm/λ ≤ 40.5 |
| | 57.5 ≤ hs/λ < 62.5 | −77.5 ≤ θ ≤ −72.5 | 17.3 ≤ hm/λ ≤ 44.7 |
| | 57.5 ≤ hs/λ < 62.5 | −72.5 ≤ θ ≤ −67.5 | 40.4 ≤ hm/λ ≤ 44.2 |
| | 57.5 ≤ hs/λ < 62.5 | −72.5 ≤ θ ≤ −67.5 | 16 ≤ hm/λ ≤ 20.5 |
| | 57.5 ≤ hs/λ < 62.5 | −67.5 ≤ θ ≤ −62.5 | 15.7 ≤ hm/λ ≤ 20.5 |
| | 57.5 ≤ hs/λ < 62.5 | −62.5 ≤ θ ≤ −57.5 | 15.7 ≤ hm/λ ≤ 20 |
| | 57.5 ≤ hs/λ < 62.5 | −57.5 ≤ θ ≤ −52.5 | 16 ≤ hm/λ ≤ 19.5 |
| | 57.5 ≤ hs/λ < 62.5 | −52.5 ≤ θ ≤ −47.5 | 17.5 ≤ hm/λ ≤ 19 |
| | 57.5 ≤ hs/λ < 62.5 | −47.5 ≤ θ ≤ −42.5 | 17.7 ≤ hm/λ ≤ 18 |
| | 57.5 ≤ hs/λ < 62.5 | −42.5 ≤ θ ≤ −37.5 | 16.1 ≤ hm/λ ≤ 17 |
| | 57.5 ≤ hs/λ < 62.5 | −37.5 ≤ θ ≤ −32.5 | 15.2 ≤ hm/λ ≤ 16 |
| | 57.5 ≤ hs/λ < 62.5 | −32.5 ≤ θ ≤ −27.5 | 14.2 ≤ hm/λ ≤ 15 |

TABLE 5

| Metal for the first metal film | Thickness hs/λ (%) of the dielectric film | θ (°) of the Euler angles | Thickness hm/λ (%) of the first metal film |
|---|---|---|---|
| Cu | 62.5 ≤ hs/λ < 67.5 | −90 ≤ θ ≤ −87.5 | 47.4 ≤ hm/λ ≤ 62 |
| | 62.5 ≤ hs/λ < 67.5 | −90 ≤ θ ≤ −87.5 | 27.7 ≤ hm/λ ≤ 46.2 |
| | 62.5 ≤ hs/λ < 67.5 | −87.5 ≤ θ ≤ −82.5 | 53.3 ≤ hm/λ ≤ 62 |
| | 62.5 ≤ hs/λ < 67.5 | −87.5 ≤ θ ≤ −82.5 | 46.7 ≤ hm/λ ≤ 51.4 |
| | 62.5 ≤ hs/λ < 67.5 | −87.5 ≤ θ ≤ −82.5 | 22.2 ≤ hm/λ ≤ 46.4 |
| | 62.5 ≤ hs/λ < 67.5 | −82.5 ≤ θ ≤ −77.5 | 57.7 ≤ hm/λ ≤ 62 |
| | 62.5 ≤ hs/λ < 67.5 | −82.5 ≤ θ ≤ −77.5 | 20 ≤ hm/λ ≤ 50 |
| | 62.5 ≤ hs/λ < 67.5 | −77.5 ≤ θ ≤ −72.5 | 36.5 ≤ hm/λ ≤ 49.15 |
| | 62.5 ≤ hs/λ < 67.5 | −77.5 ≤ θ ≤ −72.5 | 16.7 ≤ hm/λ ≤ 34 |
| | 62.5 ≤ hs/λ < 67.5 | −72.5 ≤ θ ≤ −67.5 | 45.75 ≤ hm/λ ≤ 48.6 |
| | 62.5 ≤ hs/λ < 67.5 | −72.5 ≤ θ ≤ −67.5 | 15.25 ≤ hm/λ ≤ 19.6 |
| | 62.5 ≤ hs/λ < 67.5 | −67.5 ≤ θ ≤ −62.5 | 14.9 ≤ hm/λ ≤ 19 |
| | 62.5 ≤ hs/λ < 67.5 | −62.5 ≤ θ ≤ −57.5 | 14.9 ≤ hm/λ ≤ 18.5 |
| | 62.5 ≤ hs/λ < 67.5 | −57.5 ≤ θ ≤ −52.5 | 15 ≤ hm/λ ≤ 18 |
| | 62.5 ≤ hs/λ < 67.5 | −52.5 ≤ θ ≤ −47.5 | 16 ≤ hm/λ ≤ 17.5 |
| | 62.5 ≤ hs/λ < 67.5 | −47.5 ≤ θ ≤ −42.5 | 16.15 ≤ hm/λ ≤ 17 |
| | 62.5 ≤ hs/λ < 67.5 | −42.5 ≤ θ ≤ −37.5 | 14.8 ≤ hm/λ ≤ 16.05 |
| | 62.5 ≤ hs/λ < 67.5 | −37.5 ≤ θ ≤ −32.5 | 14 ≤ hm/λ ≤ 15 |
| | 62.5 ≤ hs/λ < 67.5 | −32.5 ≤ θ ≤ −27.5 | 13.7 ≤ hm/λ ≤ 14.5 |
| | 67.5 ≤ hs/λ < 72.5 | −90 ≤ θ ≤ −87.5 | 51.8 ≤ hm/λ ≤ 67 |
| | 67.5 ≤ hs/λ < 72.5 | −90 ≤ θ ≤ −87.5 | 26.7 ≤ hm/λ ≤ 51.4 |
| | 67.5 ≤ hs/λ < 72.5 | −87.5 ≤ θ ≤ −82.5 | 56.9 ≤ hm/λ ≤ 87 |
| | 67.5 ≤ hs/λ < 72.5 | −87.5 ≤ θ ≤ −82.5 | 21.3 ≤ hm/λ ≤ 55.5 |
| | 67.5 ≤ hs/λ < 72.5 | −82.5 ≤ θ ≤ −77.5 | 59.8 ≤ hm/λ ≤ 67 |
| | 67.5 ≤ hs/λ < 72.5 | −82.5 ≤ θ ≤ −77.5 | 19.15 ≤ hm/λ ≤ 54.4 |
| | 67.5 ≤ hs/λ < 72.5 | −77.5 ≤ θ ≤ −72.5 | 43 ≤ hm/λ ≤ 53.6 |
| | 67.5 ≤ hs/λ < 72.5 | −77.5 ≤ θ ≤ −72.5 | 16.2 ≤ hm/λ ≤ 30.9 |
| | 67.5 ≤ hs/λ < 72.5 | −72.5 ≤ θ ≤ −67.5 | 50.7 ≤ hm/λ ≤ 53.2 |
| | 67.5 ≤ hs/λ < 72.5 | −72.5 ≤ θ ≤ −67.5 | 14.6 ≤ hm/λ ≤ 18.7 |
| | 67.5 ≤ hs/λ < 72.5 | −67.5 ≤ θ ≤ −62.5 | 14.3 ≤ hm/λ ≤ 18 |
| | 67.5 ≤ hs/λ < 72.5 | −62.5 ≤ θ ≤ −57.5 | 14.2 ≤ hm/λ ≤ 17.5 |
| | 67.5 ≤ hs/λ < 72.5 | −57.5 ≤ θ ≤ −52.5 | 14.5 ≤ hm/λ ≤ 17.4 |
| | 67.5 ≤ hs/λ < 72.5 | −52.5 ≤ θ ≤ −47.5 | 14.9 ≤ hm/λ ≤ 16.5 |
| | 67.5 ≤ hs/λ < 72.5 | −47.5 ≤ θ ≤ −42.5 | 15.1 ≤ hm/λ ≤ 16 |
| | 67.5 ≤ hs/λ < 72.5 | −42.5 ≤ θ ≤ −37.5 | 13.9 ≤ hm/λ ≤ 15 |
| | 67.5 ≤ hs/λ < 72.5 | −37.5 ≤ θ ≤ −32.5 | 13.2 ≤ hm/λ ≤ 14.5 |
| | 67.5 ≤ hs/λ < 72.5 | −32.5 ≤ θ ≤ −30 | 13 ≤ hm/λ ≤ 14.5 |
| | 72.5 ≤ hs/λ < 77.5 | −90 ≤ θ ≤ −87.5 | 26.1 ≤ hm/λ ≤ 72 |
| | 72.5 ≤ hs/λ < 77.5 | −87.5 ≤ θ ≤ −82.5 | 60.8 ≤ hm/λ ≤ 72 |
| | 72.5 ≤ hs/λ < 77.5 | −87.5 ≤ θ ≤ −82.5 | 20.7 ≤ hm/λ ≤ 59.8 |
| | 72.5 ≤ hs/λ < 77.5 | −82.5 ≤ θ ≤ −77.5 | 62.8 ≤ hm/λ ≤ 72 |
| | 72.5 ≤ hs/λ < 77.5 | −82.5 ≤ θ ≤ −77.5 | 18.5 ≤ hm/λ ≤ 58.9 |
| | 72.5 ≤ hs/λ < 77.5 | −77.5 ≤ θ ≤ −72.5 | 47.5 ≤ hm/λ ≤ 58.2 |
| | 72.5 ≤ hs/λ < 77.5 | −77.5 ≤ θ ≤ −72.5 | 15.8 ≤ hm/λ ≤ 29.8 |
| | 72.5 ≤ hs/λ < 77.5 | −72.5 ≤ θ ≤ −67.5 | 55.7 ≤ hm/λ ≤ 57.8 |
| | 72.5 ≤ hs/λ < 77.5 | −72.5 ≤ θ ≤ −67.5 | 14.1 ≤ hm/λ ≤ 17.5 |
| | 72.5 ≤ hs/λ < 77.5 | −67.5 ≤ θ ≤ −62.5 | 13.7 ≤ hm/λ ≤ 17.5 |
| | 72.5 ≤ hs/λ < 77.5 | −62.5 ≤ θ ≤ −57.5 | 13.7 ≤ hm/λ ≤ 17 |
| | 72.5 ≤ hs/λ < 77.5 | −57.5 ≤ θ ≤ −52.5 | 13.7 ≤ hm/λ ≤ 16.5 |
| | 72.5 ≤ hs/λ < 77.5 | −52.5 ≤ θ ≤ −47.5 | 14.5 ≤ hm/λ ≤ 16 |
| | 72.5 ≤ hs/λ < 77.5 | −47.5 ≤ θ ≤ −42.5 | 14.15 ≤ hm/λ ≤ 15.5 |
| | 72.5 ≤ hs/λ < 77.5 | −42.5 ≤ θ ≤ −37.5 | 13.2 ≤ hm/λ ≤ 14.5 |
| | 72.5 ≤ hs/λ < 77.5 | −37.5 ≤ θ ≤ −32.5 | 12.6 ≤ hm/λ ≤ 14 |
| | 72.5 ≤ hs/λ < 77.5 | −32.5 ≤ θ ≤ −27.5 | 12.4 ≤ hm/λ ≤ 14 |
| | 77.5 ≤ hs/λ < 82.5 | −90 ≤ θ ≤ −87.5 | 25.75 ≤ hm/λ ≤ 77 |
| | 77.5 ≤ hs/λ < 82.5 | −87.5 ≤ θ ≤ −82.5 | 64.9 ≤ hm/λ ≤ 77 |
| | 77.5 ≤ hs/λ < 82.5 | −87.5 ≤ θ ≤ −82.5 | 20.2 ≤ hm/λ ≤ 64.2 |
| | 77.5 ≤ hs/λ < 82.5 | −82.5 ≤ θ ≤ −77.5 | 66.3 ≤ hm/λ ≤ 77 |
| | 77.5 ≤ hs/λ < 82.5 | −82.5 ≤ θ ≤ −77.5 | 18 ≤ hm/λ ≤ 63.5 |
| | 77.5 ≤ hs/λ < 82.5 | −77.5 ≤ θ ≤ −72.5 | 72.6 ≤ hm/λ ≤ 77 |
| | 77.5 ≤ hs/λ < 82.5 | −77.5 ≤ θ ≤ −72.5 | 51.2 ≤ hm/λ ≤ 63.9 |
| | 77.5 ≤ hs/λ < 82.5 | −77.5 ≤ θ ≤ −72.5 | 17.5 ≤ hm/λ ≤ 29.3 |
| | 77.5 ≤ hs/λ < 82.5 | −72.5 ≤ θ ≤ −67.5 | 60.4 ≤ hm/λ ≤ 62.5 |
| | 77.5 ≤ hs/λ < 82.5 | −72.5 ≤ θ ≤ −67.5 | 13.7 ≤ hm/λ ≤ 17.3 |
| | 77.5 ≤ hs/λ < 82.5 | −67.5 ≤ θ ≤ −62.5 | 13.4 ≤ hm/λ ≤ 16.5 |
| | 77.5 ≤ hs/λ < 82.5 | −62.5 ≤ θ ≤ −57.5 | 13.3 ≤ hm/λ ≤ 16.4 |
| | 77.5 ≤ hs/λ < 82.5 | −57.5 ≤ θ ≤ −52.5 | 13.3 ≤ hm/λ ≤ 16.4 |

TABLE 6

| Metal for the first metal film | Thickness hs/λ (%) of the dielectric film | θ (°) of the Euler angles | Thickness hm/λ (%) of the first metal film |
|---|---|---|---|
| Cu | 82.5 ≤ hs/λ < 87.5 | −90 ≤ θ ≤ −87.5 | 25.6 ≤ hm/λ ≤ 82 |
| | 82.5 ≤ hs/λ < 87.5 | −87.5 ≤ θ ≤ −82.5 | 69.3 ≤ hm/λ ≤ 82 |
| | 82.5 ≤ hs/λ < 87.5 | −87.5 ≤ θ ≤ −82.5 | 19.9 ≤ hm/λ ≤ 68.8 |
| | 82.5 ≤ hs/λ < 87.5 | −82.5 ≤ θ ≤ −77.5 | 70.2 ≤ hm/λ ≤ 82 |
| | 82.5 ≤ hs/λ < 87.5 | −82.5 ≤ θ ≤ −77.5 | 17.6 ≤ hm/λ ≤ 68.1 |
| | 82.5 ≤ hs/λ < 87.5 | −77.5 ≤ θ ≤ −72.5 | 74.3 ≤ hm/λ ≤ 82 |
| | 82.5 ≤ hs/λ < 87.5 | −77.5 ≤ θ ≤ −72.5 | 54.2 ≤ hm/λ ≤ 67.6 |
| | 82.5 ≤ hs/λ < 87.5 | −77.5 ≤ θ ≤ −72.5 | 17 ≤ hm/λ ≤ 29 |
| | 82.5 ≤ hs/λ < 87.5 | −72.5 ≤ θ ≤ −67.5 | 63.3 ≤ hm/λ ≤ 67 |
| | 82.5 ≤ hs/λ < 87.5 | −72.5 ≤ θ ≤ −67.5 | 13.2 ≤ hm/λ ≤ 18.3 |
| | 82.5 ≤ hs/λ < 87.5 | −67.5 ≤ θ ≤ −62.5 | 13 ≤ hm/λ ≤ 16.5 |
| | 82.5 ≤ hs/λ < 87.5 | −62.5 ≤ θ ≤ −57.5 | 12.9 ≤ hm/λ ≤ 15.9 |
| | 82.5 ≤ hs/λ < 87.5 | −57.5 ≤ θ ≤ −52.5 | 13 ≤ hm/λ ≤ 15.5 |
| | 82.5 ≤ hs/λ < 87.5 | −52.5 ≤ θ ≤ −47.5 | 13.4 ≤ hm/λ ≤ 15 |
| | 82.5 ≤ hs/λ < 87.5 | −47.5 ≤ θ ≤ −42.5 | 13 ≤ hm/λ ≤ 14.3 |
| | 82.5 ≤ hs/λ < 87.5 | −42.5 ≤ θ ≤ −37.5 | 12.2 ≤ hm/λ ≤ 13.6 |
| | 82.5 ≤ hs/λ < 87.5 | −37.5 ≤ θ ≤ −32.5 | 11.6 ≤ hm/λ ≤ 13 |
| | 82.5 ≤ hs/λ < 87.5 | −32.5 ≤ θ ≤ −30 | 11.6 ≤ hm/λ ≤ 13 |
| | 87.5 ≤ hs/λ < 92.5 | −90 ≤ θ ≤ −87.5 | 25.5 ≤ hm/λ ≤ 87 |
| | 87.5 ≤ hs/λ < 92.5 | −87.5 ≤ θ ≤ −82.5 | 73.6 ≤ hm/λ ≤ 87 |
| | 87.5 ≤ hs/λ < 92.5 | −87.5 ≤ θ ≤ −82.5 | 19.6 ≤ hm/λ ≤ 73.3 |
| | 87.5 ≤ hs/λ < 92.5 | −82.5 ≤ θ ≤ −77.5 | 74.3 ≤ hm/λ ≤ 87 |
| | 87.5 ≤ hs/λ < 92.5 | −82.5 ≤ θ ≤ −77.5 | 17.2 ≤ hm/λ ≤ 72.8 |
| | 87.5 ≤ hs/λ < 92.5 | −77.5 ≤ θ ≤ −72.5 | 77.2 ≤ hm/λ ≤ 87 |
| | 87.5 ≤ hs/λ < 92.5 | −77.5 ≤ θ ≤ −72.5 | 56.8 ≤ hm/λ ≤ 72.3 |
| | 87.5 ≤ hs/λ < 92.5 | −77.5 ≤ θ ≤ −72.5 | 16.4 ≤ hm/λ ≤ 28.7 |
| | 87.5 ≤ hs/λ < 92.5 | −72.5 ≤ θ ≤ −67.5 | 82.2 ≤ hm/λ ≤ 87 |
| | 87.5 ≤ hs/λ < 92.5 | −72.5 ≤ θ ≤ −67.5 | 68 ≤ hm/λ ≤ 72 |
| | 87.5 ≤ hs/λ < 92.5 | −72.5 ≤ θ ≤ −67.5 | 12.9 ≤ hm/λ ≤ 18.4 |
| | 87.5 ≤ hs/λ < 92.5 | −67.5 ≤ θ ≤ −62.5 | 12.65 ≤ hm/λ ≤ 16 |
| | 87.5 ≤ hs/λ < 92.5 | −62.5 ≤ θ ≤ −57.5 | 12.6 ≤ hm/λ ≤ 15.5 |
| | 87.5 ≤ hs/λ < 92.5 | −57.5 ≤ θ ≤ −52.5 | 12.7 ≤ hm/λ ≤ 15 |
| | 87.5 ≤ hs/λ < 92.5 | −52.5 ≤ θ ≤ −47.5 | 12.9 ≤ hm/λ ≤ 14.5 |
| | 87.5 ≤ hs/λ < 92.5 | −47.5 ≤ θ ≤ −42.5 | 12.5 ≤ hm/λ ≤ 13.8 |
| | 87.5 ≤ hs/λ < 92.5 | −42.5 ≤ θ ≤ −37.5 | 11.8 ≤ hm/λ ≤ 13 |
| | 87.5 ≤ hs/λ < 92.5 | −37.5 ≤ θ ≤ −32.5 | 11.2 ≤ hm/λ ≤ 13 |
| | 87.5 ≤ hs/λ < 92.5 | −32.5 ≤ θ ≤ −27.5 | 11.3 ≤ hm/λ ≤ 13 |
| | 92.5 ≤ hs/λ ≤ 97.5 | −90 ≤ θ ≤ −87.5 | 25.5 ≤ hm/λ ≤ 92 |
| | 92.5 ≤ hs/λ ≤ 97.5 | −87.5 ≤ θ ≤ −82.5 | 19.3 ≤ hm/λ ≤ 92 |
| | 92.5 ≤ hs/λ ≤ 97.5 | −82.5 ≤ θ ≤ −77.5 | 78.8 ≤ hm/λ ≤ 92 |
| | 92.5 ≤ hs/λ ≤ 97.5 | −82.5 ≤ θ ≤ −77.5 | 17 ≤ hm/λ ≤ 77.6 |
| | 92.5 ≤ hs/λ ≤ 97.5 | −77.5 ≤ θ ≤ −72.5 | 80.6 ≤ hm/λ ≤ 92 |
| | 92.5 ≤ hs/λ ≤ 97.5 | −77.5 ≤ θ ≤ −72.5 | 59 ≤ hm/λ ≤ 77 |
| | 92.5 ≤ hs/λ ≤ 97.5 | −77.5 ≤ θ ≤ −72.5 | 16 ≤ hm/λ ≤ 28.5 |
| | 92.5 ≤ hs/λ ≤ 97.5 | −72.5 ≤ θ ≤ −67.5 | 86.5 ≤ hm/λ ≤ 92 |
| | 92.5 ≤ hs/λ ≤ 97.5 | −72.5 ≤ θ ≤ −67.5 | 72 ≤ hm/λ ≤ 76.5 |
| | 92.5 ≤ hs/λ ≤ 97.5 | −72.5 ≤ θ ≤ −67.5 | 12.6 ≤ hm/λ ≤ 18.4 |
| | 92.5 ≤ hs/λ ≤ 97.5 | −67.5 ≤ θ ≤ −62.5 | 12.4 ≤ hm/λ ≤ 15.5 |
| | 92.5 ≤ hs/λ ≤ 97.5 | −62.5 ≤ θ ≤ −57.5 | 12.4 ≤ hm/λ ≤ 15.2 |
| | 92.5 ≤ hs/λ ≤ 97.5 | −57.5 ≤ θ ≤ −52.5 | 12.5 ≤ hm/λ ≤ 14.7 |
| | 92.5 ≤ hs/λ ≤ 97.5 | −52.5 ≤ θ ≤ −47.5 | 12.9 ≤ hm/λ ≤ 14.2 |
| | 92.5 ≤ hs/λ ≤ 97.5 | −47.5 ≤ θ ≤ −42.5 | 12.2 ≤ hm/λ ≤ 13.5 |
| | 92.5 ≤ hs/λ ≤ 97.5 | −42.5 ≤ θ ≤ −37.5 | 11.5 ≤ hm/λ ≤ 13.1 |
| | 92.5 ≤ hs/λ ≤ 97.5 | −37.5 ≤ θ ≤ −32.5 | 11.5 ≤ hm/λ ≤ 12.5 |
| | 92.5 ≤ hs/λ ≤ 97.5 | −32.5 ≤ θ ≤ −27.5 | 11.5 ≤ hm/λ ≤ 13 |

TABLE 7

| Metal for the first metal film | Thickness hs/λ (%) of the dielectric film | θ (°) of the Euler angles | Thickness hm/λ (%) of the first metal film |
|---|---|---|---|
| Mo | 32.5 ≤ hs/λ < 37.5 | −85 ≤ θ ≤ −82.5 | 31.4 ≤ Tm ≤ 32 |
| | 32.5 ≤ hs/λ < 37.5 | −82.5 ≤ θ ≤ −77.5 | 24.75 ≤ Tm ≤ 32 |
| | 32.5 ≤ hs/λ < 37.5 | −77.5 ≤ θ ≤ −72.5 | 23.6 ≤ Tm ≤ 30.5 |
| | 32.5 ≤ hs/λ < 37.5 | −72.5 ≤ θ ≤ −67.5 | 23.6 ≤ Tm ≤ 30.6 |
| | 32.5 ≤ hs/λ < 37.5 | −67.5 ≤ θ ≤ −62.5 | 24.5 ≤ Tm ≤ 30.5 |
| | 32.5 ≤ hs/λ < 37.5 | −62.5 ≤ θ ≤ −57.5 | 25.5 ≤ Tm ≤ 30.5 |
| | 32.5 ≤ hs/λ < 37.5 | −57.5 ≤ θ ≤ −52.5 | 28.75 ≤ Tm ≤ 29.75 |
| | 32.5 ≤ hs/λ < 37.5 | −52.5 ≤ θ ≤ −50 | 29.7 ≤ Tm ≤ 29.75 |
| | 37.5 ≤ hs/λ < 42.5 | −85 ≤ θ ≤ −82.5 | 34.25 ≤ Tm ≤ 37 |
| | 37.5 ≤ hs/λ < 42.5 | −82.5 ≤ θ ≤ −77.5 | 25.4 ≤ Tm ≤ 37 |
| | 37.5 ≤ hs/λ < 42.5 | −77.5 ≤ θ ≤ −72.5 | 23.1 ≤ Tm ≤ 34 |
| | 37.5 ≤ hs/λ < 42.5 | −72.5 ≤ θ ≤ −67.5 | 22.9 ≤ Tm ≤ 34 |
| | 37.5 ≤ hs/λ < 42.5 | −67.5 ≤ θ ≤ −62.5 | 23.7 ≤ Tm ≤ 34 |

TABLE 7-continued

| Metal for the first metal film | Thickness hs/λ (%) of the dielectric film | θ (°) of the Euler angles | Thickness hm/λ (%) of the first metal film |
|---|---|---|---|
| | 37.5 ≤ hs/λ < 42.5 | −62.5 ≤ θ ≤ −57.5 | 25.4 ≤ Tm ≤ 34 |
| | 37.5 ≤ hs/λ < 42.5 | −57.5 ≤ θ ≤ −52.5 | 31.5 ≤ Tm ≤ 33.5 |
| | 37.5 ≤ hs/λ < 42.5 | −52.5 ≤ θ ≤ −50 | 33.5 ≤ Tm ≤ 34 |
| | 42.5 ≤ hs/λ < 47.5 | −90 ≤ θ ≤ −87.5 | 40.5 ≤ Tm ≤ 42 |
| | 42.5 ≤ hs/λ < 47.5 | −87.5 ≤ θ ≤ −82.5 | 36.7 ≤ Tm ≤ 42 |
| | 42.5 ≤ hs/λ < 47.5 | −82.5 ≤ θ ≤ −77.5 | 25.4 ≤ Tm ≤ 42 |
| | 42.5 ≤ hs/λ < 47.5 | −77.5 ≤ θ ≤ −72.5 | 21.1 ≤ Tm ≤ 37 |
| | 42.5 ≤ hs/λ < 47.5 | −72.5 ≤ θ ≤ −67.5 | 20.4 ≤ Tm ≤ 37.5 |
| | 42.5 ≤ hs/λ < 47.5 | −67.5 ≤ θ ≤ −62.5 | 20.6 ≤ Tm ≤ 37.5 |
| | 42.5 ≤ hs/λ < 47.5 | −62.5 ≤ θ ≤ −57.5 | 21.5 ≤ Tm ≤ 37 |
| | 42.5 ≤ hs/λ < 47.5 | −57.5 ≤ θ ≤ −52.5 | 27 ≤ Tm ≤ 36.5 |
| | 42.5 ≤ hs/λ < 47.5 | −52.5 ≤ θ ≤ −50 | 37 ≤ Tm ≤ 37.5 |
| | 47.5 ≤ hs/λ < 52.5 | −90 ≤ θ ≤ −87.5 | 43.2 ≤ Tm ≤ 47 |
| | 47.5 ≤ hs/λ < 52.5 | −87.5 ≤ θ ≤ −82.5 | 36.5 ≤ Tm ≤ 47 |
| | 47.5 ≤ hs/λ < 52.5 | −82.5 ≤ θ ≤ −77.5 | 35 ≤ Tm ≤ 47 |
| | 47.5 ≤ hs/λ < 52.5 | −82.5 ≤ θ ≤ −77.5 | 25.8 ≤ Tm ≤ 34 |
| | 47.5 ≤ hs/λ < 52.5 | −77.5 ≤ θ ≤ −72.5 | 19.4 ≤ Tm ≤ 38 |
| | 47.5 ≤ hs/λ < 52.5 | −72.5 ≤ θ ≤ −67.5 | 18.3 ≤ Tm ≤ 39 |
| | 47.5 ≤ hs/λ < 52.5 | −67.5 ≤ θ ≤ −62.5 | 18.3 ≤ Tm ≤ 39.5 |
| | 47.5 ≤ hs/λ < 52.5 | −62.5 ≤ θ ≤ −57.5 | 18.6 ≤ Tm ≤ 39 |
| | 47.5 ≤ hs/λ < 52.5 | −57.5 ≤ θ ≤ −52.5 | 20 ≤ Tm ≤ 37 |
| | 47.5 ≤ hs/λ < 52.5 | −52.5 ≤ θ ≤ −50 | 35.5 ≤ Tm ≤ 40.5 |
| | 47.5 ≤ hs/λ < 52.5 | −52.5 ≤ θ ≤ −50 | 24.5 ≤ Tm ≤ 29 |
| | 52.5 ≤ hs/λ < 57.5 | −90 ≤ θ ≤ −87.5 | 44.3 ≤ Tm ≤ 52 |
| | 52.5 ≤ hs/λ < 57.5 | −87.5 ≤ θ ≤ −82.5 | 29.8 ≤ Tm ≤ 52 |
| | 52.5 ≤ hs/λ < 57.5 | −82.5 ≤ θ ≤ −77.5 | 26 ≤ Tm ≤ 52 |
| | 52.5 ≤ hs/λ < 57.5 | −77.5 ≤ θ ≤ −72.5 | 27.2 ≤ Tm ≤ 31.2 |
| | 52.5 ≤ hs/λ < 57.5 | −77.5 ≤ θ ≤ −72.5 | 18.1 ≤ Tm ≤ 26 |
| | 52.5 ≤ hs/λ < 57.5 | −72.5 ≤ θ ≤ −67.5 | 16.9 ≤ Tm ≤ 26.3 |
| | 52.5 ≤ hs/λ < 57.5 | −67.5 ≤ θ ≤ −62.5 | 16.7 ≤ Tm ≤ 25.2 |
| | 52.5 ≤ hs/λ < 57.5 | −62.5 ≤ θ ≤ −57.5 | 16.8 ≤ Tm ≤ 24.7 |
| | 52.5 ≤ hs/λ < 57.5 | −57.5 ≤ θ ≤ −52.5 | 17.5 ≤ Tm ≤ 24 |
| | 52.5 ≤ hs/λ < 57.5 | −52.5 ≤ θ ≤ −47.5 | 19.5 ≤ Tm ≤ 22.5 |
| | 52.5 ≤ hs/λ < 57.5 | −42.5 ≤ θ ≤ −37.5 | 21 ≤ Tm ≤ 21.5 |
| | 52.5 ≤ hs/λ < 57.5 | −42.5 ≤ θ ≤ −37.5 | 18 ≤ Tm ≤ 19 |
| | 52.5 ≤ hs/λ < 57.5 | −37.5 ≤ θ ≤ −32.5 | 19.5 ≤ Tm ≤ 21 |
| | 52.5 ≤ hs/λ < 57.5 | −37.5 ≤ θ ≤ −32.5 | 16.6 ≤ Tm ≤ 17 |
| | 52.5 ≤ hs/λ < 57.5 | −32.5 ≤ θ ≤ −30 | 18 ≤ Tm ≤ 19 |
| | 52.5 ≤ hs/λ < 57.5 | −32.5 ≤ θ ≤ −30 | 15.2 ≤ Tm ≤ 15.5 |
| | 57.5 ≤ hs/λ < 62.5 | −90 ≤ θ ≤ −87.5 | 37.8 ≤ Tm ≤ 57 |
| | 57.5 ≤ hs/λ < 62.5 | −87.5 ≤ θ ≤ −82.5 | 26.7 ≤ Tm ≤ 57 |
| | 57.5 ≤ hs/λ < 62.5 | −82.5 ≤ θ ≤ −77.5 | 23.1 ≤ Tm ≤ 57 |
| | 57.5 ≤ hs/λ < 62.5 | −77.5 ≤ θ ≤ −72.5 | 17.2 ≤ Tm ≤ 33.2 |
| | 57.5 ≤ hs/λ < 62.5 | −72.5 ≤ θ ≤ −67.5 | 15.9 ≤ Tm ≤ 23 |
| | 57.5 ≤ hs/λ < 62.5 | −67.5 ≤ θ ≤ −62.5 | 15.5 ≤ Tm ≤ 22 |
| | 57.5 ≤ hs/λ < 62.5 | −62.5 ≤ θ ≤ −57.5 | 15.5 ≤ Tm ≤ 21.3 |
| | 57.5 ≤ hs/λ < 62.5 | −57.5 ≤ θ ≤ −52.5 | 16 ≤ Tm ≤ 21 |
| | 57.5 ≤ hs/λ < 62.5 | −52.5 ≤ θ ≤ −47.5 | 17.5 ≤ Tm ≤ 20 |
| | 57.5 ≤ hs/λ < 62.5 | −47.5 ≤ θ ≤ −42.5 | 18.5 ≤ Tm ≤ 18.5 |
| | 57.5 ≤ hs/λ < 62.5 | −42.5 ≤ θ ≤ −37.5 | 18.5 ≤ Tm ≤ 18.5 |
| | 57.5 ≤ hs/λ < 62.5 | −42.5 ≤ θ ≤ −37.5 | 16 ≤ Tm ≤ 17.5 |
| | 57.5 ≤ hs/λ < 62.5 | −37.5 ≤ θ ≤ −32.5 | 17.5 ≤ Tm ≤ 18.5 |
| | 57.5 ≤ hs/λ < 62.5 | −37.5 ≤ θ ≤ −32.5 | 14.9 ≤ Tm ≤ 16 |
| | 57.5 ≤ hs/λ < 62.5 | −32.5 ≤ θ ≤ −30 | 16.5 ≤ Tm ≤ 17.5 |
| | 57.5 ≤ hs/λ < 62.5 | −32.5 ≤ θ ≤ −30 | 14 ≤ Tm ≤ 14.5 |

TABLE 8

| Metal for the first metal film | Thickness hs/λ (%) of the dielectric film | θ (°) of the Euler angles | Thickness hm/λ (%) of the first metal film |
|---|---|---|---|
| Mo | 62.5 ≤ hs/λ < 67.5 | −90 ≤ θ ≤ −87.5 | 34.2 ≤ hm/λ ≤ 62 |
| | 62.5 ≤ hs/λ < 67.5 | −87.5 ≤ θ ≤ −82.5 | 25 ≤ hm/λ ≤ 62 |
| | 62.5 ≤ hs/λ < 67.5 | −82.5 ≤ θ ≤ −77.5 | 21.7 ≤ hm/λ ≤ 62 |
| | 62.5 ≤ hs/λ < 67.5 | −77.5 ≤ θ ≤ −72.5 | 16.5 ≤ hm/λ ≤ 32.1 |
| | 62.5 ≤ hs/λ < 67.5 | −72.5 ≤ θ ≤ −67.5 | 15 ≤ hm/λ ≤ 21 |
| | 62.5 ≤ hs/λ < 67.5 | −67.5 ≤ θ ≤ −62.5 | 14.7 ≤ hm/λ ≤ 20.3 |
| | 62.5 ≤ hs/λ < 67.5 | −62.5 ≤ θ ≤ −57.5 | 14.6 ≤ hm/λ ≤ 19.5 |
| | 62.5 ≤ hs/λ < 67.5 | −57.5 ≤ θ ≤ −52.5 | 14.7 ≤ hm/λ ≤ 19 |
| | 62.5 ≤ hs/λ < 67.5 | −52.5 ≤ θ ≤ −47.5 | 16 ≤ hm/λ ≤ 18.5 |
| | 62.5 ≤ hs/λ < 67.5 | −47.5 ≤ θ ≤ −42.5 | 16.2 ≤ hm/λ ≤ 17.5 |
| | 62.5 ≤ hs/λ < 67.5 | −42.5 ≤ θ ≤ −37.5 | 14.6 ≤ hm/λ ≤ 17 |
| | 62.5 ≤ hs/λ < 67.5 | −37.5 ≤ θ ≤ −32.5 | 16 ≤ hm/λ ≤ 17 |
| | 62.5 ≤ hs/λ < 67.5 | −37.5 ≤ θ ≤ −32.5 | 14 ≤ hm/λ ≤ 15 |

TABLE 8-continued

| Metal for the first metal film | Thickness hs/λ (%) of the dielectric film | θ (°) of the Euler angles | Thickness hm/λ (%) of the first metal film |
|---|---|---|---|
| | 62.5 ≤ hs/λ < 67.5 | −32.5 ≤ θ ≤ −30 | 15 ≤ hm/λ ≤ 16 |
| | 67.5 ≤ hs/λ < 72.5 | −90 ≤ θ ≤ −87.5 | 32.4 ≤ hm/λ ≤ 67 |
| | 67.5 ≤ hs/λ < 72.5 | −87.5 ≤ θ ≤ −82.5 | 23.8 ≤ hm/λ ≤ 67 |
| | 67.5 ≤ hs/λ < 72.5 | −82.5 ≤ θ ≤ −77.5 | 20.6 ≤ hm/λ ≤ 67 |
| | 67.5 ≤ hs/λ < 72.5 | −77.5 ≤ θ ≤ −72.5 | 15.9 ≤ hm/λ ≤ 31.3 |
| | 67.5 ≤ hs/λ < 72.5 | −72.5 ≤ θ ≤ −67.5 | 14.4 ≤ hm/λ ≤ 19.5 |
| | 67.5 ≤ hs/λ < 72.5 | −67.5 ≤ θ ≤ −62.5 | 14 ≤ hm/λ ≤ 19 |
| | 67.5 ≤ hs/λ < 72.5 | −62.5 ≤ θ ≤ −57.5 | 14 ≤ hm/λ ≤ 18.3 |
| | 67.5 ≤ hs/λ < 72.5 | −57.5 ≤ θ ≤ −52.5 | 14 ≤ hm/λ ≤ 17.8 |
| | 67.5 ≤ hs/λ < 72.5 | −52.5 ≤ θ ≤ −47.5 | 15 ≤ hm/λ ≤ 17.3 |
| | 67.5 ≤ hs/λ < 72.5 | −47.5 ≤ θ ≤ −42.5 | 15 ≤ hm/λ ≤ 16.4 |
| | 67.5 ≤ hs/λ < 72.5 | −42.5 ≤ θ ≤ −37.5 | 14 ≤ hm/λ ≤ 15 |
| | 67.5 ≤ hs/λ < 72.5 | −37.5 ≤ θ ≤ −32.5 | 14 ≤ hm/λ ≤ 15.5 |
| | 67.5 ≤ hs/λ < 72.5 | −32.5 ≤ θ ≤ −30 | 14.5 ≤ hm/λ ≤ 14.6 |
| | 72.5 ≤ hs/λ < 77.5 | −90 ≤ θ ≤ −87.5 | 32.4 ≤ hm/λ ≤ 72 |
| | 72.5 ≤ hs/λ < 77.5 | −87.5 ≤ θ ≤ −82.5 | 21.6 ≤ hm/λ ≤ 72 |
| | 72.5 ≤ hs/λ < 77.5 | −82.5 ≤ θ ≤ −77.5 | 18.25 ≤ hm/λ ≤ 72 |
| | 72.5 ≤ hs/λ < 77.5 | −77.5 ≤ θ ≤ −72.5 | 63.8 ≤ hm/λ ≤ 71 |
| | 72.5 ≤ hs/λ < 77.5 | −77.5 ≤ θ ≤ −72.5 | 17.5 ≤ hm/λ ≤ 31.7 |
| | 72.5 ≤ hs/λ < 77.5 | −77.5 ≤ θ ≤ −72.5 | 14.8 ≤ hm/λ ≤ 16.2 |
| | 72.5 ≤ hs/λ < 77.5 | −72.5 ≤ θ ≤ −67.5 | 14 ≤ hm/λ ≤ 16.5 |
| | 72.5 ≤ hs/λ < 77.5 | −67.5 ≤ θ ≤ −62.5 | 14 ≤ hm/λ ≤ 16.5 |
| | 72.5 ≤ hs/λ < 77.5 | −62.5 ≤ θ ≤ −57.5 | 14 ≤ hm/λ ≤ 15.7 |
| | 72.5 ≤ hs/λ < 77.5 | −57.5 ≤ θ ≤ −52.5 | 14 ≤ hm/λ ≤ 15.1 |
| | 72.5 ≤ hs/λ < 77.5 | −52.5 ≤ θ ≤ −50 | 14 ≤ hm/λ ≤ 14.4 |
| | 77.5 ≤ hs/λ < 82.5 | −90 ≤ θ ≤ −87.5 | 30.2 ≤ hm/λ ≤ 77 |
| | 77.5 ≤ hs/λ < 82.5 | −87.5 ≤ θ ≤ −82.5 | 22.4 ≤ hm/λ ≤ 77 |
| | 77.5 ≤ hs/λ < 82.5 | −82.5 ≤ θ ≤ −77.5 | 19.7 ≤ hm/λ ≤ 77 |
| | 77.5 ≤ hs/λ < 82.5 | −77.5 ≤ θ ≤ −72.5 | 65.7 ≤ hm/λ ≤ 77 |
| | 77.5 ≤ hs/λ < 82.5 | −77.5 ≤ θ ≤ −72.5 | 18.5 ≤ hm/λ ≤ 30.3 |
| | 77.5 ≤ hs/λ < 82.5 | −77.5 ≤ θ ≤ −72.5 | 15.2 ≤ hm/λ ≤ 17.5 |
| | 77.5 ≤ hs/λ < 82.5 | −72.5 ≤ θ ≤ −67.5 | 14 ≤ hm/λ ≤ 17.9 |
| | 77.5 ≤ hs/λ < 82.5 | −67.5 ≤ θ ≤ −62.5 | 14 ≤ hm/λ ≤ 17.5 |
| | 77.5 ≤ hs/λ < 82.5 | −62.5 ≤ θ ≤ −57.5 | 14 ≤ hm/λ ≤ 16.7 |
| | 77.5 ≤ hs/λ < 82.5 | −57.5 ≤ θ ≤ −52.5 | 14 ≤ hm/λ ≤ 16.1 |
| | 77.5 ≤ hs/λ < 82.5 | −52.5 ≤ θ ≤ −47.5 | 14 ≤ hm/λ ≤ 15.5 |
| | 77.5 ≤ hs/λ < 82.5 | −47.5 ≤ θ ≤ −45 | 14 ≤ hm/λ ≤ 14.7 |

TABLE 9

| Metal for the first metal film | Thickness hs/λ (%) of the dielectric film | θ (°) of the Euler angles | Thickness hm/λ (%) of the first metal film |
|---|---|---|---|
| Mo | 82.5 ≤ hs/λ < 87.5 | −90 ≤ θ ≤ −87.5 | 30.3 ≤ hm/λ ≤ 82 |
| | 82.5 ≤ hs/λ < 87.5 | −87.5 ≤ θ ≤ −82.5 | 22 ≤ hm/λ ≤ 82 |
| | 82.5 ≤ hs/λ < 87.5 | −82.5 ≤ θ ≤ −77.5 | 18.7 ≤ hm/λ ≤ 82 |
| | 82.5 ≤ hs/λ < 87.5 | −77.5 ≤ θ ≤ −72.5 | 69 ≤ hm/λ ≤ 82 |
| | 82.5 ≤ hs/λ < 87.5 | −77.5 ≤ θ ≤ −72.5 | 18 ≤ hm/λ ≤ 30.1 |
| | 82.5 ≤ hs/λ < 87.5 | −77.5 ≤ θ ≤ −72.5 | 15 ≤ hm/λ ≤ 17 |
| | 82.5 ≤ hs/λ < 87.5 | −72.5 ≤ θ ≤ −67.5 | 14 ≤ hm/λ ≤ 16.9 |
| | 82.5 ≤ hs/λ < 87.5 | −67.5 ≤ θ ≤ −62.5 | 14 ≤ hm/λ ≤ 16.9 |
| | 82.5 ≤ hs/λ < 87.5 | −62.5 ≤ θ ≤ −57.5 | 14 ≤ hm/λ ≤ 16.2 |
| | 82.5 ≤ hs/λ < 87.5 | −57.5 ≤ θ ≤ −52.5 | 14 ≤ hm/λ ≤ 15.5 |
| | 82.5 ≤ hs/λ < 87.5 | −52.5 ≤ θ ≤ −47.5 | 14 ≤ hm/λ ≤ 14.9 |
| | 82.5 ≤ hs/λ < 87.5 | −47.5 ≤ θ ≤ −45 | 14 ≤ hm/λ ≤ 14.1 |
| | 87.5 ≤ hs/λ < 92.5 | −90 ≤ θ ≤ −87.5 | 30.2 ≤ hm/λ ≤ 87 |
| | 87.5 ≤ hs/λ < 92.5 | −87.5 ≤ θ ≤ −82.5 | 21.7 ≤ hm/λ ≤ 87 |
| | 87.5 ≤ hs/λ < 92.5 | −82.5 ≤ θ ≤ −77.5 | 18.3 ≤ hm/λ ≤ 87 |
| | 87.5 ≤ hs/λ < 92.5 | −77.5 ≤ θ ≤ −72.5 | 72.2 ≤ hm/λ ≤ 87 |
| | 87.5 ≤ hs/λ < 92.5 | −77.5 ≤ θ ≤ −72.5 | 17.5 ≤ hm/λ ≤ 29.8 |
| | 87.5 ≤ hs/λ < 92.5 | −77.5 ≤ θ ≤ −72.5 | 15.8 ≤ hm/λ ≤ 16.2 |
| | 87.5 ≤ hs/λ < 92.5 | −72.5 ≤ θ ≤ −67.5 | 14 ≤ hm/λ ≤ 16.5 |
| | 87.5 ≤ hs/λ < 92.5 | −67.5 ≤ θ ≤ −62.5 | 14 ≤ hm/λ ≤ 16.4 |
| | 87.5 ≤ hs/λ < 92.5 | −62.5 ≤ θ ≤ −57.5 | 14 ≤ hm/λ ≤ 15.7 |
| | 87.5 ≤ hs/λ < 92.5 | −57.5 ≤ θ ≤ −52.5 | 14 ≤ hm/λ ≤ 15 |
| | 87.5 ≤ hs/λ < 92.5 | −52.5 ≤ θ ≤ −50 | 14 ≤ hm/λ ≤ 14.4 |
| | 92.5 ≤ hs/λ ≤ 97.5 | −90 ≤ θ ≤ −87.5 | 30 ≤ hm/λ ≤ 92 |
| | 92.5 ≤ hs/λ ≤ 97.5 | −87.5 ≤ θ ≤ −82.5 | 21.4 ≤ hm/λ ≤ 92 |
| | 92.5 ≤ hs/λ ≤ 97.5 | −82.5 ≤ θ ≤ −77.5 | 18 ≤ hm/λ ≤ 92 |
| | 92.5 ≤ hs/λ ≤ 97.5 | −77.5 ≤ θ ≤ −72.5 | 75.4 ≤ hm/λ ≤ 92 |
| | 92.5 ≤ hs/λ ≤ 97.5 | −77.5 ≤ θ ≤ −72.5 | 17 ≤ hm/λ ≤ 29.5 |
| | 92.5 ≤ hs/λ ≤ 97.5 | −77.5 ≤ θ ≤ −72.5 | 14 ≤ hm/λ ≤ 16.7 |
| | 92.5 ≤ hs/λ ≤ 97.5 | −72.5 ≤ θ ≤ −67.5 | 14 ≤ hm/λ ≤ 16 |

TABLE 9-continued

| Metal for the first metal film | Thickness hs/λ (%) of the dielectric film | θ (°) of the Euler angles | Thickness hm/λ (%) of the first metal film |
|---|---|---|---|
| | 92.5 ≤ hs/λ ≤ 97.5 | −67.5 ≤ θ ≤ −62.5 | 14 ≤ hm/λ ≤ 15.4 |
| | 92.5 ≤ hs/λ ≤ 97.5 | −62.5 ≤ θ ≤ −57.5 | 14 ≤ hm/λ ≤ 14.6 |
| | 92.5 ≤ hs/λ ≤ 97.5 | −57.5 ≤ θ ≤ −55 | 14 ≤ hm/λ ≤ 14.1. |

2. The elastic wave device according to claim 1, wherein the IDT electrodes includes a second metal film having a higher electrical conductivity than the first metal film; and when a piezoelectric substrate side of the IDT electrodes is defined as a lower side and an opposite side is defined as a higher side, the first metal film is higher than the second metal film.

3. The elastic wave device according to claim 2, wherein the second metal film is made of Al.

4. The elastic wave device according to claim 1, further comprising a second dielectric film on the first dielectric film.

5. The elastic wave device according to claim 4, wherein the second dielectric film is made of SiN.

6. The elastic wave device according to claim 1, wherein the IDT electrodes include an adhesion layer between the first metal film and the piezoelectric substrate.

7. The elastic wave device according to claim 6, wherein the adhesion layer is made of NiCr.

8. The elastic wave device according to claim 1, further comprising an intermediate film made of a dielectric material between the piezoelectric substrate and the IDT electrodes.

9. The elastic wave device according to claim 1, wherein the elastic wave device uses shear horizontal waves.

10. The elastic wave device according to claim 1, wherein the first dielectric film is made of $SiO_2$.

* * * * *